(12) United States Patent
Yoshimizu

(10) Patent No.: US 11,723,216 B2
(45) Date of Patent: Aug. 8, 2023

(54) MAGNETIC MEMORY DEVICE

(71) Applicant: Kioxia Corporation, Minato-ku (JP)

(72) Inventor: Yasuhito Yoshimizu, Yokkaichi (JP)

(73) Assignee: Kioxia Corporation, Minato-ku (JP)

( * ) Notice: Subject to any disclaimer, the term of this patent is extended or adjusted under 35 U.S.C. 154(b) by 393 days.

(21) Appl. No.: 17/005,438

(22) Filed: Aug. 28, 2020

(65) Prior Publication Data
US 2021/0083001 A1 Mar. 18, 2021

(30) Foreign Application Priority Data
Sep. 18, 2019 (JP) .............................. 2019-169536

(51) Int. Cl.
*H10B 61/00* (2023.01)
*G11C 11/16* (2006.01)
*H01L 25/18* (2023.01)
*H10N 50/10* (2023.01)

(52) U.S. Cl.
CPC ............ *H10B 61/10* (2023.02); *G11C 11/161* (2013.01); *G11C 11/1659* (2013.01); *G11C 11/1675* (2013.01); *H01L 25/18* (2013.01); *H10N 50/10* (2023.02)

(58) Field of Classification Search
CPC ....... H01L 27/224; H01L 25/18; H01L 43/08; G11C 11/161; G11C 11/1659; G11C 11/1675; H10B 61/10; H10N 50/10
USPC .......................................................... 257/421
See application file for complete search history.

(56) References Cited

U.S. PATENT DOCUMENTS

| 7,031,178 | B2 | 4/2006 | Parkin |
| 7,539,051 | B2 | 5/2009 | Deligianni et al. |
| 7,626,844 | B1 | 12/2009 | Moriya et al. |
| 7,751,223 | B2 | 7/2010 | Kim et al. |
| 7,755,921 | B2 | 7/2010 | Assefa et al. |
| 7,885,104 | B2 | 2/2011 | Bae et al. |
| 7,929,342 | B2 | 4/2011 | Numata et al. |

(Continued)

FOREIGN PATENT DOCUMENTS

| JP | 2007-109821 A | 4/2007 |
| JP | 2007-324172 A | 12/2007 |

(Continued)

OTHER PUBLICATIONS

Huang et al., "Metal-Assisted Chemical Etching of Silicon: A Review", Advanced Materials, vol. 23, Issue. 2, 2011, pp. 285-308.

*Primary Examiner* — Jami Valentine Miller
(74) *Attorney, Agent, or Firm* — Oblon, McClelland, Maier & Neustadt, L.L.P.

(57) ABSTRACT

According to one embodiment, a magnetic memory device includes: a plurality of first films and a plurality of second films stacked alternately; a first insulating layer passing through the plurality of first and second films; a second insulating layer passing through the plurality of first and second films and in contact with a surface of the first insulating layer; a first magnet including a first pillar portion provided between the second insulating layer and the plurality of first and second films, and a first terrace portion coupled to one end of the first pillar portion; a first interconnect layer coupled to the other end of the first pillar portion of the first magnet; and a first magnetoresistance effect element coupled to the first terrace portion of the first magnet.

18 Claims, 53 Drawing Sheets

(56) References Cited

U.S. PATENT DOCUMENTS

| | | |
|---|---|---|
| 8,313,847 B2 | 11/2012 | Cho et al. |
| 8,649,214 B2 | 2/2014 | Apalkov et al. |
| 8,830,742 B2 | 9/2014 | Kondo et al. |
| 9,153,340 B2 | 10/2015 | Morise et al. |
| 9,293,696 B2 | 3/2016 | Ootera et al. |
| 10,304,902 B2 | 5/2019 | Kado et al. |
| 10,311,932 B2 | 6/2019 | Umetsu et al. |
| 10,319,740 B2 | 6/2019 | Yoshimizu |
| 10,354,739 B2 | 7/2019 | Ootera et al. |
| 10,403,381 B2 | 9/2019 | Quinsat et al. |
| 10,446,212 B2 | 10/2019 | Hashimoto et al. |
| 10,446,249 B2 | 10/2019 | Quinsat et al. |
| 10,482,941 B2 | 11/2019 | Shimada et al. |
| 10,529,915 B2 * | 1/2020 | Araki .................... H01L 27/228 |
| 2021/0066458 A1 * | 3/2021 | Tak ..................... H01L 29/7788 |
| 2021/0082950 A1 | 3/2021 | Yoshimizu |
| 2021/0407867 A1 | 12/2021 | Ito et al. |

FOREIGN PATENT DOCUMENTS

| | | |
|---|---|---|
| JP | 5592909 B2 | 9/2014 |
| JP | 6184680 B2 | 8/2017 |
| JP | 6271350 B2 | 1/2018 |
| JP | 2019-046918 A | 3/2019 |
| JP | 2019-054148 A | 4/2019 |
| JP | 2019-054165 A | 4/2019 |
| JP | 2019-054190 A | 4/2019 |
| JP | 2019-054191 A | 4/2019 |
| JP | 2019-057545 A | 4/2019 |
| JP | 2019-160372 A | 9/2019 |
| JP | 2019-164861 A | 9/2019 |
| JP | 2021-48188 A | 3/2021 |
| WO | WO 2020/189421 A1 | 9/2020 |

\* cited by examiner

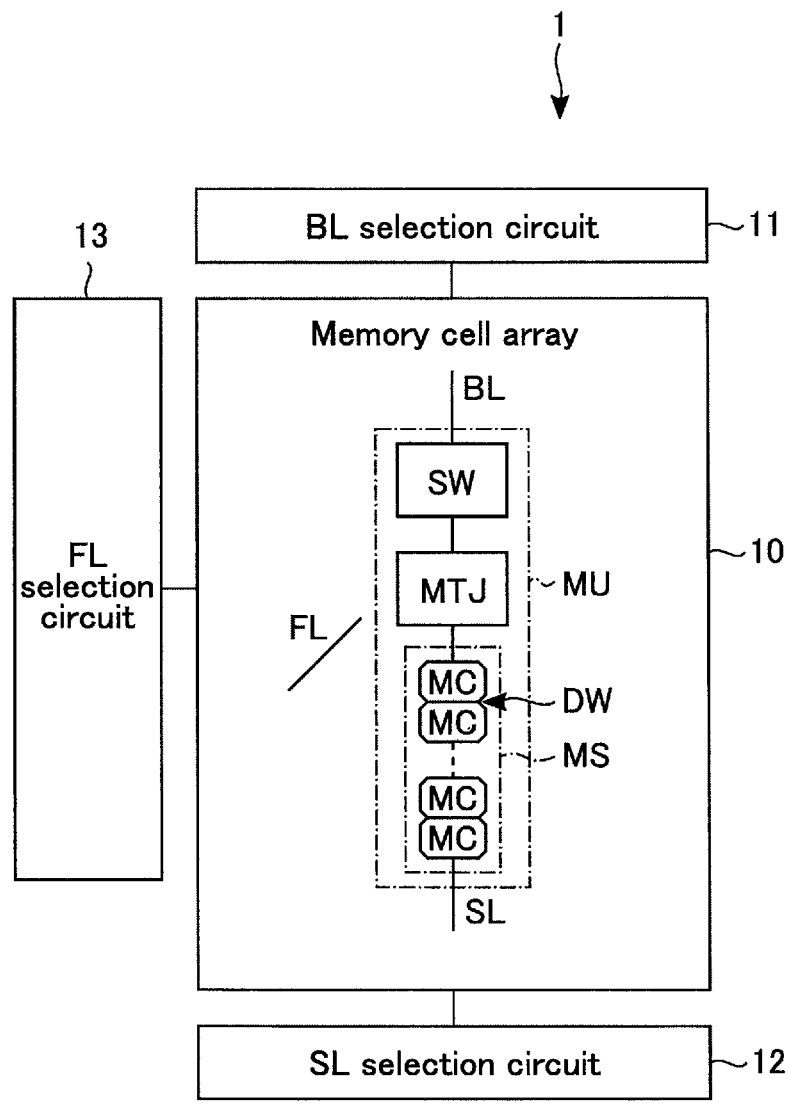
F I G. 1

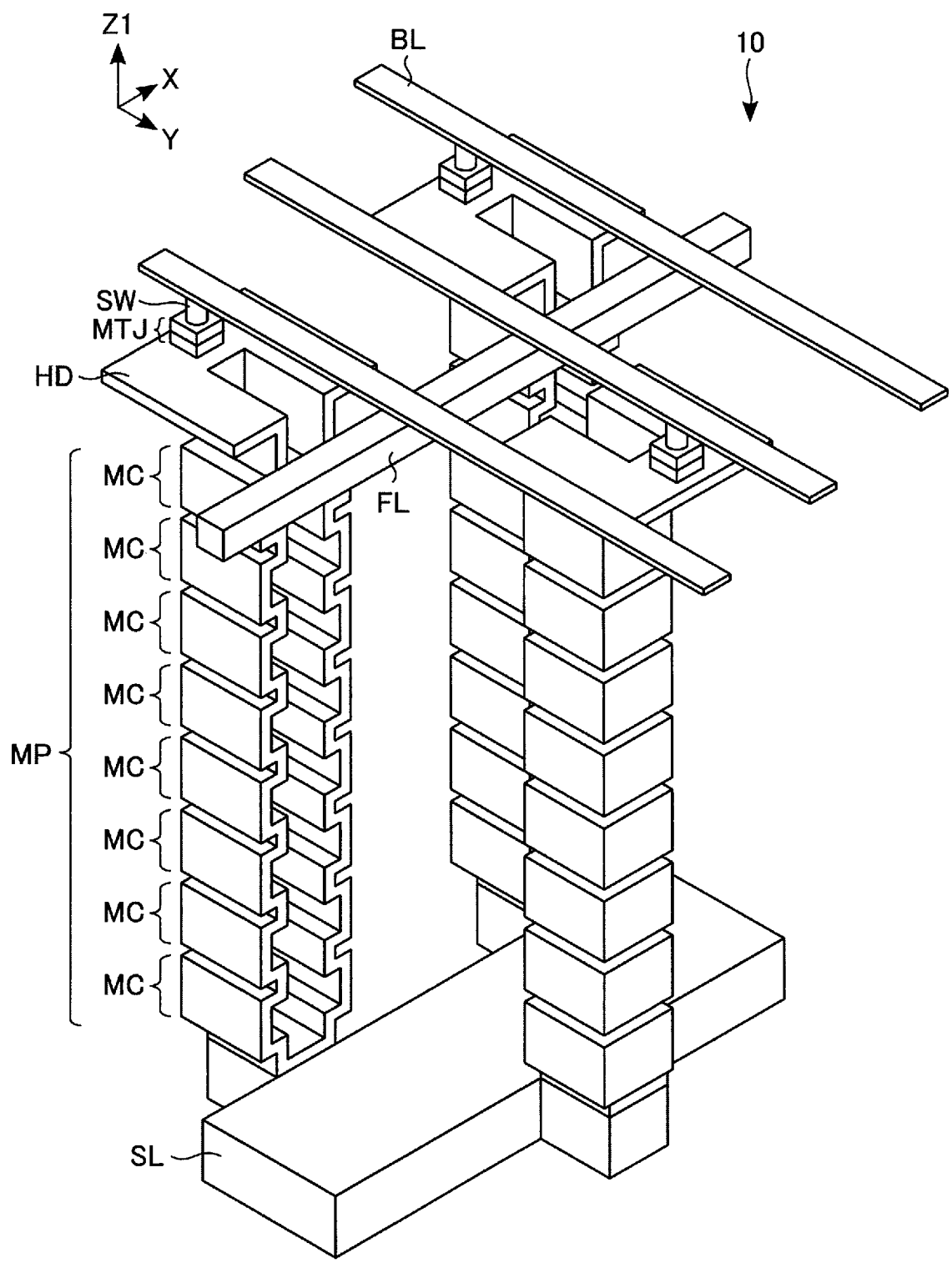
F I G. 3

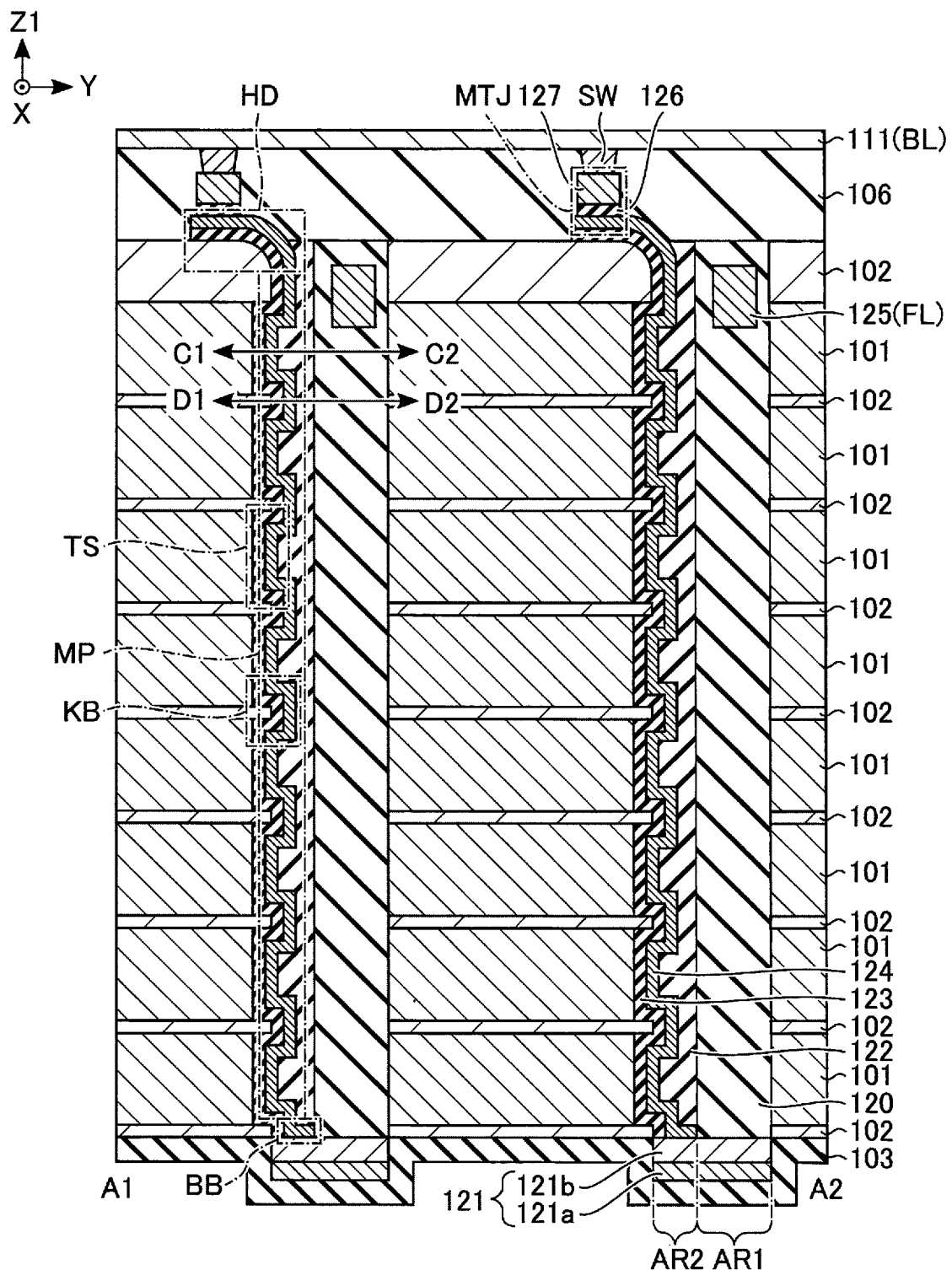
F I G. 5

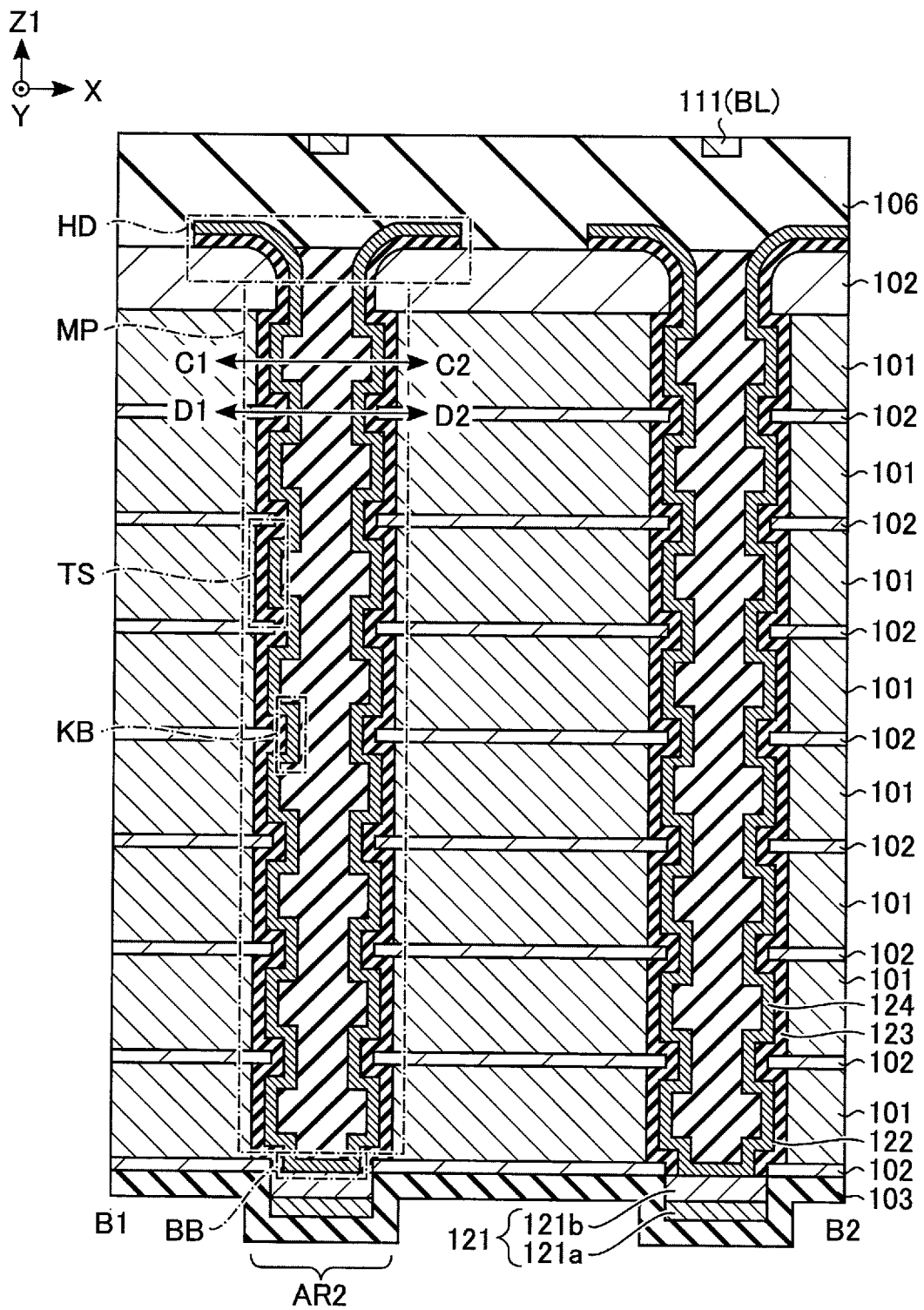
F I G. 6

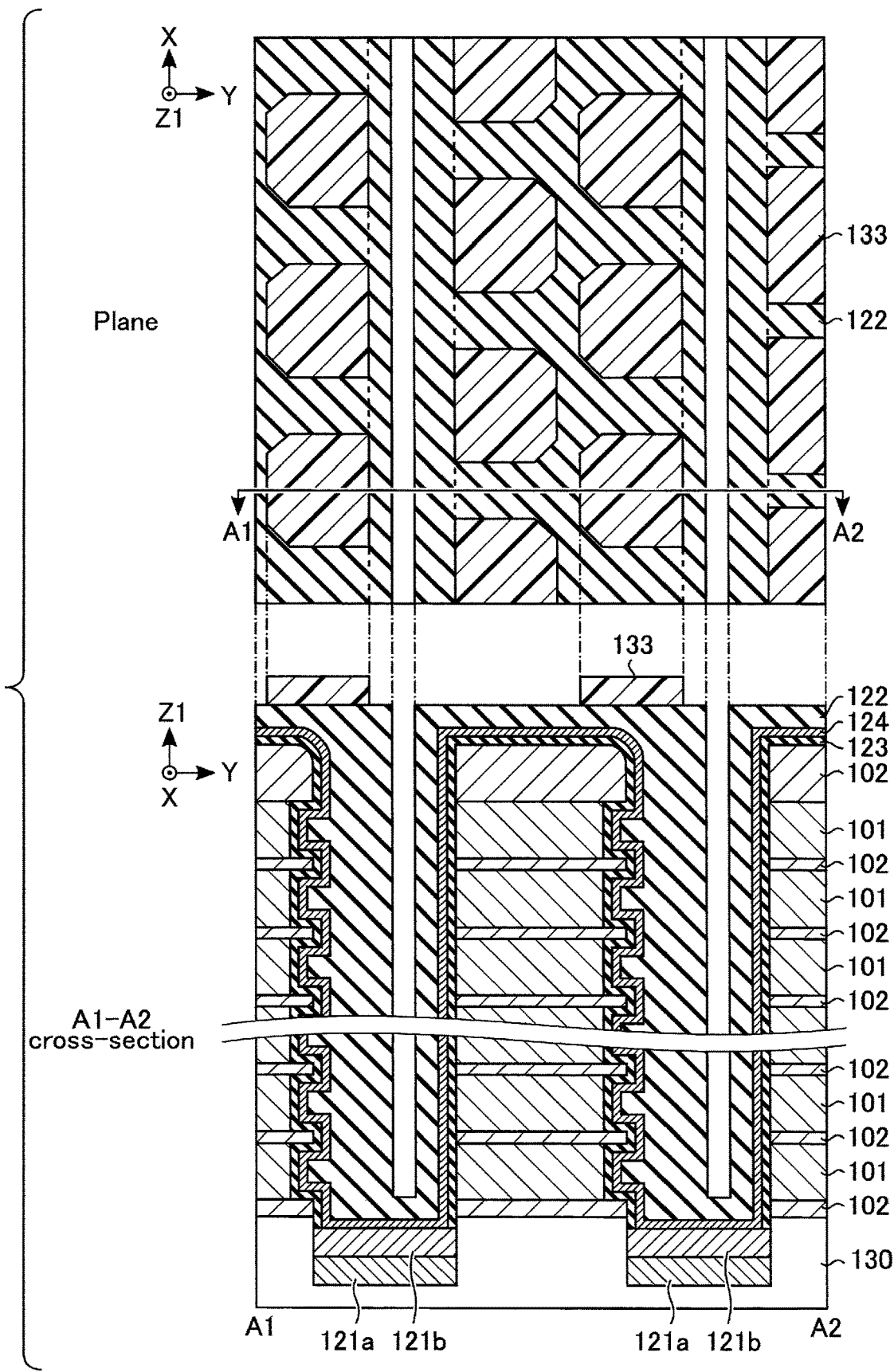
F I G. 17

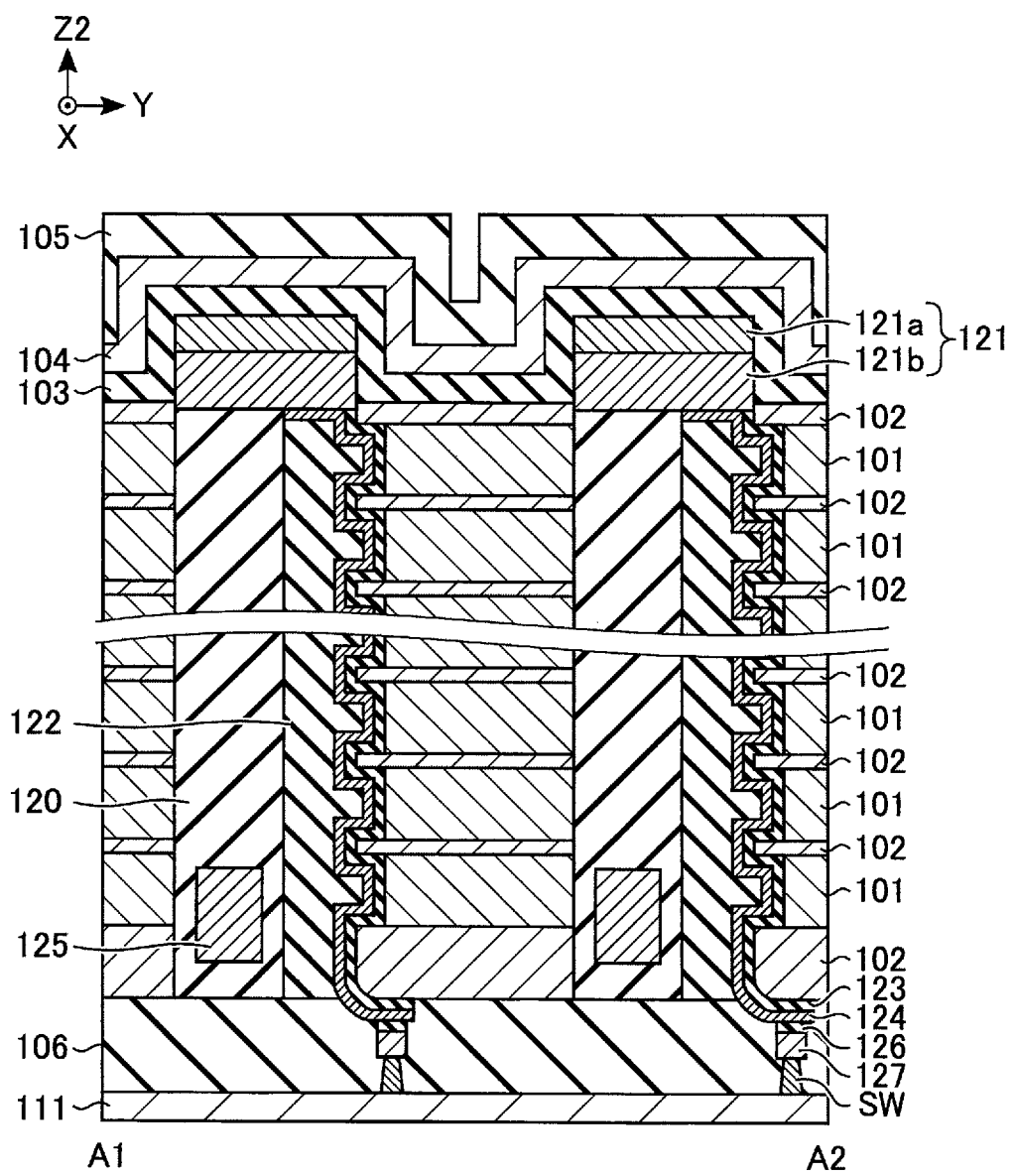
F I G. 25

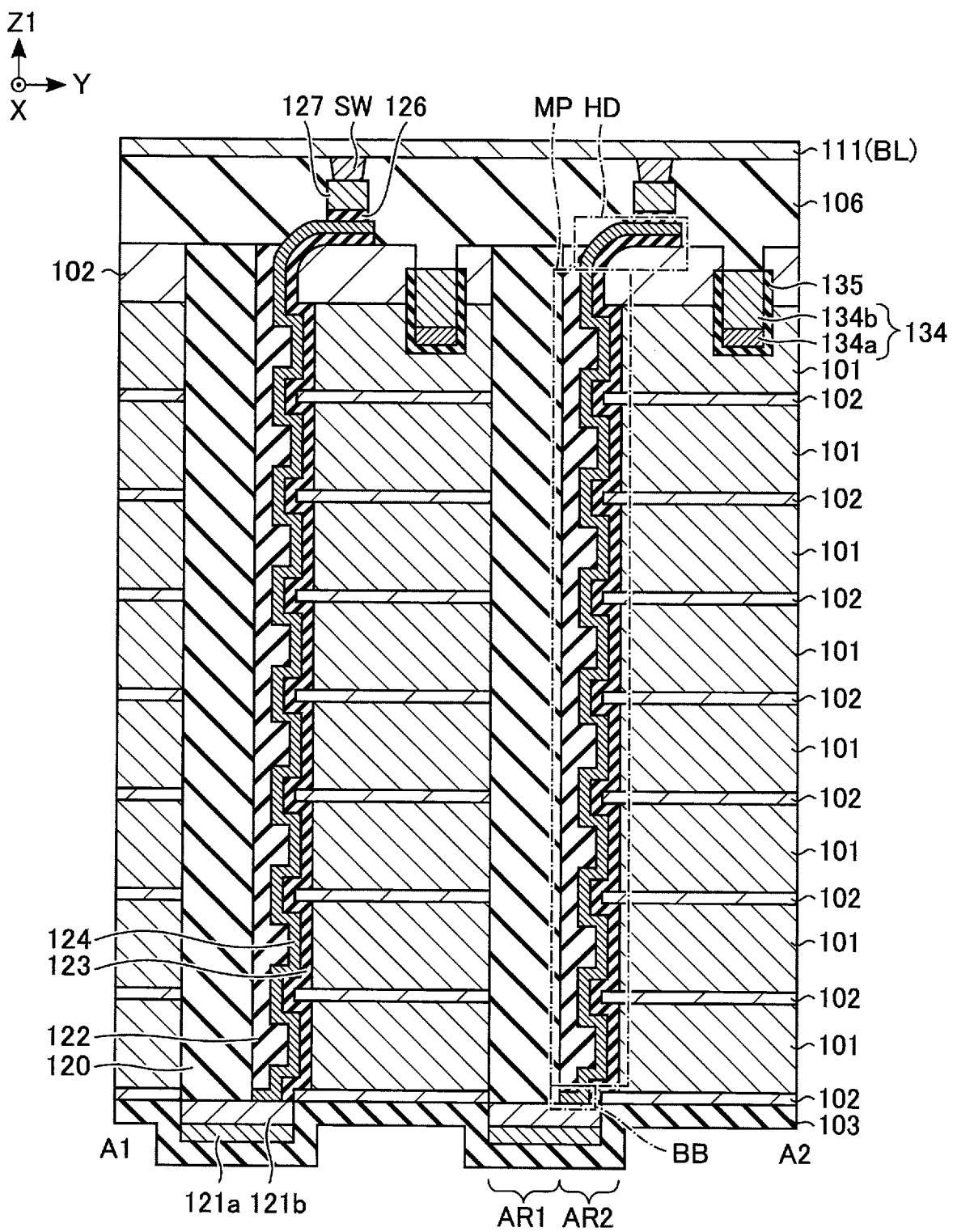
F I G. 28

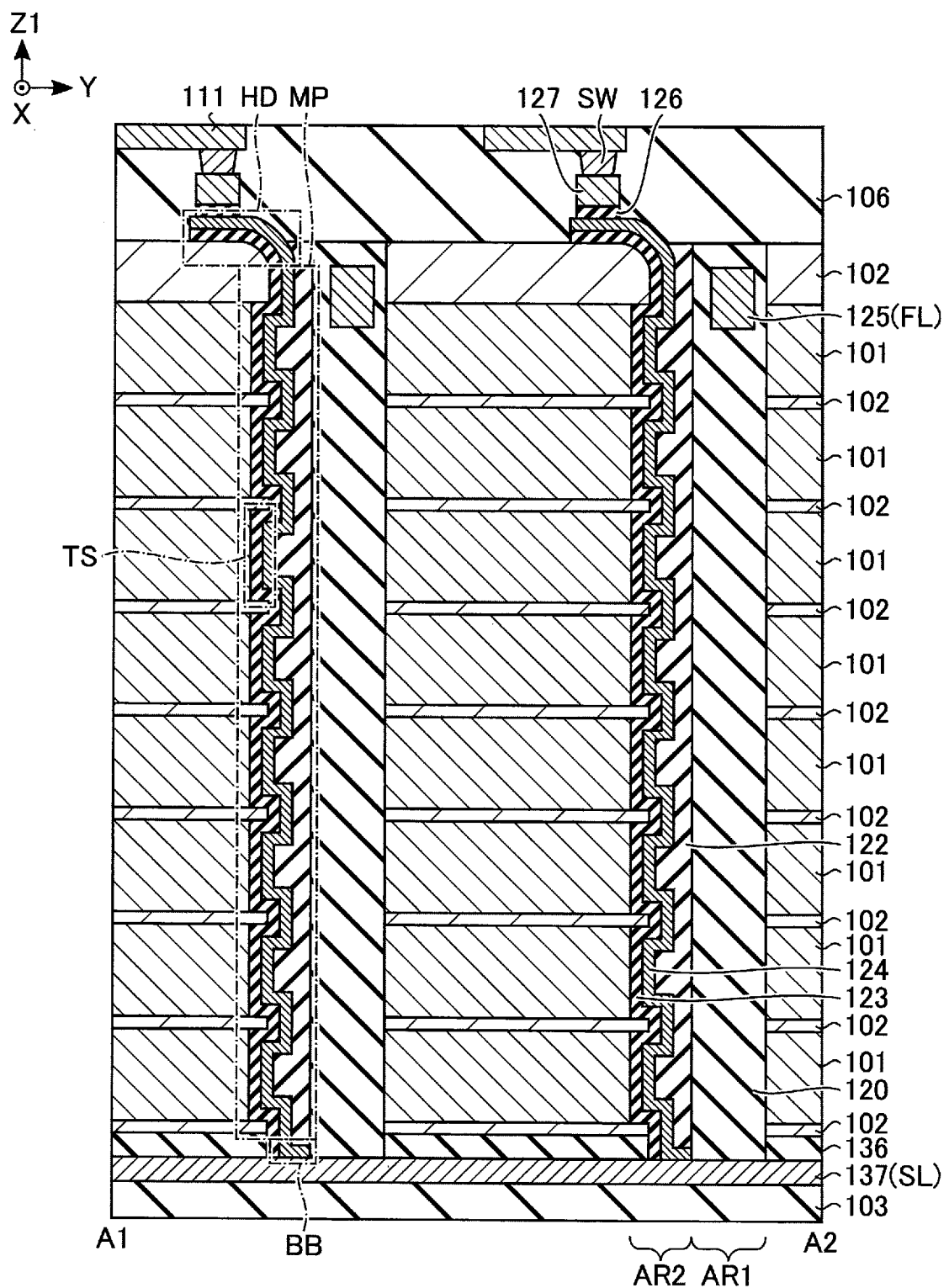
F I G. 30

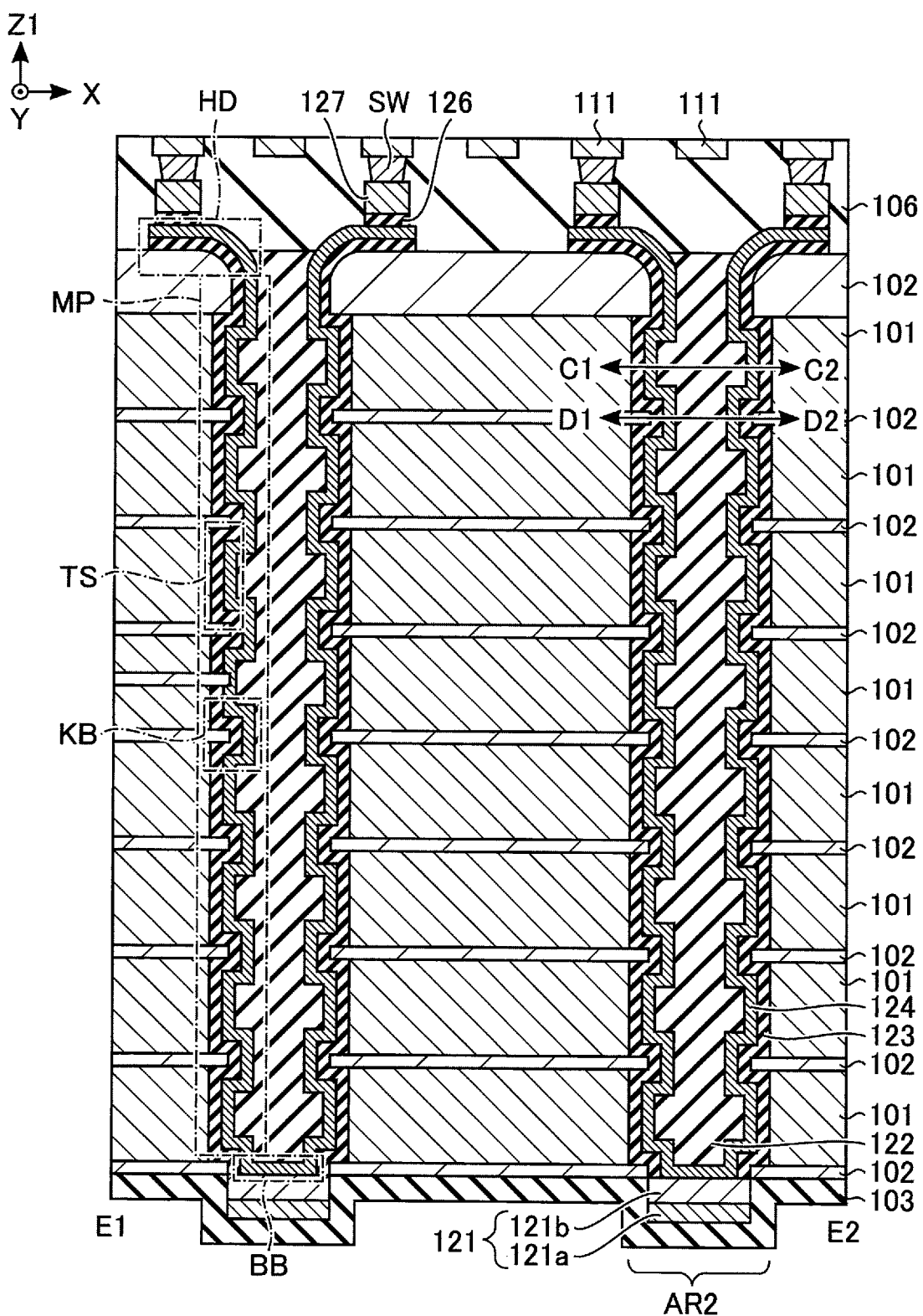
F I G. 36

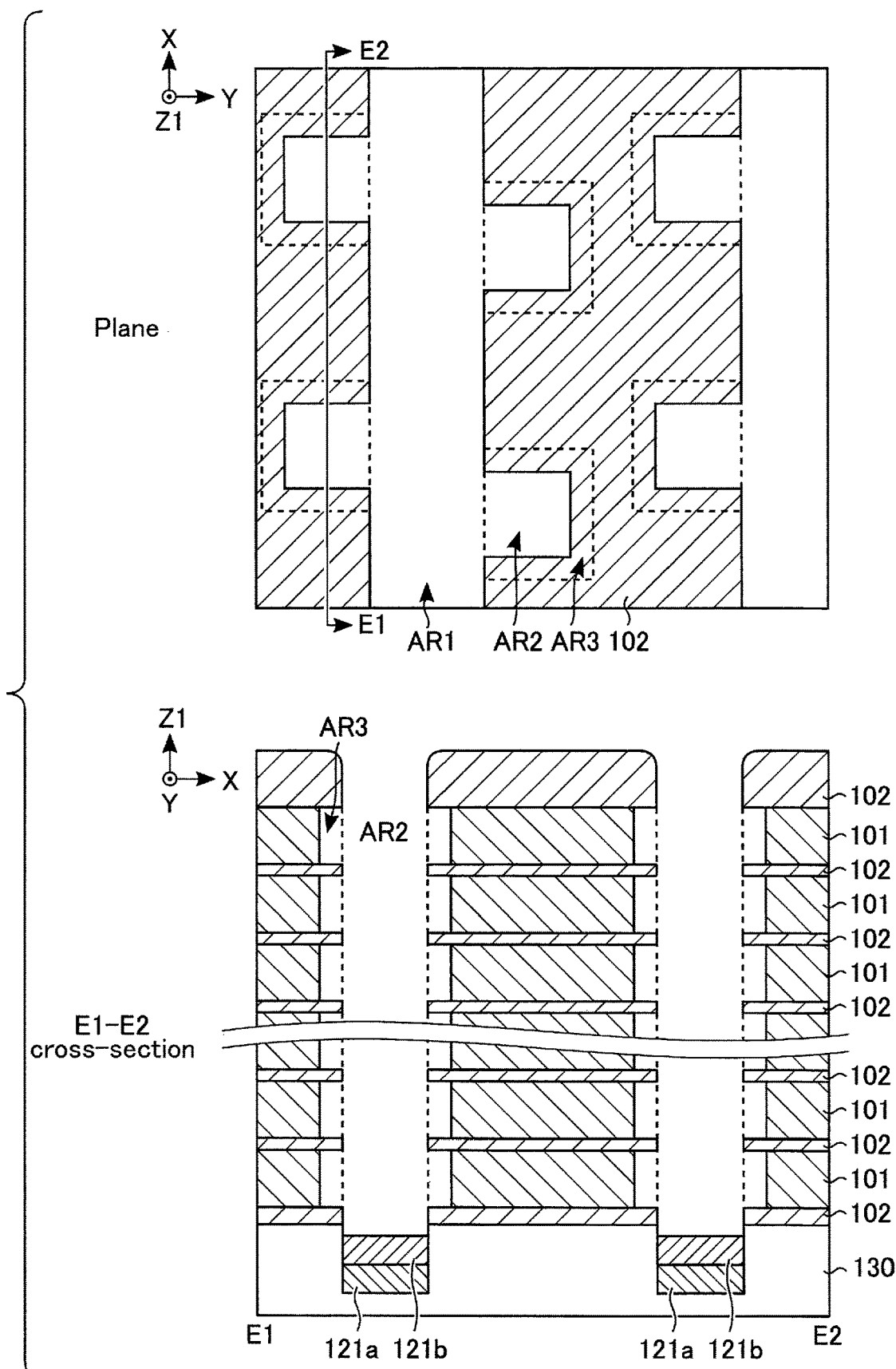
F I G. 38

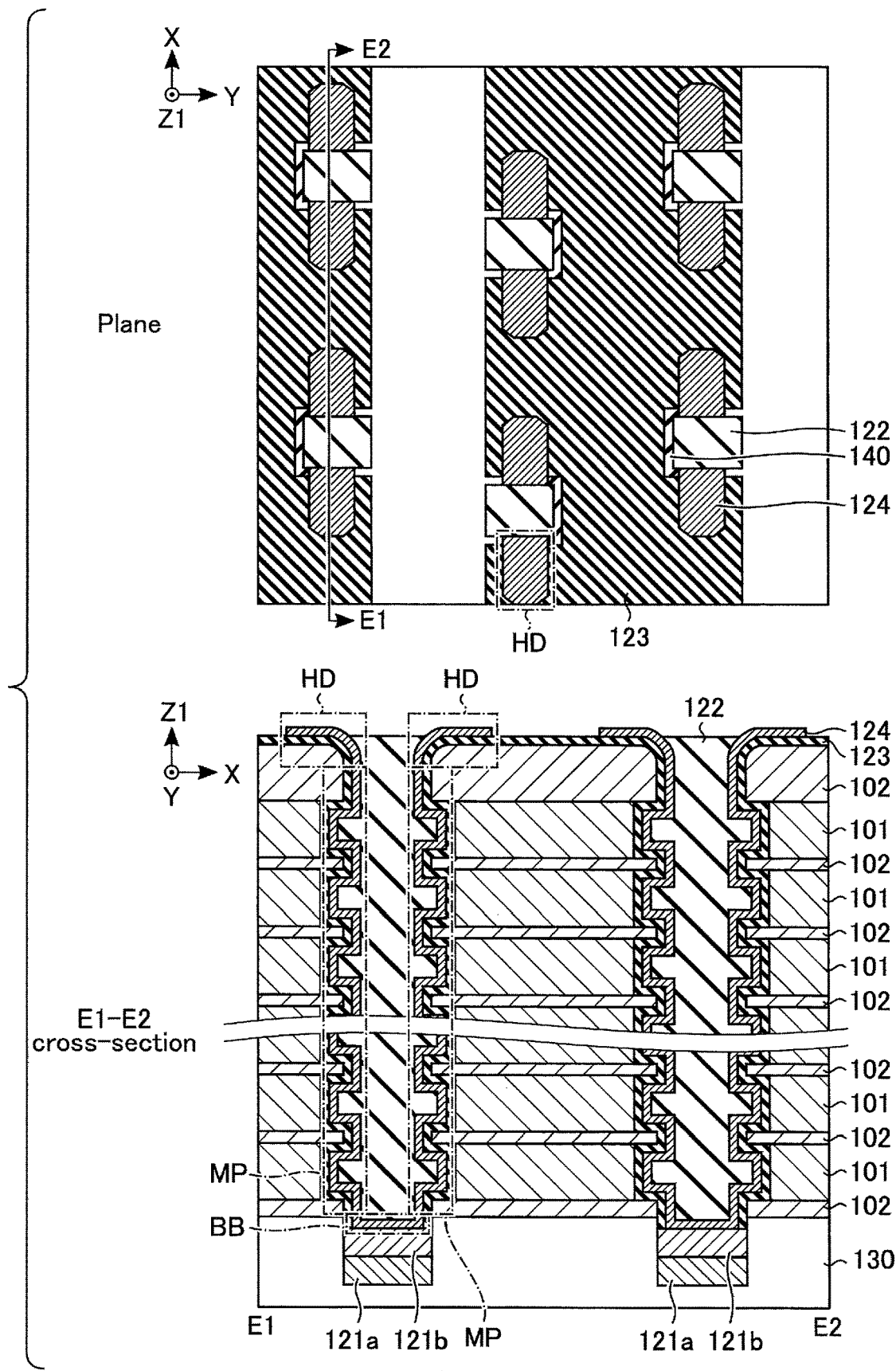
F I G. 42

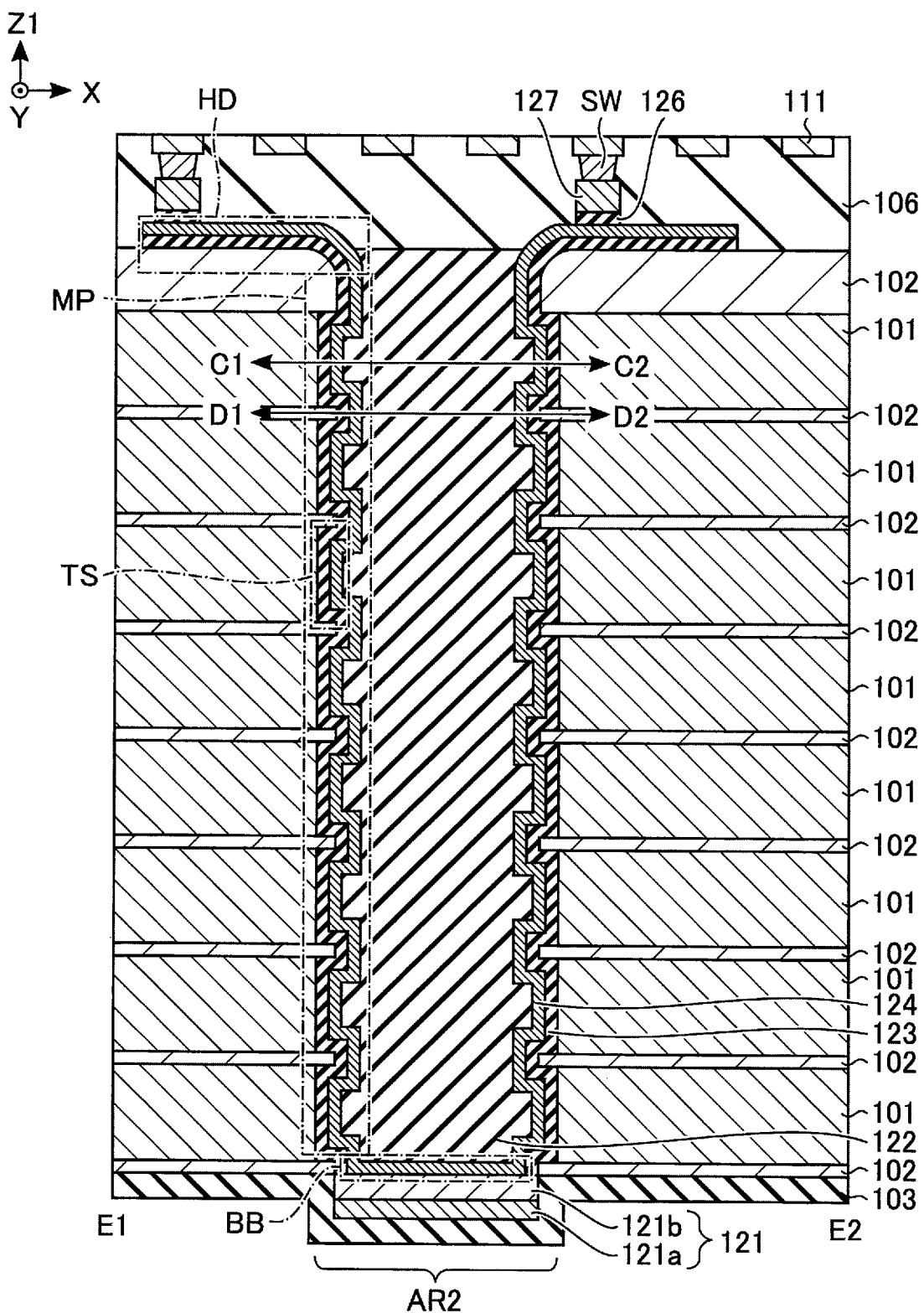
F I G. 46

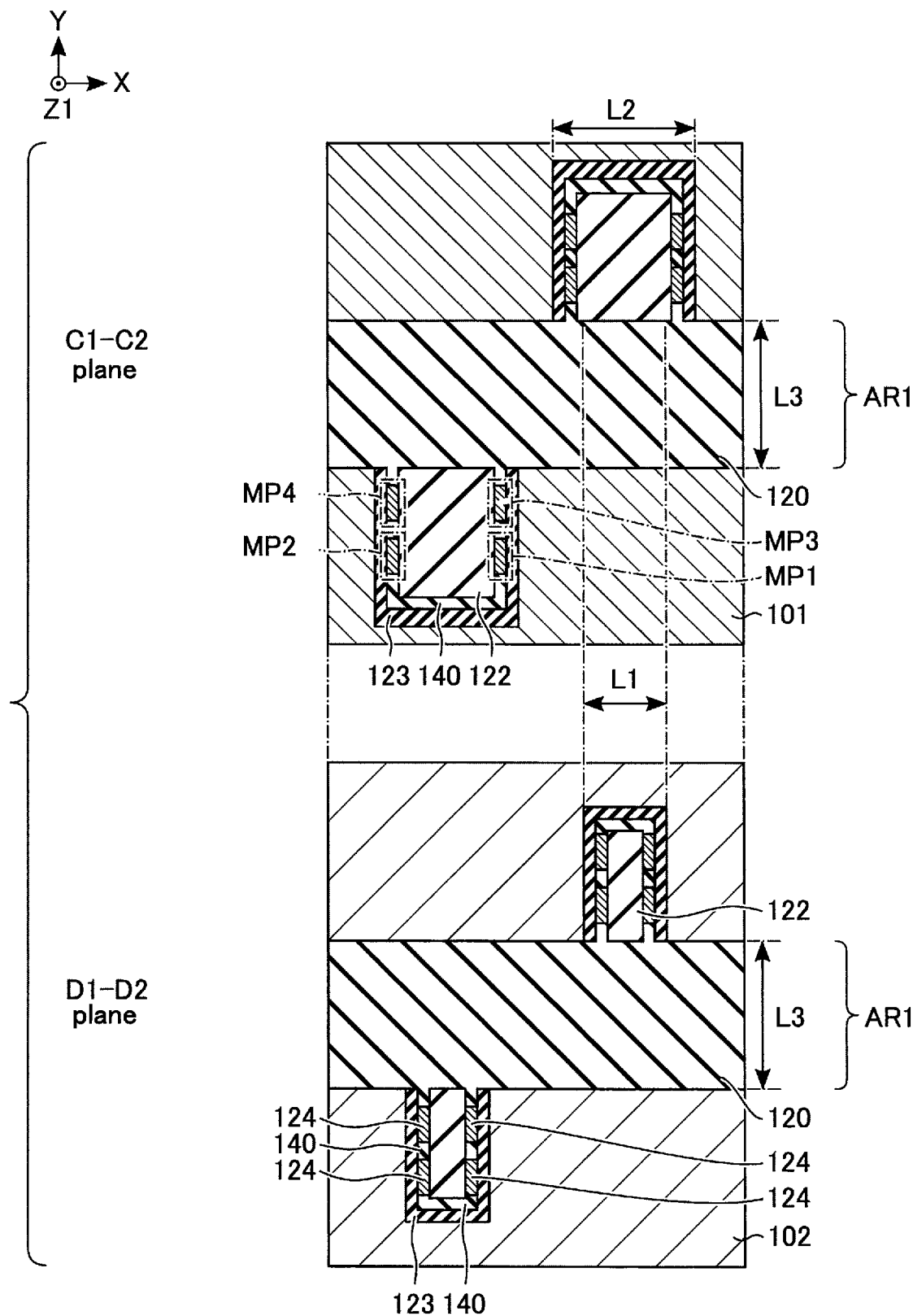
F I G. 47

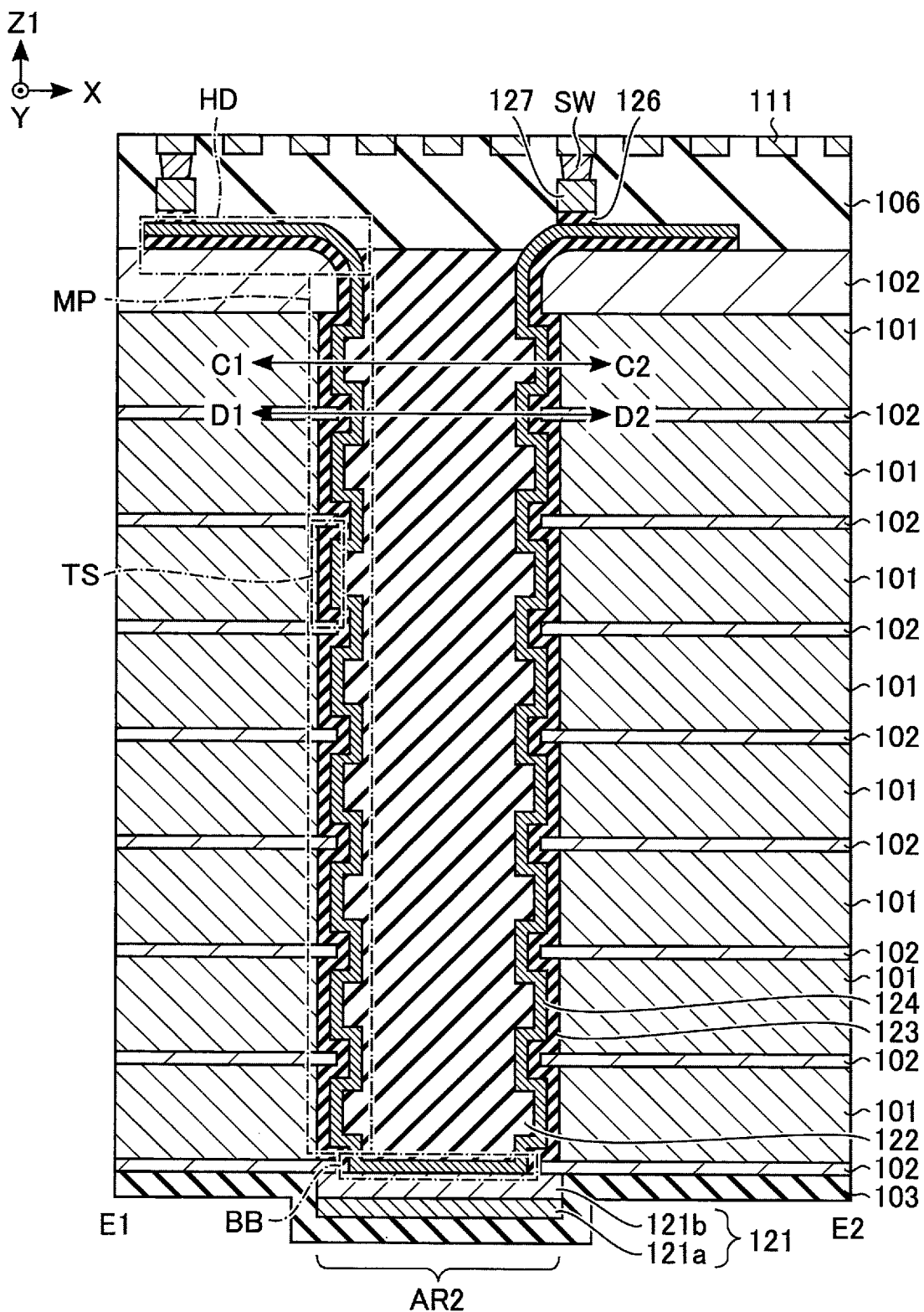
F I G. 52

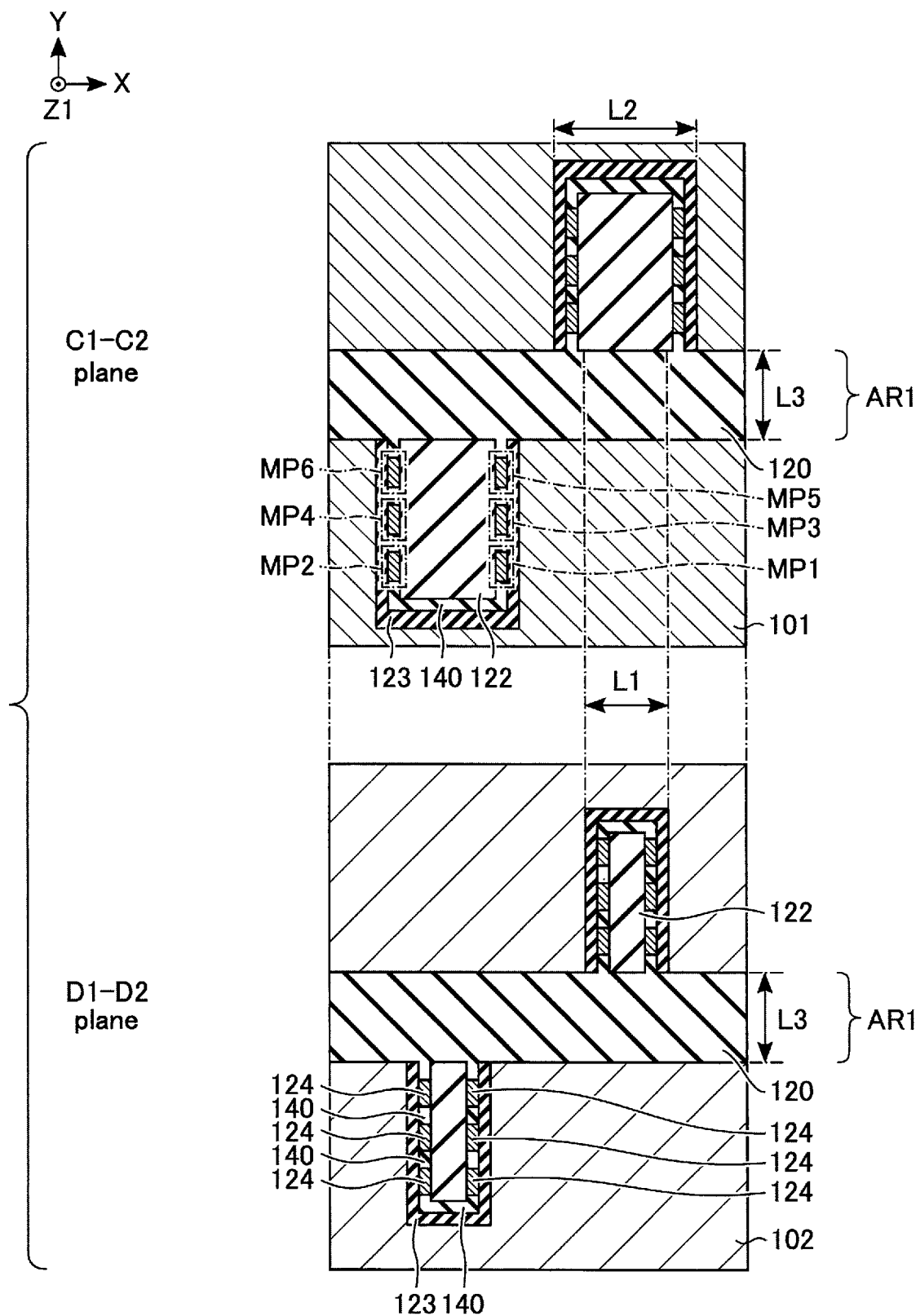
F I G. 53

MAGNETIC MEMORY DEVICE

CROSS-REFERENCE TO RELATED APPLICATIONS

This application is based upon and claims the benefit of priority from Japanese Patent Application No. 2019-169536, filed Sep. 18, 2019, the entire contents of which are incorporated herein by reference.

FIELD

Embodiments described herein relate generally to a magnetic memory device.

BACKGROUND

As a magnetic memory device, a domain wall memory that shifts a domain wall of a magnet by making a current flow through the magnet is known.

BRIEF DESCRIPTION OF THE DRAWINGS

FIG. 1 is a block diagram of a magnetic memory device according to a first embodiment;

FIG. 3 is a perspective view of a memory cell array provided in the magnetic memory device according to the first embodiment;

FIG. 5 is a cross-sectional view along an A1-A2 line in FIG. 4;

FIG. 6 is a cross-sectional view along a B1-B2 line in FIG. 4;

FIGS. 8 to 22 are diagrams showing a manufacturing process of the memory cell array provided in the magnetic memory device according to the first embodiment;

FIGS. 24 and 25 are cross-sectional views of a memory cell array showing a manufacturing process of the magnetic memory device according to the first embodiment;

FIG. 28 is a cross-sectional view of the memory cell array provided in the magnetic memory device according to the first example of the second embodiment;

FIG. 30 is a cross-sectional view of the memory cell array provided in the magnetic memory device according to the second example of the second embodiment;

FIG. 36 is a cross-sectional view along an E1-E2 line in FIG. 35;

FIGS. 38 to 44 are diagrams showing a manufacturing process of a memory cell array provided in the magnetic memory device according to the fourth embodiment;

FIG. 46 is a cross-sectional view along an E1-E2 line in FIG. 45;

FIG. 47 is plan views along a C1-C2 line and a D1-D2 line in FIG. 46;

FIG. 52 is a cross-sectional view along an E1-E2 line in FIG. 51; and

FIG. 53 is plan views along a C1-C2 line and a D1-D2 line in FIG. 52.

DETAILED DESCRIPTION

Figure 2:
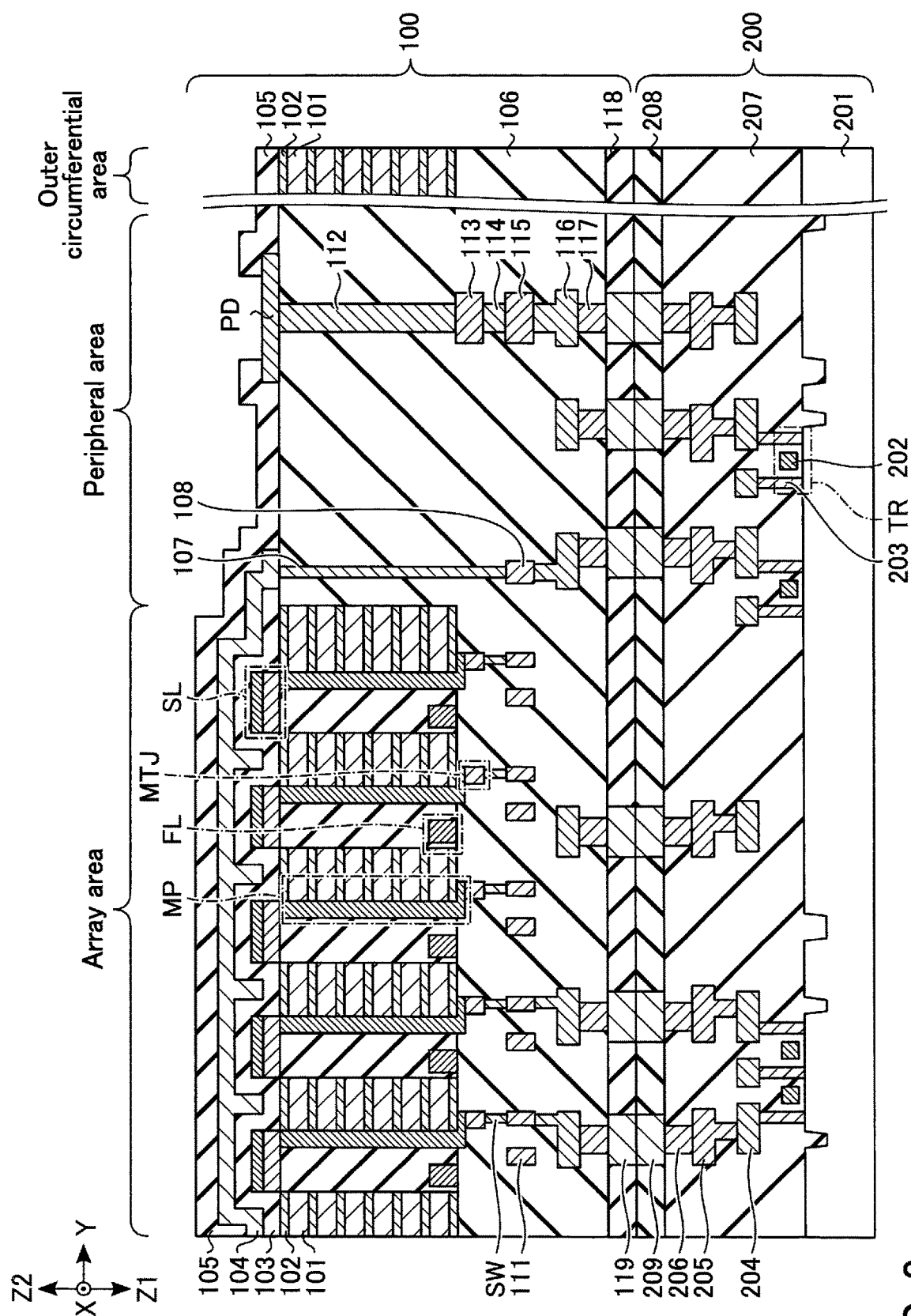
FIG. 2 is a cross-sectional view of the magnetic memory device according to the first embodiment.

In general, according to one embodiment, a magnetic memory device includes: a plurality of first films and a plurality of second films stacked alternately in a first direction; a first insulating layer passing through the plurality of first and second films and extending in a second direction intersecting with the first direction; a second insulating layer passing through the plurality of first and second films and in contact with a surface of the first insulating layer facing a third direction intersecting with the first and second directions; a first magnet including a first pillar portion provided between the second insulating layer and the plurality of first and second films, and a first terrace portion coupled to one end of the first pillar portion and extending in at least one of the second and third directions; a first interconnect layer coupled to the other end of the first pillar portion of the first magnet; and a first magnetoresistance effect element coupled to the first terrace portion of the first magnet.

Hereinafter, embodiments will be described with reference to the accompanying drawings. In the description below, structural elements having substantially the same functions and configurations will be denoted by the same reference symbols, and a repeat description will be given only where necessary.

Each of the embodiments described below merely indicates an exemplary device and method for embodying the technical idea of the embodiment. The technical ideas underlying the embodiments in no way limit the element materials, shapes, configurations, arrangements etc., to those described below.

The technical ideas of the embodiments can be modified in various manners within the scope of the claims.

1. First Embodiment

A magnetic memory device according to the first embodiment will be described. In the description below, a magnetic memory including a plurality of magnetic domains (memory) separated by domain walls will be described.

1.1 Configuration 1.1.1 Overall Configuration of Magnetic Memory Device

First, the overall configuration of the magnetic memory device will be described with reference to FIG. 1. FIG. 1 is an example of a block diagram showing the basic overall configuration of the magnetic memory device.

As shown in FIG. 1, a magnetic memory device 1 includes a memory cell array 10, a BL selection circuit 11, an SL selection circuit 12, and an FL selection circuit 13.

The memory cell array 10 includes a plurality of memory units MU, a plurality of bit lines BL, a plurality of source lines SL, and a plurality of field lines FL. One end of the memory unit MU is coupled to any one of the plurality of bit lines BL, and the other end of the memory unit MU is coupled to any one of the plurality of source lines SL. The plurality of bit lines BL and the plurality of source lines SL are respectively provided so as to correspond to rows or columns. Any one of the memory units MU is selected by selecting a bit line BL and a source line SL. In addition, a field line FL used for write operations is provided in the vicinity of the memory units MU.

The memory unit MU includes a switching element SW, a magnetic tunnel junction (MTJ) element (hereinafter, referred to as an "MTJ element"), and a memory string MS in which a plurality of memory cells MC (magnetic domains) are coupled in series. The switching element SW, the MTJ element, and the memory string MS are coupled in series.

One end of the switching element SW is coupled to the bit line BL, and the other end of the switching element SW is coupled to the MTJ element. The switching element SW functions as a switching element between two terminals that electrically connect the bit line BL and the MTJ element. The switching element SW changes from the OFF state to the ON state when a voltage that is, for example, equal to or greater than a threshold voltage (Vth) is applied thereto, and electrically connects the bit line BL and the MTJ element. The switching element SW maintains the ON state when a current equal to or greater than a holding current value continues to flow through the switching element SW in the ON state.

The switching element SW may have this function no matter which polarity of voltages is applied thereto. The switching element SW may contain at least one chalcogen element selected from the group consisting of tellurium (Te), selenium (Se), and sulfur (S). Alternatively, the switching element SW may contain a chalcogenide which is a compound containing a chalcogen element. The switching element may contain, in addition to the above elements, at least one element selected from the group consisting of boron (B), aluminum (Al), gallium (Ga), indium (In), carbon (C), silicon (Si), germanium (Ge), tin (Sn), arsenic (As), phosphorus (P), and antimony (Sb).

The MTJ element is used when reading data of the memory string MS. The resistance value of the MTJ element changes according to the data (a magnetization direction, i.e., a direction of spinning) read from the memory string MS. Pieces of data are respectively assigned depending on whether it is a case where the MTJ element is in a high resistance state or a case where the MTJ element is in a low resistance state.

The memory string MS includes a magnet in which, for example, a plurality of magnetic domains separated by domain walls DW are arranged in series between a bit line BL and a source line. Each of the magnetic domains functions as one memory cell MC. In the memory string MS, data is shifted between memory cells MC (magnetic domains) according to a direction in which the current flows between the bit line BL and the source line SL.

The BL selection circuit 11 selects one or more bit lines BL based, for example, on a column address.

The SL selection circuit 12 selects one or more source lines SL based, for example, on a row address.

The FL selection circuit 13 selects one or more field lines FL based, for example, on the row address.

1.1.2 Cross-Sectional Configuration of Magnetic Memory Device

Next, an example of the cross-sectional configuration of the magnetic memory device 1 will be described with reference to FIG. 2. Hereinafter, an X direction is substantially parallel with a semiconductor substrate 201 and corresponds, for example, to a direction in which source lines SL extend. A Y direction is substantially parallel with the semiconductor substrate 201, intersects with the X direction, and corresponds, for example, to a direction in which bit lines BL extend. A Z1 direction is substantially perpendicular to the semiconductor substrate 201 and corresponds to a direction from an array chip 100 toward a circuit chip 200. A Z2 direction is substantially perpendicular to the semiconductor substrate 201 and corresponds to a direction from the circuit chip 200 toward the array chip 100. When neither the Z1 direction nor the Z2 direction is limited, the direction is referred to as a "Z direction".

As shown in FIG. 2, the magnetic memory device 1 includes an array area, a peripheral area, and an outer circumferential area.

The array area is an area including the memory cell array 10. The peripheral area is an area that does not include the memory cell array 10 and is an area where any one of circuits not including the memory cell array 10 and electrode pads PD which are used for the coupling, for example, between the magnetic memory device 1 and an external device, etc., are provided. The outer circumferential area is an area including the vicinity of chip ends. The outer circumferential area is an area in which for example, a scribe line, or an alignment pattern for photolithography used in the manufacturing process of the magnetic memory device 1, or a characteristic check pattern, or the like, is provided.

The magnetic memory device 1 has a configuration in which the array chip 100 and the circuit chip 200 are bonded together.

The array chip 100 includes the memory cell array 10, electrode pads PD, and various interconnects for connecting the memory cell array 10 and the circuit chip 200.

The array chip 100 includes semiconductor layers 101 and 102; insulating layers 103, 106, and 118; interconnect layers 104, 108, 111, 113, 115, and 116; a passivation layer 105; contact plugs 107, 112, 114, and 117; electrode pads 119 and PD; memory pillars MP, field lines FL, MTJ elements, and switching elements SW.

More specifically, in the example of FIG. 2, in at least one portion of the array area, the outer circumferential area, and the peripheral area, seven semiconductor layers 102 and six semiconductor layers 101 are alternately stacked.

A plurality of memory pillars MP penetrating through the plurality of the semiconductor layers 101 and 102 and extending in the Z direction are provided in the array area. One memory pillar MP corresponds to one memory string MS. The details of the memory pillars MP will be described later.

In the vicinity of the memory pillars MP, a plurality of field lines FL extending, for example, in the X direction are provided. A plurality of MTJ elements for each of which one end is coupled to each memory pillar MP are provided. A plurality of switching elements SW are provided so as to be in contact with the other end of each MTJ element. Each switching element SW is coupled to any one of the interconnect layers 111 functioning as bit lines BL. Furthermore, the interconnect layers 111 are electrically coupled to any one of the plurality of electrode pads 119 via, for example, the interconnect layer 116 and the contact plug 117. The electrode pads 119 are used for the coupling with the circuit chip 200.

A plurality of source lines SL are provided in contact with the upper ends of the memory pillars MP in the Z2 direction and extending, for example, in the X direction. The source line SL is arranged so as to protrude from the top surface of the uppermost layer of the semiconductor layers 102 in the Z2 direction. The insulating layer 103 is provided so as to conformally cover the top surface of the uppermost layer of the semiconductor layers 102 and the plurality of source lines SL. Therefore, the top surface of the insulating layer 103 in the Z2 direction has protrusions (unevenness or concave-convex portions) attributable to the source lines SL.

A plurality of interconnect layers 104 that electrically connect the source lines SL and a contact plug 107 are provided on the insulating layer 103 in the Z2 direction. The top surface of the interconnect layers 104 in the Z2 direction has protrusions (unevenness or concave-convex portions) attributable to the source lines SL. Each of the plurality of interconnect layers 104 is electrically coupled to any one of the plurality of source lines SL. The interconnect layers 104 are electrically coupled to the interconnect layer 108 via the contact plug 107. Furthermore, the interconnect layer 108 is electrically coupled to any one of the electrode pads 119 via the interconnect layer 116 and the contact plug 117.

In the peripheral area, a plurality of electrode pads PD are provided on the top surface of the array chip 100 in the Z2 direction. The electrode pads PD are used for the coupling between the magnetic memory device 1 and an external device.

The electrode pads PD are electrically coupled to any one of the electrode pads 119 via the contact plug 112, the interconnect layer 113, the contact plug 114, the interconnect layers 115 and 116, and the contact plug 117.

The passivation layer 105 is provided on the top surface of the array chip 100 in the Z2 direction so as to cover the interconnect layers 104 and the insulating layer 106. Openings corresponding to the electrode pads PD are provided in the passivation layer 105.

The insulating layer 118 is provided on the insulating layer 106 in the Z1 direction. A plurality of electrode pads 119 are provided in the insulating layer 118 and coupled to the circuit chip 200.

For the semiconductor layers 101 and 102, for example, Si and SiGe are used, respectively. For the insulating layers 103, 106, and 118, for example, silicon oxide ($SiO_2$) is used. The interconnect layers 104, 108, 111, 113, 115, and 116, and the contact plugs 107, 112, 114, and 117 are composed of a conductive material, and the conductive material may be a metal material, a p-type semiconductor or an n-type semiconductor, for example. The electrode pads PD and 119 are composed of a conductive material, and the conductive material may be a metal material, for example. In the following description, a case where copper (Cu) is contained in the electrode pads 119 will be described. For the passivation layer 105, for example, silicon nitride (SiN) is used.

The circuit chip 200 includes a BL selection circuit 11, an SL selection circuit 12, an FL selection circuit 13, and various interconnects for connecting these circuits.

More specifically, the circuit chip 200 includes a semiconductor substrate 201, a plurality of transistors TR, a plurality of interconnect layers 204 and 205, a plurality of contact plugs 203 and 206, a plurality of electrode pads 209, and insulating layers 207 and 208.

The plurality of transistors TR are used for the BL selection circuit 11, the SL selection circuit 12, the FL selection circuit 13, and the like. The transistors TR include a gate insulating film (not shown) provided on the semiconductor substrate 201, a gate electrode 202 provided on the gate insulating film, and sources and drains (not shown) formed in the semiconductor substrate 201. The sources and drains are coupled to the interconnect layers 204, respectively, via the contact plugs 203. The interconnect layers 204 are coupled to the interconnect layers 205. The interconnect layers 205 are coupled to the electrode pads 209 via the contact plugs 206.

The insulating layer 207 is provided on the semiconductor substrate 201. The insulating layer 208 is provided on the insulating layer 207. The plurality of electrode pads 209 are provided in the insulating layer 208 and electrically coupled to the plurality of electrode pads 119 of the array chip 100, respectively.

The interconnect layers 204 and 205, the contact plugs 203 and 206, and the gate electrode 202 are composed of a conductive material, and the conductive material may be a metal material, a p-type semiconductor or an n-type semiconductor, for example. The insulating layers 207 and 208 may be composed of $SiO_2$, for example. The electrode pads 209 are composed of a conductive material, and the conductive material may be a metal material, for example. In the following description, a case where copper (Cu) is contained in the electrode pads 209 will be described.

1.1.3 Overall Configuration of Memory Cell Array

Next, an example of the overall configuration of the memory cell array 10 will be described with reference to FIG. 3. FIG. 3 is a perspective view of the memory cell array 10. In the example of FIG. 3, illustration of the insulating layers is omitted.

As shown in FIG. 3, a source line SL includes an electrode portion extending in the X direction and a plurality of protrusions provided on two side faces of the electrode portion facing the Y direction. The plurality of protrusions are arranged, for example, in a staggered fashion toward the X direction. Pillars of a magnet are provided on the protrusions of the source line SL. Each pillar of the magnet includes a bottom portion (hereinafter, referred to as a "bottom") provided on the protrusion of the source line SL, side face portions (hereinafter, also referred to as "memory pillars MP") provided in contact with the bottom and extending in the Z1 direction, and a top surface portion (hereinafter, referred to as a "terrace HD") which is in contact with the side face portions and drawn to an XY plane. The memory pillar MP corresponds to one memory string MS.

More specifically, the memory pillar MP is provided, for example, on three sides of the protrusion of the source line SL which is not in contact with the electrode portion of the source line SL. In the memory pillar MP, a plurality of protrusions (unevenness or concave-convex portions) protruding to the XY direction are provided. One protrusion of the memory pillar MP corresponds to one magnetic domain, i.e., a memory cell MC. In other words, a plurality of narrow portions are provided in the memory pillar MP. One narrow portion of the memory pillar MP corresponds to one domain wall DW. When a drive current (shift current) is supplied between a bit line BL and a source line SL, the magnetic domain wall DW is shifted due to the spin transfer torque, and in a state where a drive current is not supplied therebetween, the domain wall DW stays at the narrow portion.

The upper end of the magnet, i.e., the terrace HD, is drawn toward the outside of the memory pillar MP in the XY plane.

MTJ elements are provided on the terrace HD. A switching element SW is provided on the MTJ elements. Furthermore, a bit line BL extending in the Y direction is provided on the switching element SW.

Above the source line SL extending in the X direction, a field line FL extending in the X direction is provided in the vicinity of the upper portion of the memory pillar MP and the terrace HD.

1.1.4 Planar Configuration of Memory Cell Array

Figure 4:
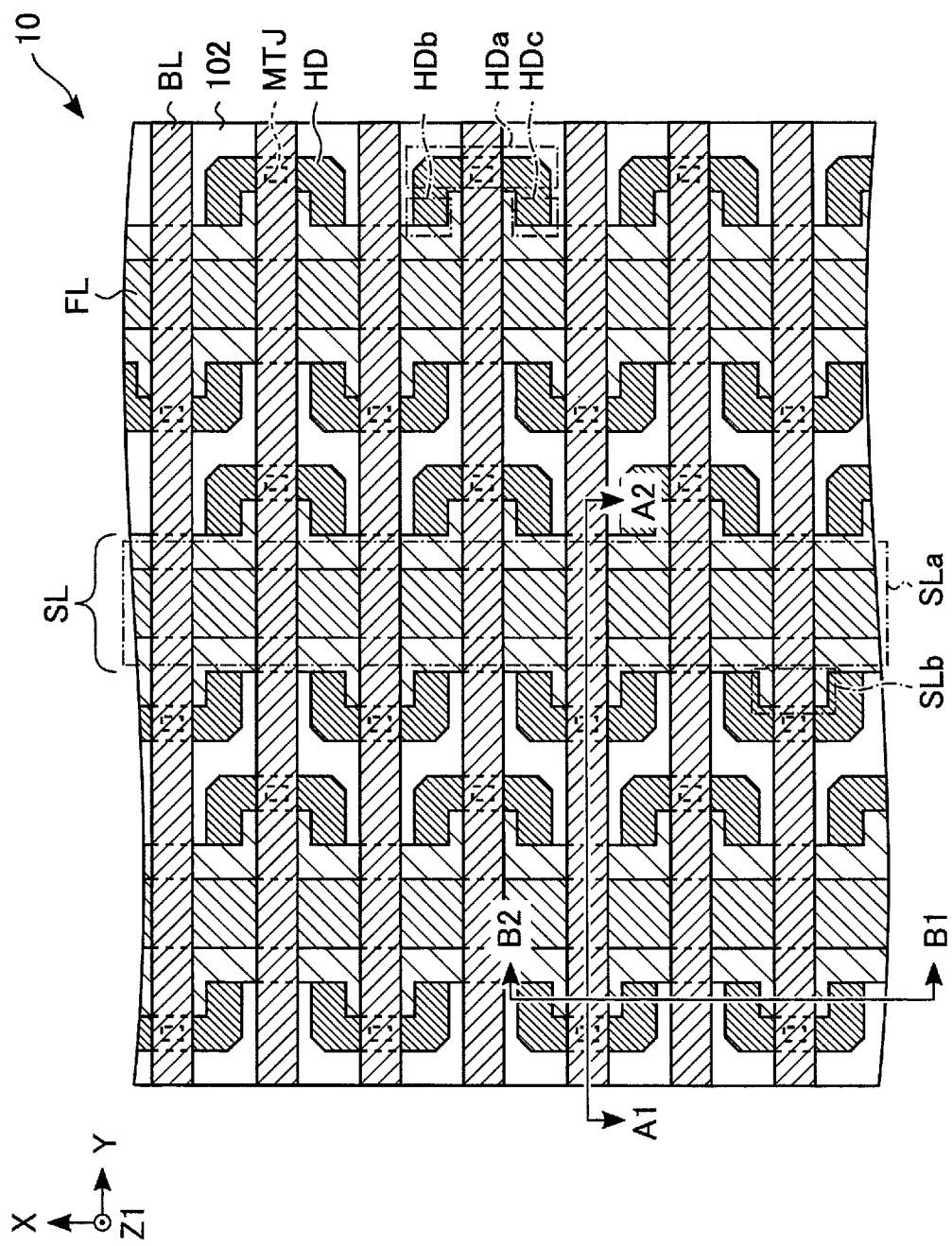
FIG. 4 is a plan view of the memory cell array provided in the magnetic memory device according to the first embodiment.

Next, an example of the planar configuration of the memory cell array 10 will be described with reference to FIG. 4. In the example of FIG. 4, illustrations of the bottom of the magnet, the insulating layers, and the semiconductor layers 101 and 102 are omitted.

As shown in FIG. 4, the source line SL includes electrode portions SLa extending in the X direction and a plurality of rectangular protrusions SLb provided on two side faces of each electrode portion SLa facing the Y direction. The plurality of protrusions SLb provided on the two side faces are arranged, for example, in a staggered fashion toward the X direction.

The bottom of the magnet (not shown) is provided on each protrusion SLb. Each memory pillar MP is provided on two sides of the protrusion SLb facing the X direction and a side of the protrusion SLb facing the Y direction opposing an electrode portion SLa. A terrace HD is provided on each memory pillar MP. The terrace HD includes a first portion HDa in which the magnet is drawn in the Y direction, and a second portion HDb and a third portion HDc in which the magnet is drawn in the X direction. One end of the second portion HDb and one end of the third portion HDc are coupled to both ends of the first portion HDa of the terrace HD. In other words, the terrace HD has a U character shape facing the electrode portion SLa of the source line SL.

A field line FL extending in the X direction is provided above the electrode portion SLa of the source line.

MTJ element is provided on the terrace HD. A plurality of the MTJ elements corresponding to one source line SL are respectively coupled to different bit lines BL via switching elements SW (not shown). A plurality of MTJ elements that are arranged respectively corresponding to a plurality of source lines SL along the Y direction are coupled in common to one bit line BL. The bit lines BL are provided extending in the Y direction above field lines FL.

1.1.5 Configuration of Memory Pillar

Figure 7:
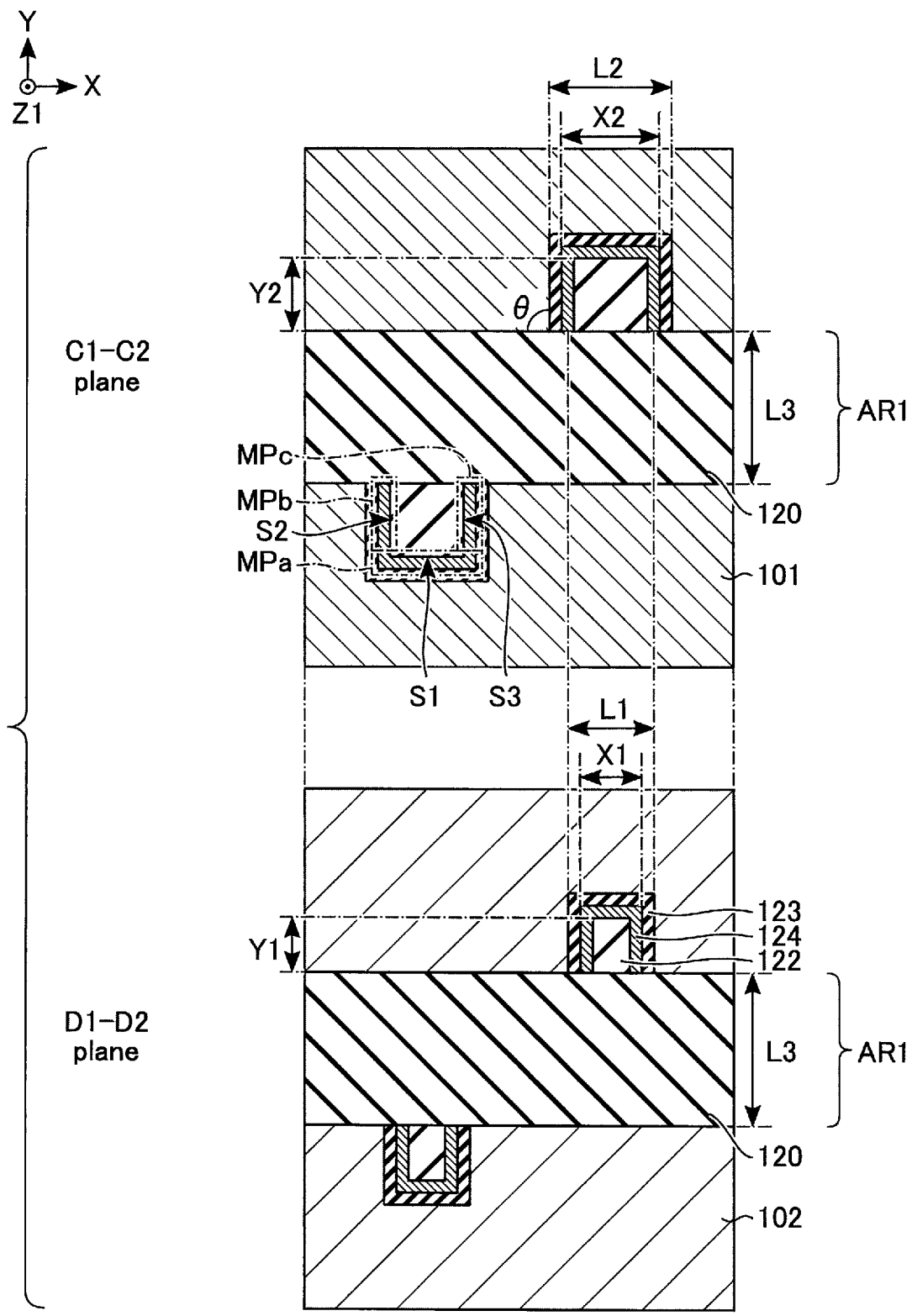
FIG. 7 is plan views along a C1-C2 line and along a D1-D2 line in FIGS. 5 and 6.

Next, the details of the configuration of the memory pillar MP will be described with reference to FIGS. 5 to 7. FIG. 5 is a cross-sectional view along an A1-A2 line in FIG. 4. FIG. 6 is a cross-sectional view along a B1-B2 line in FIG. 4. FIG. 7 is plan views along a C1-C2 line and a D1-D2 line in FIG. 5. Hereinafter, a plan view along the C1-C2 line is referred to as a "C1-C2 plane" and a plan view along the D1-D2 line is referred to as a "D1-D2 plane".

As shown in FIG. 5, an interconnect layer 121 extending in the X direction is provided on the insulating layer 103. The interconnect layer 121 functions as a source line SL. The interconnect layer 121 is a stacked body in which, for example, a catalyst layer 121a and a conductive layer 121b are stacked. The insulating layer 103 is formed so as to conformally cover the bottom face and side faces of the interconnect layer 121. Therefore, the insulating layer 103 has a shape protruding to the bottom so as to correspond to the shape of the source line SL, and is not flat in the XY plane.

For the catalyst layer 121a, a catalyst material corresponding to metal-assisted chemical etching (MaCE) using a metal catalyst to be described later is used. For the catalyst layer 121a, for example, a material having a relatively high oxidation-reduction potential such as gold (Au), platinum (Pt), silver (Ag), palladium (Pd), or the like, is used. The catalyst material can be formed by using sputtering, chemical vapor deposition (CVD), plating, or the like. The catalyst layer 121a is not limited to a layer having a single composition or a single layer and may have a composition containing a plurality of elements or may be layered in a plurality of layers. As the catalyst material, a carbon material such as graphene may be used, and a metal material containing graphene, etc., may be used. In the following description, a case where Au is used for the catalyst layer 121a will be described.

For the conductive layer 121b, for example, ruthenium (Ru), Pt, etc., formed using CVD, electroless plating, or the like, is used.

In the Z1 direction, for example, nine semiconductor layers 102 and eight semiconductor layers 101 are alternately stacked on the insulating layer 103. An insulating layer 106 is provided on the uppermost layer of the semiconductor layers 102.

Areas AR1 and AR2 are provided on the interconnect layer 121 (conductive layer 121b). The area AR1 is an area in which the bottom penetrates through (passes through) the nine semiconductor layers 102 and the eight semiconductor layers 101 and reaches the electrode portion SLa of the source line SL. The area AR2 is an area in which the bottom penetrates through (passes through) the nine semiconductor layers 102 and the eight semiconductor layers 101 and reaches the protrusion SLb of the source line SL.

As shown in FIGS. 5 and 6, a magnet 124 is provided on the bottom face and the side face of the area AR2 and the uppermost layer of the semiconductor layers 102. The magnet 124 includes a bottom BB, a memory pillar MP, and a terrace HD. The bottom BB is provided on the protrusion SLb of the source line SL, i.e., the conductive layer 121b corresponding to the area AR2. The memory pillar MP is provided on two side faces of the area AR2 facing the X direction and the side face opposing the area AR1 and facing the Y direction. The lower end of the memory pillar MP comes into contact with the bottom BB. The terrace HD includes a flat portion extending to the XY plane above the uppermost layer of the semiconductor layers 102 and a curved portion that curves from the XY plane in the Z direction to be coupled to the upper end of the memory pillar MP.

An insulating layer 123 is provided between the memory pillar MP and the terrace HD, and between the semiconductor layers 101 and 102. With this configuration, the magnet 124 and the semiconductor layers 101 and 102 are electrically uncoupled to each other.

The memory pillar MP (magnet 124) has a protrusion TS provided on the same layers as the semiconductor layers 101 on a side face of the area AR2. In other words, the memory pillar MP (magnet 124) has a narrow portion KB provided on the same layers as the semiconductor layers 102 on the side face of the area AR2. One magnetic domain is provided corresponding to one protrusion TS. That is, one protrusion TS corresponds to one memory cell MC. Therefore, the narrow portion KB corresponds to a domain wall DW of the memory string MS.

The magnet 124 is a ferromagnet composed of a multilayered film containing, for example, cobalt (Co), nickel (Ni), or the like. As a material of the magnet 124, an alloy containing elements selected from iron (Fe), Co, Pt, Pd, magnesium (Mg), and rare earth elements may be used in addition to Co and Ni. For the insulating layer 123, for example, $SiO_2$ is used. It should be noted that a conductor (non-magnetic metal) capable of generating a spin orbit torque (SOT) in the magnet 124 may be provided to at least a portion between the insulating layer 123 and the magnet 124. In this case, for the non-magnetic metal, for example, hafnium (Hf), tantalum (Ta), W, rhenium (Re), osmium (Os), iridium (Ir), Pt, Au, and the like, are used.

As shown in FIG. 5, the area AR1 is filled with the insulating layer 120. For the insulating layer 120, for example, $SiO_2$ is used. In the upper portion of the area AR1, an interconnect layer 125 extending in the X direction and functioning as a field line FL is provided in the insulating layer 120. Writing of data is performed using a dielectric magnetic field generated by making a current flow through the field line FL. Data is written in the magnet 124 arranged in the vicinity of the field line FL. Therefore, the field line FL is arranged in a range in which data is writable in the magnet 124 by a dielectric magnetic field.

In the area AR2, the inside portion surrounded by the memory pillar MP and the bottom BB is filled with the insulating layer 122. One side face of the insulating layer 122 is in contact with a portion of the side face of the insulating layer 120 facing the Y direction. The memory pillar MP is provided between three side faces of the insulating layer 122 and the semiconductor layers 101 and 102. One side face of the memory pillar MP is in contact with the insulating layer 122, and the other side face of the memory pillar MP is in contact with the insulating layer 123. For the insulating layer 122, for example, $SiO_2$ is used.

Anon-magnet 126 and a magnet 127 are stacked on a portion of the magnet 124 in the terrace HD. MTJ elements are composed of the portion of the magnet 124, and the non-magnet 126 and magnet 127 provided on the magnet 124. The direction of the magnetization of the magnet 127 is fixed, and the magnet 127 functions as a reference layer. The non-magnet 126 functions as a tunnel barrier layer. The magnet 124 functions as a storage layer, and the resistance value of the MTJ elements changes according to the direction of magnetization of the magnet 124. For example, when the direction of magnetization of the magnet 124 (storage layer) is non-parallel with the direction of magnetization of the magnet 127 (reference layer), the MTJ elements enter a high resistance state. On the other hand, when the direction of magnetization of the magnet 124 (storage layer) is parallel with the direction of magnetization of the magnet 127 (reference layer), the MTJ elements enter a low resistance state. For example, the high resistance state is assigned to "1" data, and the low resistance state is assigned to "0" data.

The magnet 127 is, for example, a ferromagnet composed of a multilayered film containing, for example, Co, Ni, or the like. In addition, as a material of the magnet 127, an alloy containing elements selected from Fe, Co, Pt, Pd, Mg, and rare earth elements may be used in addition to Co and Ni.

The non-magnet 126 is a non-magnetic insulating film, and for example, magnesium oxide (MgO) may be used therefor.

A switching element SW is provided on the magnet 127. An interconnect layer 111 extending in the Y direction and functioning as a bit line BL is provided on the switching element SW.

Next, the planar configuration of the memory pillar MP will be described.

As shown in FIG. 7, the C1-C2 plane shows a plan view in the protrusion TS of the memory pillar MP, and the D1-D2 plane shows a plan view in the narrow portion KB of the memory pillar MP.

The memory pillar MP has a U character shape facing the area AR1 in the C1-C2 plane and the D1-D2 plane. It should be noted that the memory pillar MP may have an arc shape as long as one side face of the memory pillar MP is in contact with the area AR1 (insulating layer 120). The insulating layer 123 and the magnet 124 are stacked between three side faces of the insulating layer 122 and the semiconductor layers 101 and 102. More specifically, the memory pillar MP includes a first portion MPa extending in the X direction and a second portion MPb and a third portion MPc which are extending in the Y direction. The first portion MPa is in contact with a side face S1 of the insulating layer 122 facing the Y direction, and the second portion MPb and the third portion MPc are in contact with two side faces S2 and S3 of the insulating layer 122 facing the X direction, respectively. One end of the second portion MPb and one end of the third portion MPc are coupled to both ends of the first portion MPa. The other end of the second portion MPb and the other end of the third portion MPc are in contact with the side face of the insulating layer 120 facing the Y direction.

The first portion MPa, the second portion MPb, and the third portion MPc are respectively magnetic thin wire. Here, the magnetic thin wire means a magnet with a width of the wire (a length of the wire along the insulating layer 122) being 10 times or more the thickness of the wire (a distance between the insulating layer 122 and the insulating layer 123) in a cross-section of the XY plane of the magnet 124. For example, the length of the first portion MPa in the X direction is 10 times or more the length the first portion MPa in the Y direction.

The memory pillar MP, i.e., the magnetic thin wire, has a surge attributable to the protrusions TS and the narrow portions KB. In this case, the surge indicates a change in periodic shape.

More specifically, a length X1 of the first portion MPa in the X direction in the D1-D2 plane is shorter than a length X2 of the first portion MPa in the X direction in the C1-C2 plane. Therefore, in the film thickness of the first portion MPa in the X direction, the length X1 and the length X2 are alternately repeated toward the Z direction. Similarly, the lengths of the second portion MPb and the third portion MPc in the Y direction in the D1-D2 plane are shorter than the lengths of the second portion MPb and the third portion MPc in the Y direction in the C1-C2 plane. In other words, each magnetic thin wire of the first portion MPa, second portion MPb, and third portion MPc has a surge in the wire width direction.

In addition, a distance Y1 between the first portion MPa and the insulating layer 120 in the D1-D2 plane is shorter than a distance Y2 between the first portion MPa and the insulating layer 120 in the C1-C2 plane. Similarly, the distance between the second portion MPb and the third portion MPc in the C1-C2 plane is longer than the distance between the second portion MPb and the third portion MPc in the D1-D2 plane. Therefore, each magnetic thin wire of the first portion MPa, the second portion MPb, and the third portion MPc has a surge in the film surface (film thickness) direction (e.g., in the case of the first portion MPa, Y direction).

An area surrounded by the first portion MPa, the second portion MPb, and the third portion MPc is filled with the insulating layer 122.

The insulating layer 123 provided between the magnet 124 and the semiconductor layers 101 and 102 has a U character shape facing the area AR1 in the C1-C2 plane and the D1-D2 plane, similarly to the magnet 124.

For example, when the length of the insulating layer 123 in the X direction (the length of the area AR2 in the X direction) in the D1-D2 plane is denoted by L1, and the length of the insulating layer 123 in the X direction in the C1-C2 plane is denoted by L2, there is a relationship of L1<L2. An area of a difference between L2 and L1 corresponds to the protrusion TS.

In addition, when the length of the area AR1 in the Y direction is denoted by L3, there is a relationship of L1<L3. The relationship is attributable to the manufacturing process of the memory cell array 10. The manufacturing process of the memory cell array 10 will be described later.

It is preferable that an angle θ at which the side face of the memory pillar MP facing the X direction intersects with the side face of the area AR1 (insulating layer 120) facing the Y direction be substantially 90°. For example, if the etching amount of magnet 124, etc. varies when the magnet 124, etc., is etched from the area AR1 side, the side face of the memory pillar MP may be degenerated from the face where the area AR1 and the area AR2 are in contact with each other toward the inside of the area AR2. At this time, if the angle θ is larger than 90°, the length L1 is reduced by the degeneration, and the size of the memory transistor MC is reduced. If the angle θ is smaller than 90°, a slit extending in the Z direction is formed in the memory pillar MP when the inside of the memory pillar MP is filled with the insulating layer 122, causing shape defects.

1.2 Manufacturing Process of Magnetic Memory Device

1.2.1 Manufacturing Process of Memory Pillar

Next, an example of the manufacturing process of the memory pillar MP will be described with reference to FIGS. 8 to 22. FIGS. 8 to 22 respectively show a plan view of the memory cell array 10 and a cross-section of the memory cell array 10 along an A1-A2 line (referred to as an "A1-A2 cross-section").

In the following description, a case of using MaCE for etching the areas AR1 and AR2 will be described. For example, in the MaCE, when wet etching of a semiconductor is performed in a state where a metal to become a catalyst is formed on the semiconductor, the semiconductor is preferentially etched at the interface between the semiconductor and the metallic catalyst layer. The catalyst layer precipitates in the etched semiconductor, thereby allowing anisotropic etching.

For the semiconductor layers 101 and 102, two types of semiconductor material layers allowing for MaCE are used. The semiconductor materials can be selected from, for example, Group IV elements Si, Ge, or C, etc. The semiconductor materials may be two types of Si which are different in, for example, impurity species and impurity concentration by containing Group III elements B or Al, etc., or Group V elements P or As, etc., as impurities. In addition, these two types of materials may be Group III-V semiconductors GaAs, AlAs, AlGaAs, InP, InAs, InGaAs, InN, InGaN, GaAlN, AlN, BN, AlBN, or the like, or Group II-VI semiconductors ZnO, ZnS, or the like, or InGaZnO, which is a mixture thereof. In the following description, a case where Si is used for the semiconductor layers 101 and SiGe is used for the semiconductor layers 102 will be described. If the Ge concentration is higher, use of SiGe is likely to cause side etching (spreading in the XY plane) of a SiGe layer at the time of MaCE. Therefore, the Ge concentration of SiGe is preferably 10 to 20%.

In the preset embodiment, as a wet etching solution of MaCE, for example, a mixed liquid of hydrofluoric acid (HF) and hydrogen peroxide water ($H_2O_2$) is used.

Figure 8:
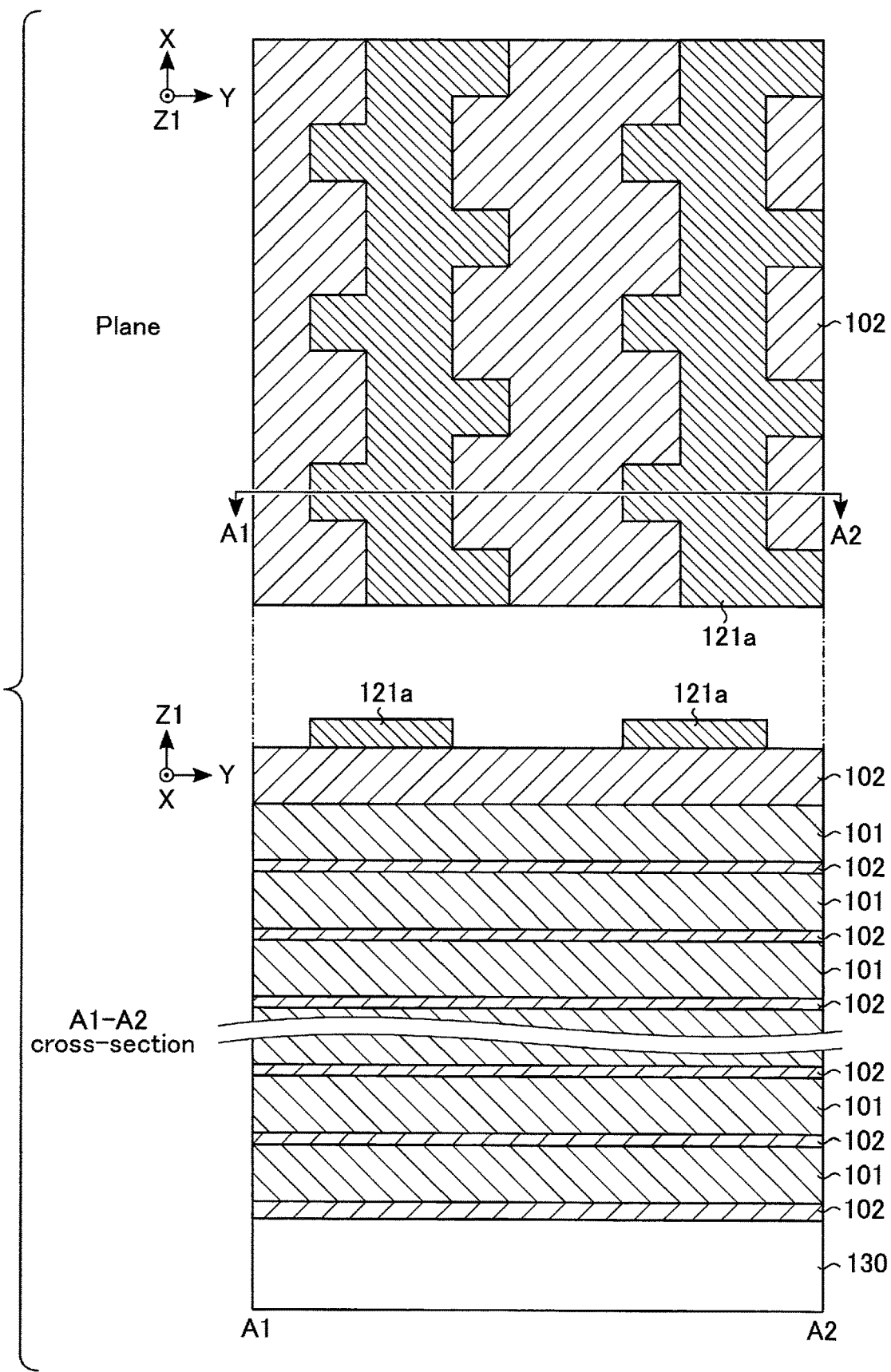

As shown in FIG. 8, for example, nine semiconductor layers 102 and eight semiconductor layers 101 are alternately stacked on a semiconductor substrate 130. The film thicknesses of the semiconductor layers 101 and 102 are discretionarily set. In the present embodiment, since the semiconductor layers 102 for eight layers from the bottom correspond to the narrow portions KB in the memory pillar MP, these layers preferably have a thinner film thickness than that of the semiconductor layers 101 corresponding to the protrusion TS. For the film thickness of the uppermost layer of the semiconductor layers 102, it suffices that a film thickness which is sufficient for forming a curved portion of the magnet 124 (terrace HD) can be ensured.

Next, areas AR1 and AR2, i.e., a catalyst layer 121a corresponding to an electrode portion SLa and a protrusion SLb of a source line SL is formed on the uppermost layer of the semiconductor layers 102.

Figure 9:
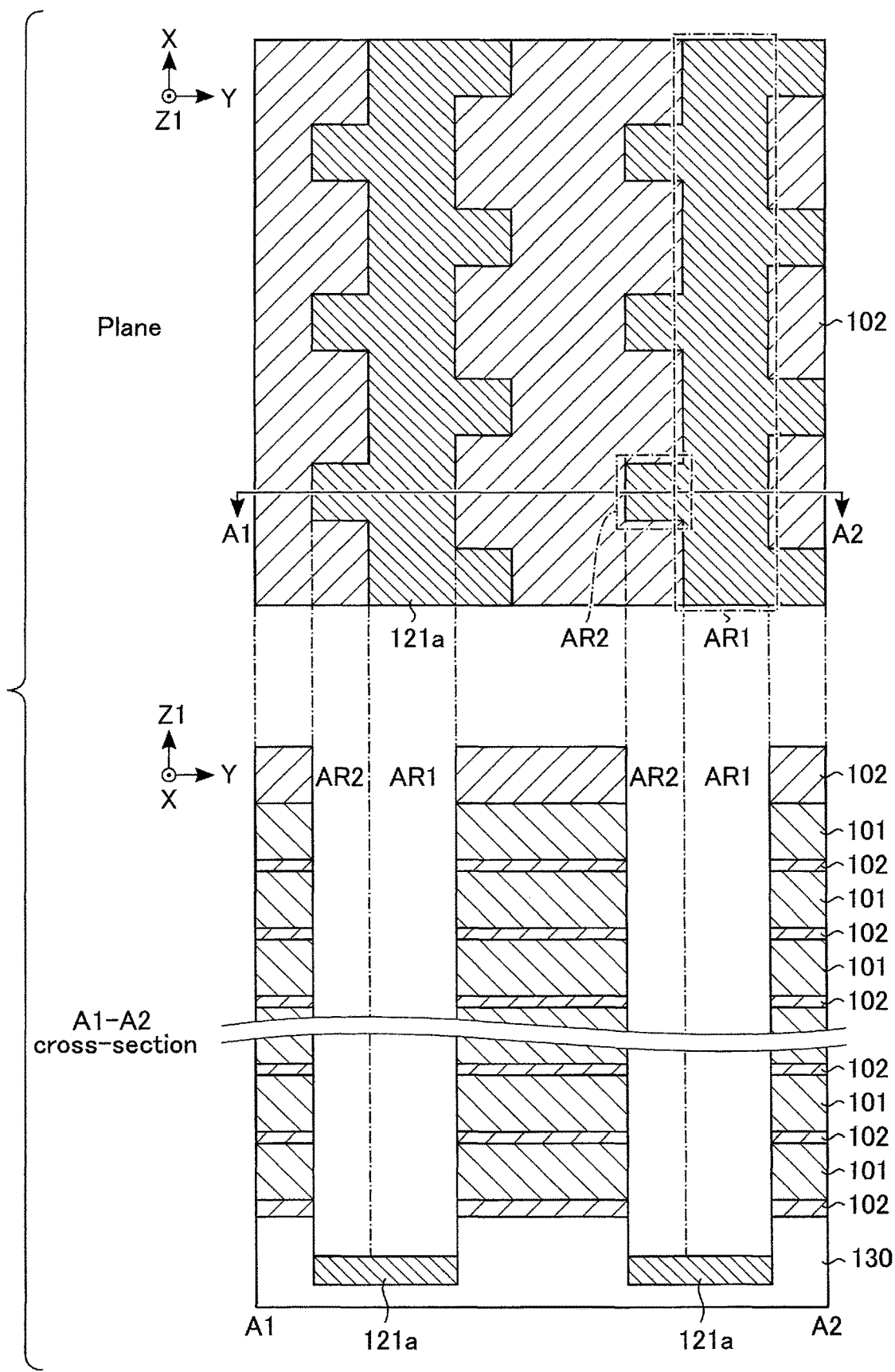

As shown in FIG. 9, the semiconductor layers 101 and the semiconductor layers 102 are etched by MaCE to form slits corresponding to the areas AR1 and AR2. The bottoms of the slits reach the semiconductor substrate 130. The catalyst layer 121a remains on the bottoms of the slits. The vertical position of the bottoms of the slits may vary for each pattern if the bottoms are present within the semiconductor substrate 130.

More specifically, in the MaCE process, a wafer prepared by forming the catalyst layer 121a and a stacked body composed of the semiconductor layers 101 and semiconductor layers 102 is dipped in an etching solution. As the etching solution, for example, a mixed liquid of hydrofluoric acid and hydrogen peroxide water can be used. When the wafer is immersed in the etching solution, the semiconductor layers 101 and 102 are dissolved in the etching solution at the interfaces of the semiconductor layer surface, the catalyst layer, and the etching solution. The reaction is repeated in the surface of the stacked body. As a result, the semiconductor layers 101 and 102 are etched vertically. This process step allows formation of the slits corresponding to the areas AR1 and AR2. The shapes (e.g., the depths of grooves) of the areas AR1 and AR2 are controlled by adjusting the size of the catalyst layer 121a, the etching time, etc.

Figure 10:
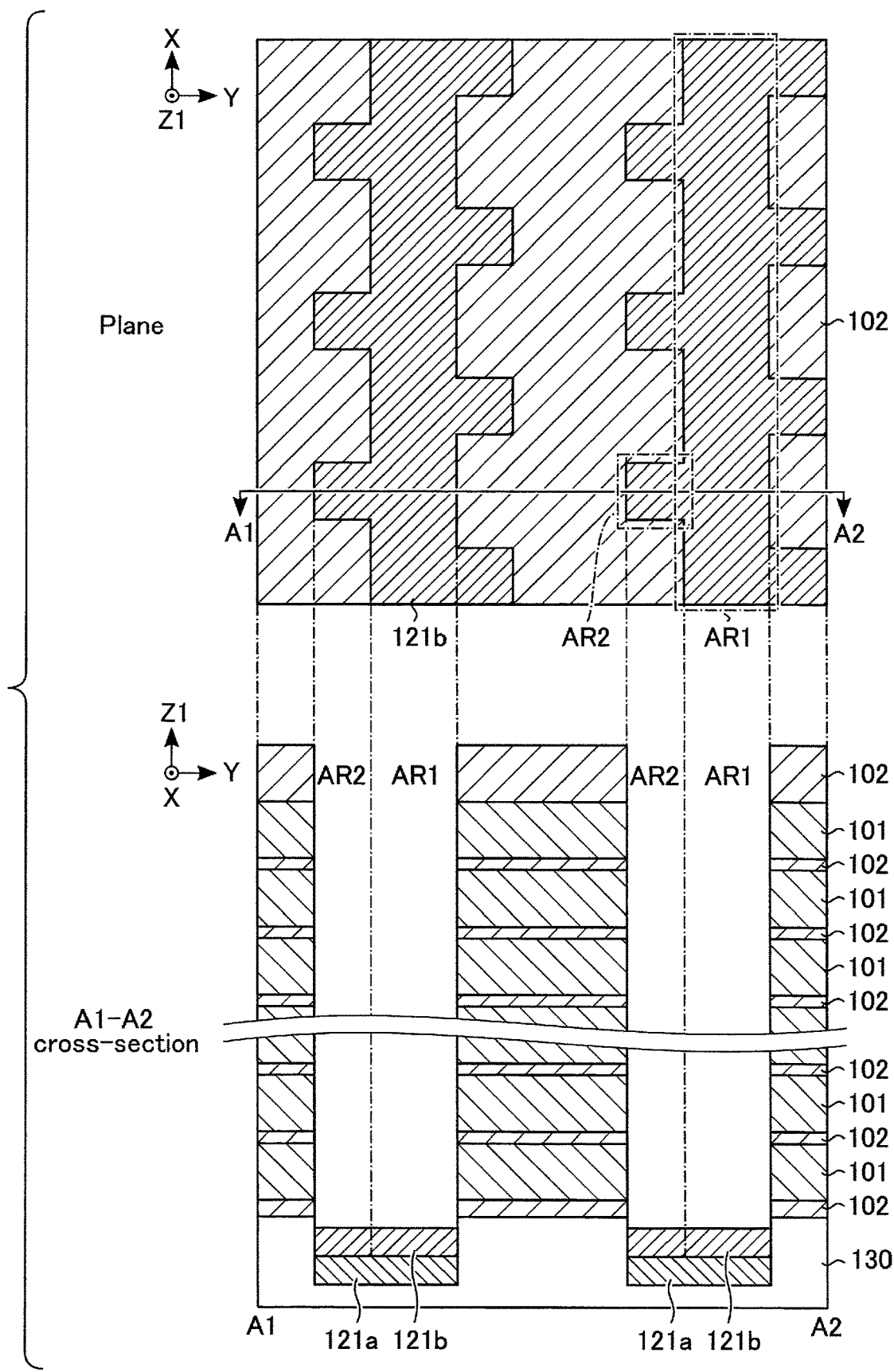

As shown in FIG. 10, a conductive layer 121b is formed on the catalyst layer 121a by a selective growth using CVD, electroless plating, or the like.

Figure 11:
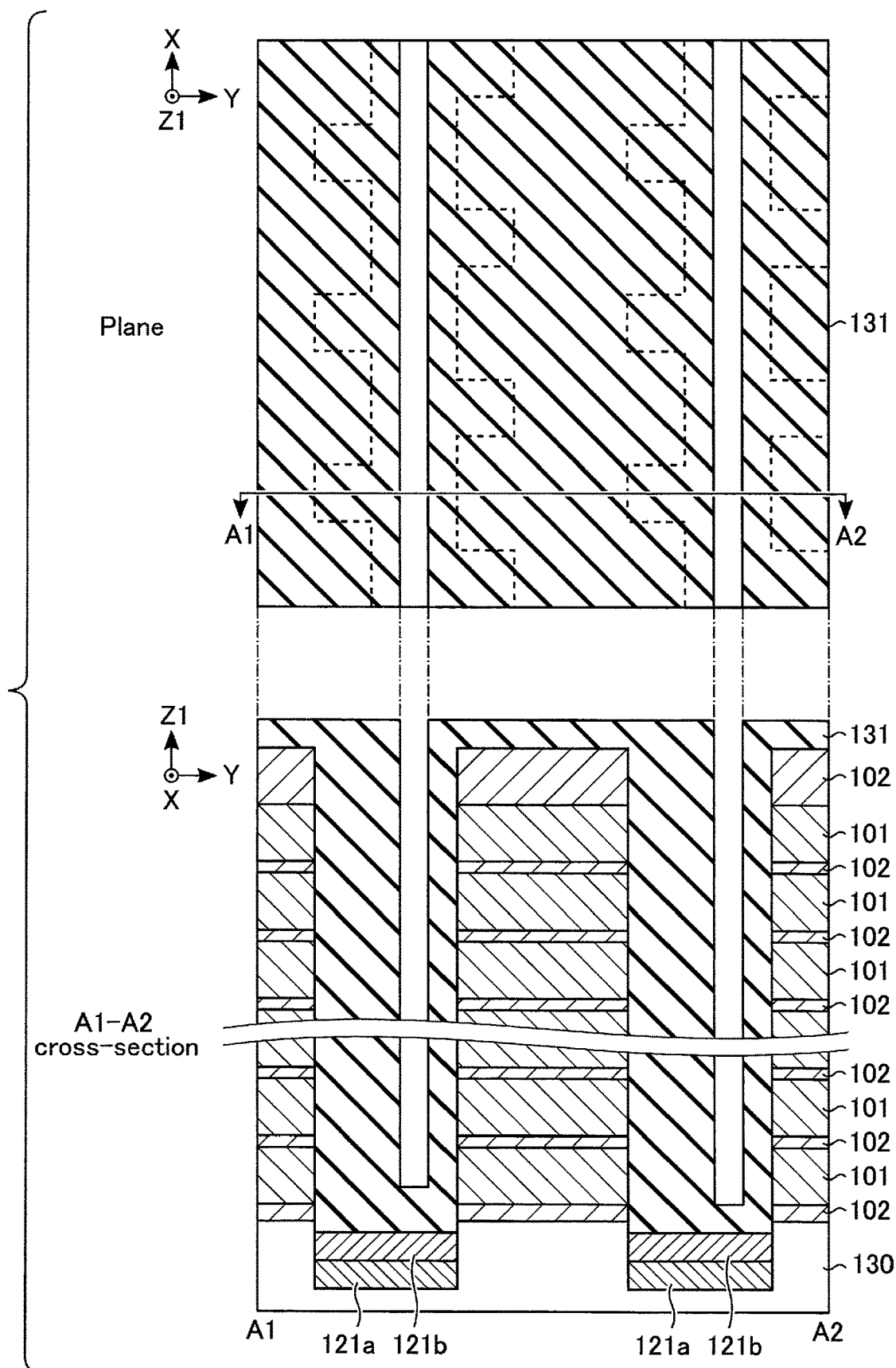

As shown in FIG. 11, an insulating layer 131 having a film thickness that fills the area AR1 and does not fill the area AR2 is formed. At this time, the film thickness of the insulating layer 131 is made thicker than (L1)/2 and thinner than (L3)/2. For the insulating layer 131, for example, SiN is used.

Figure 12:
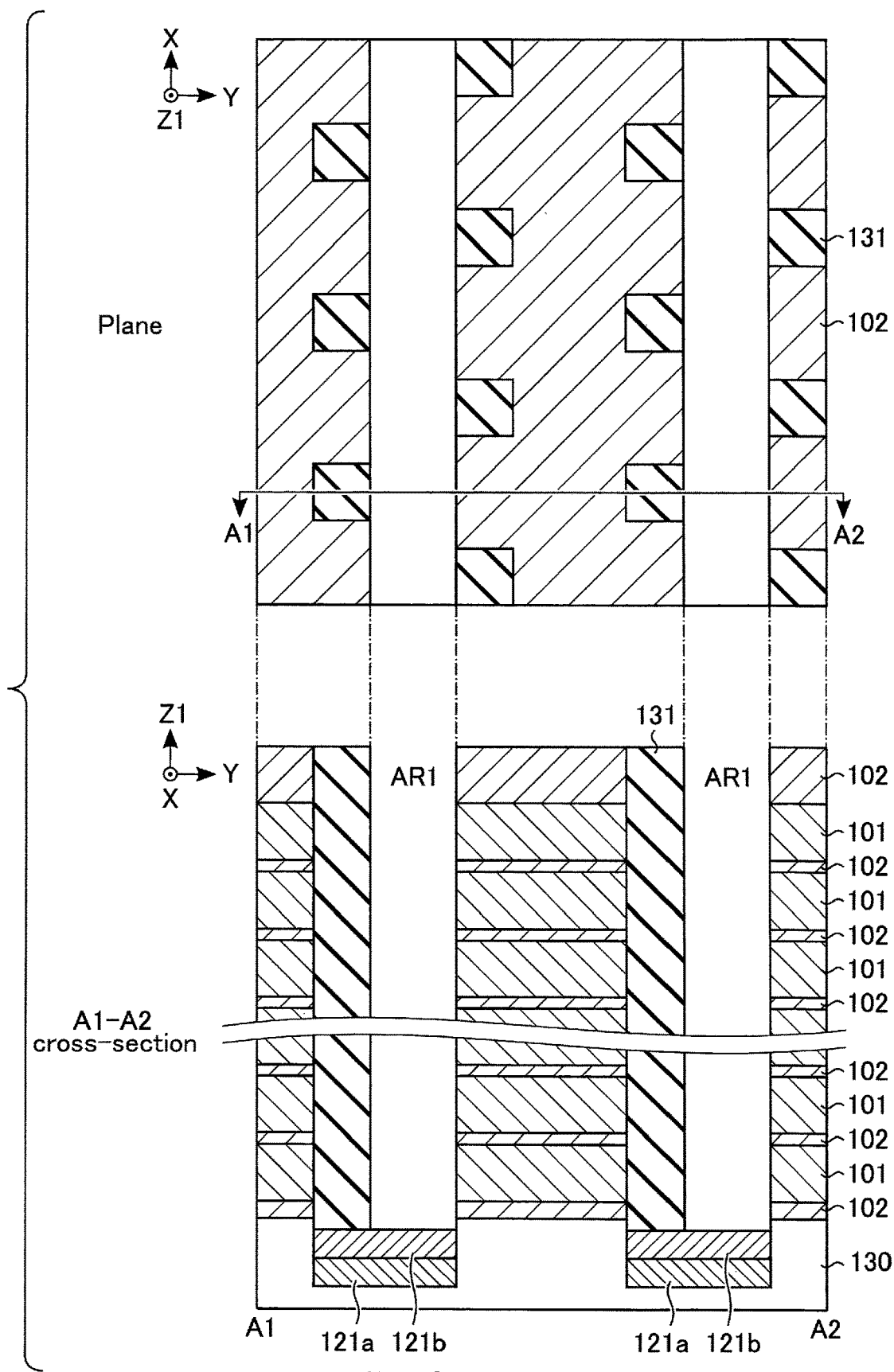

As shown in FIG. 12, the insulating layer 131 on the uppermost layer of the semiconductor layers 102 and the insulating layer 131 in the area AR1 are removed, for example, by isotropic etching using wet etching. At this time, the insulating layer 131 remains in the area AR2.

Figure 13:
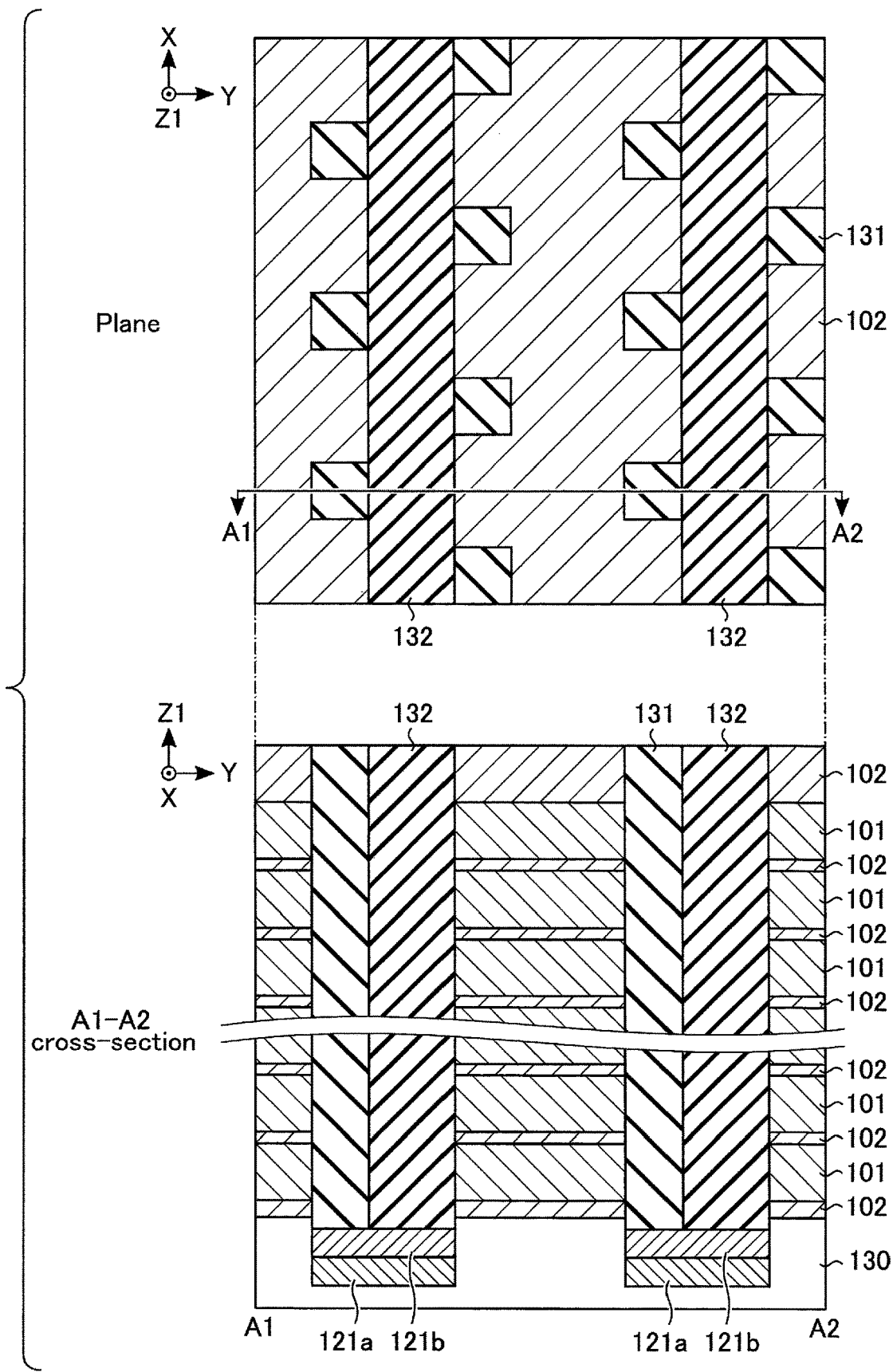

As shown in FIG. 13, an insulating layer 132 is formed to fill the area AR1 with the insulating layer 132. Next, the insulating layer 132 on the uppermost layer of the semiconductor layers 102 is removed, for example, by chemical mechanical polishing (CMP). For the insulating layer 132, for example, $SiO_2$ is used.

Figure 14:
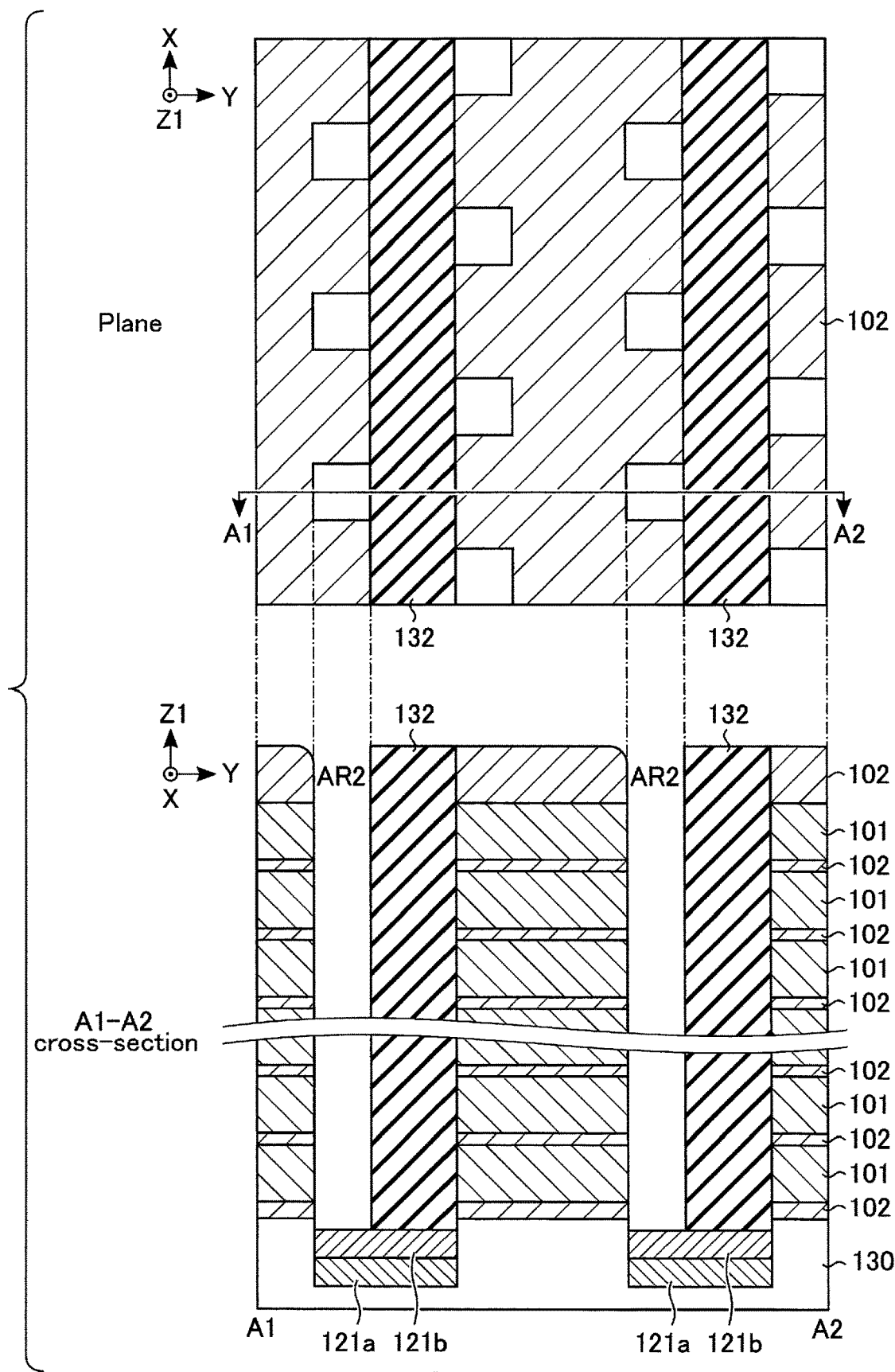

As shown in FIG. 14, the insulating layer 131 in the area AR2 is removed, for example, by wet etching. Next, in the area AR2, a corner of the uppermost layer of the semiconductor layers 102 is rounded, for example, by dry etching.

Figure 15:
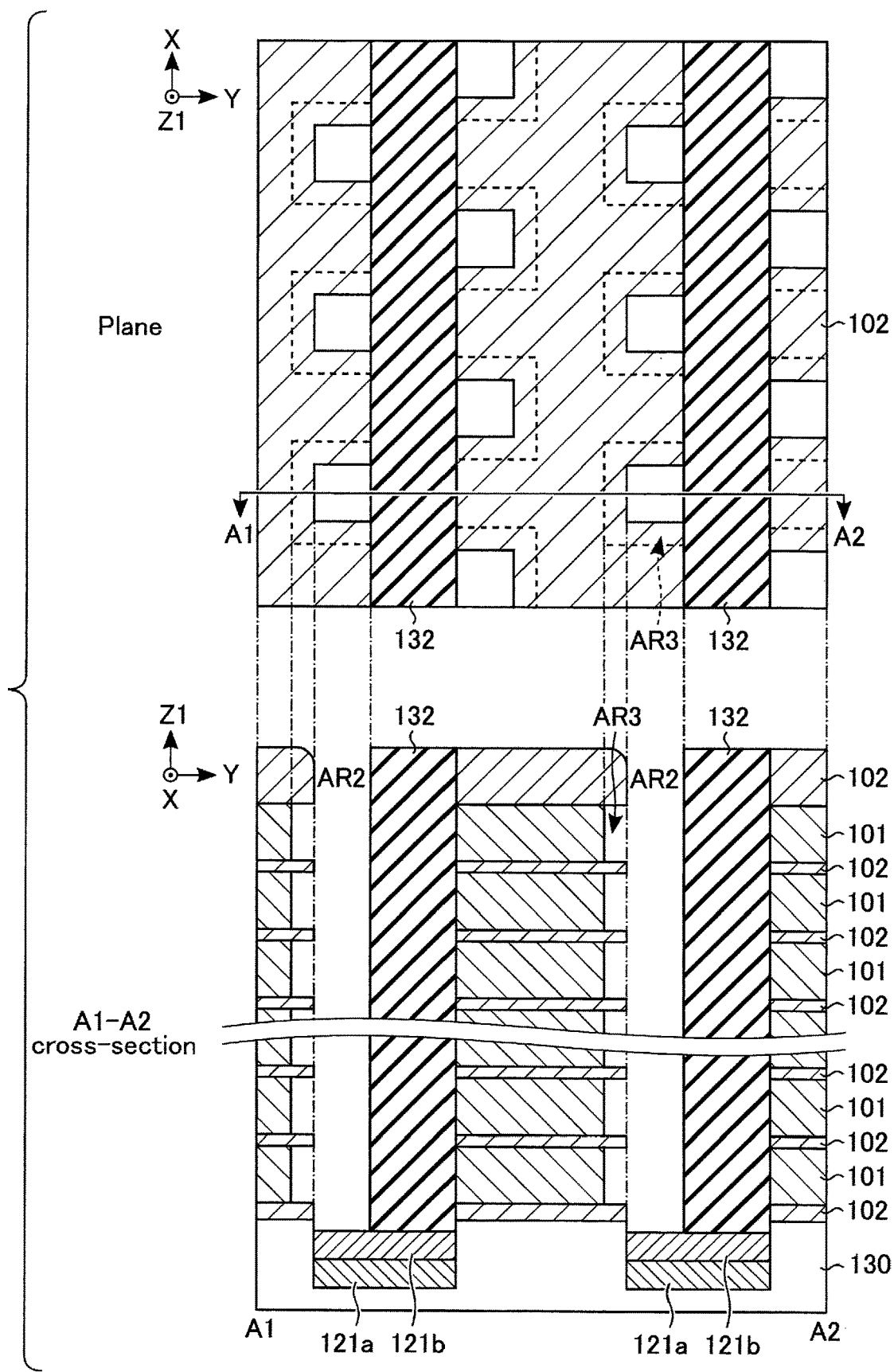

As shown in FIG. 15, the semiconductor layers 101 are etched, for example, by wet etching, from the side face of the area AR2 to form an area AR3. The area AR3 corresponds to a protrusion TS.

Figure 16:
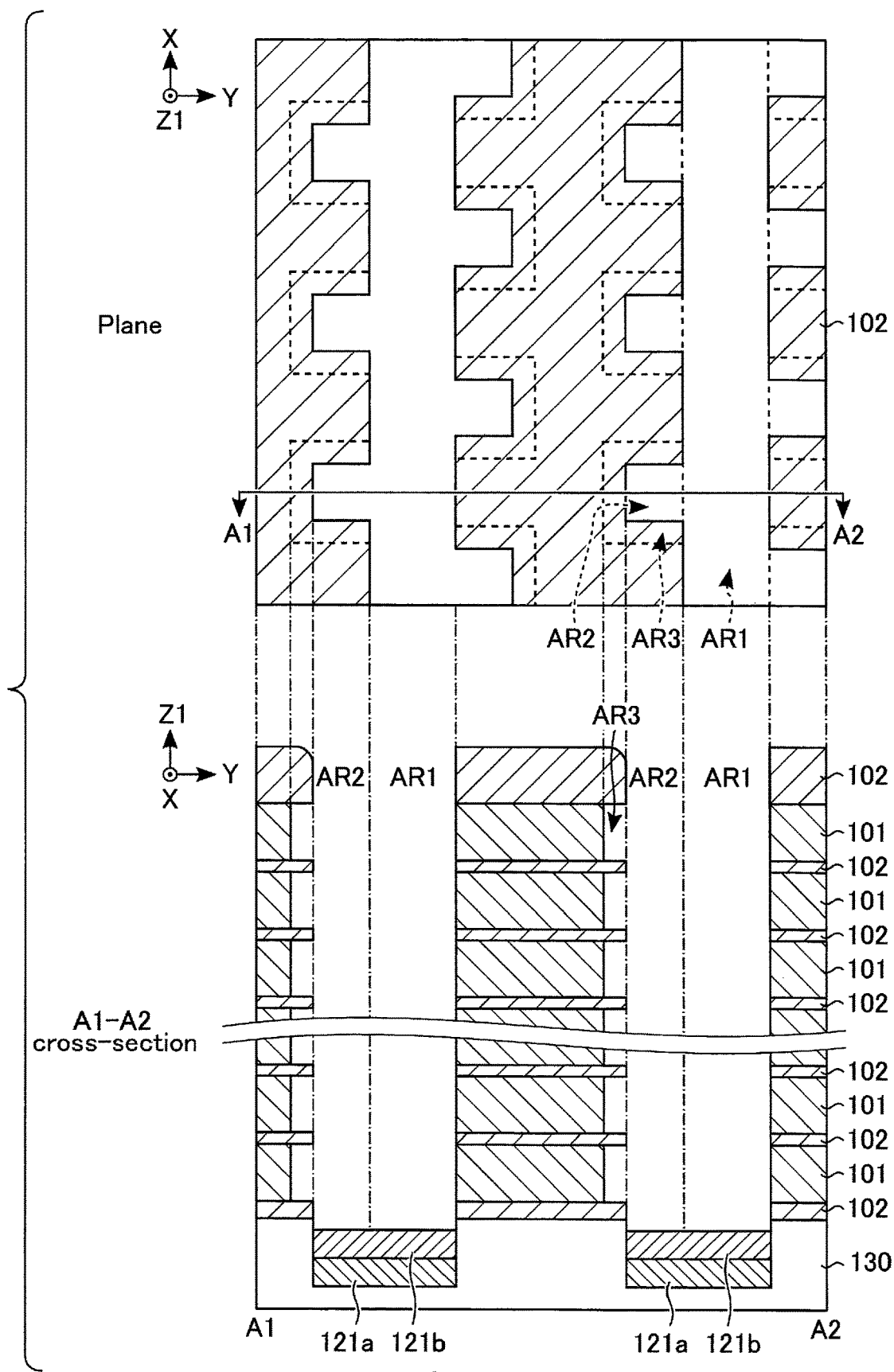

As shown in FIG. 16, the insulating layer 132 in the area AR1 is removed, for example, by wet etching.

As shown in FIG. 17, an insulating layer 123 is formed, for example, by surface oxidization of the semiconductor substrate 130, and the semiconductor layers 101 and 102. It should be noted that the insulating layer 123 may be formed, for example, by CVD. Next, a magnet 124 having a film thickness that does not fill the area AR3 is formed. Next, an insulating layer 122 having a film thickness that fills the area AR2 and does not fill the area AR1 is formed. Next, a mask pattern of a resist 133 is formed on the area AR2 and the terrace HD by photolithography.

Figure 18:
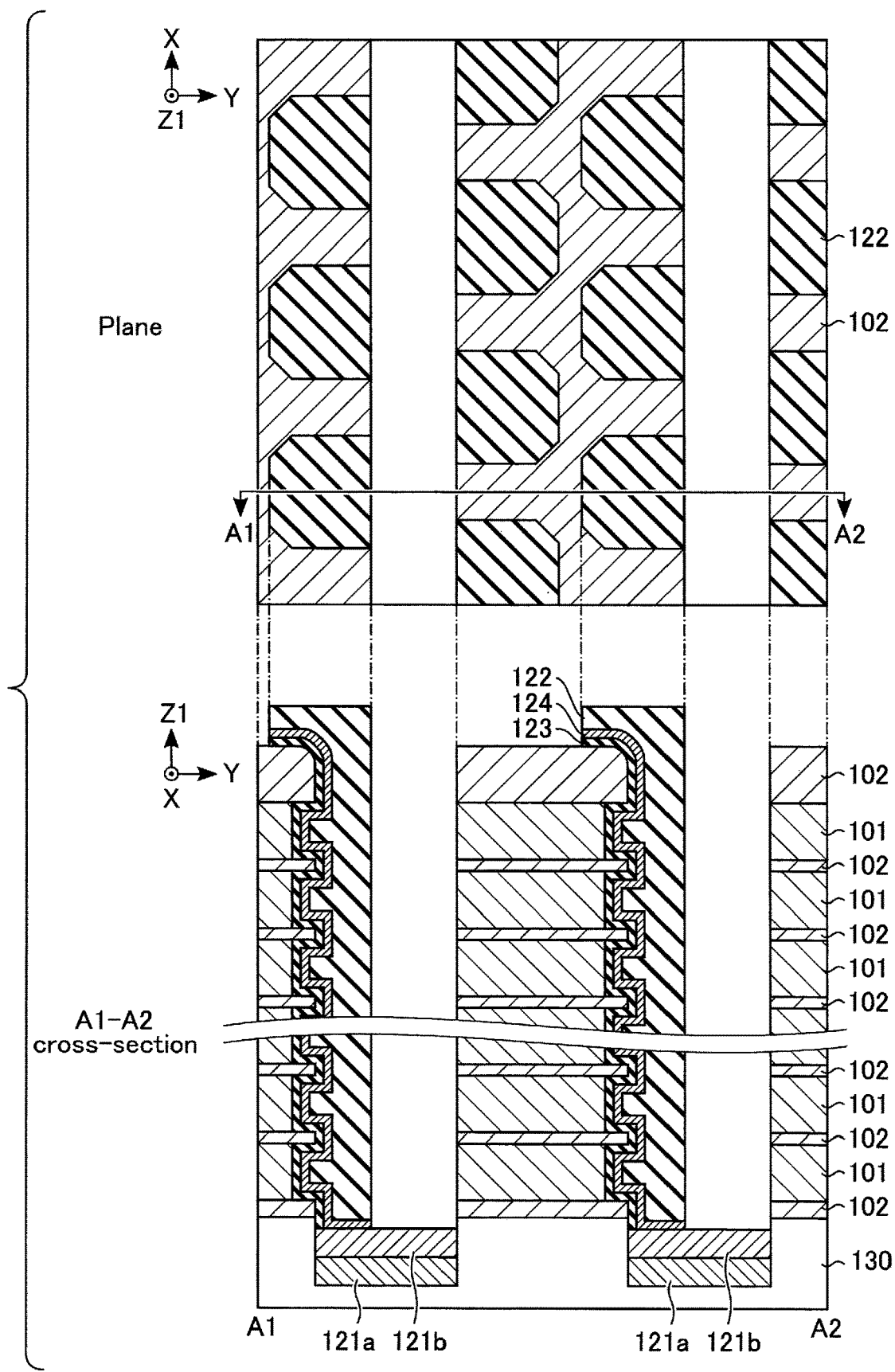

As shown in FIG. 18, the insulating layer 122, the magnet 124, and the insulating layer 123 are etched by reactive ion etching (RIE). Next, the resist 133 is peeled off. Through this process step, the insulating layer 122, magnet 124, and insulating layer 123 other than those in the areas corresponding to the area AR2 and the terrace HD are removed.

Figure 19:
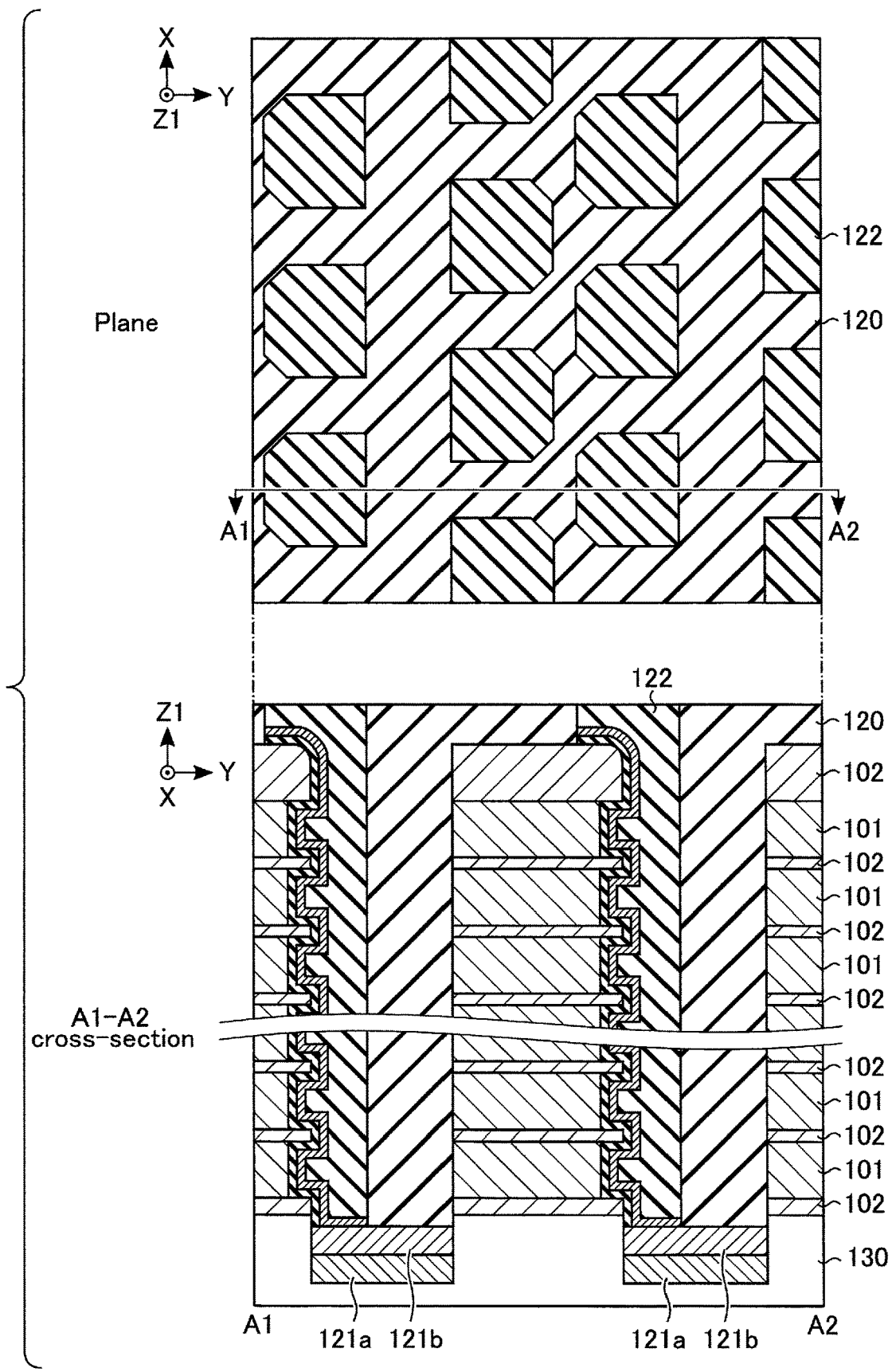

As shown in FIG. 19, an insulating layer 120 is formed. Next, the surface of the insulating layer 120 is planarized, for example, by CMP.

Figure 20:
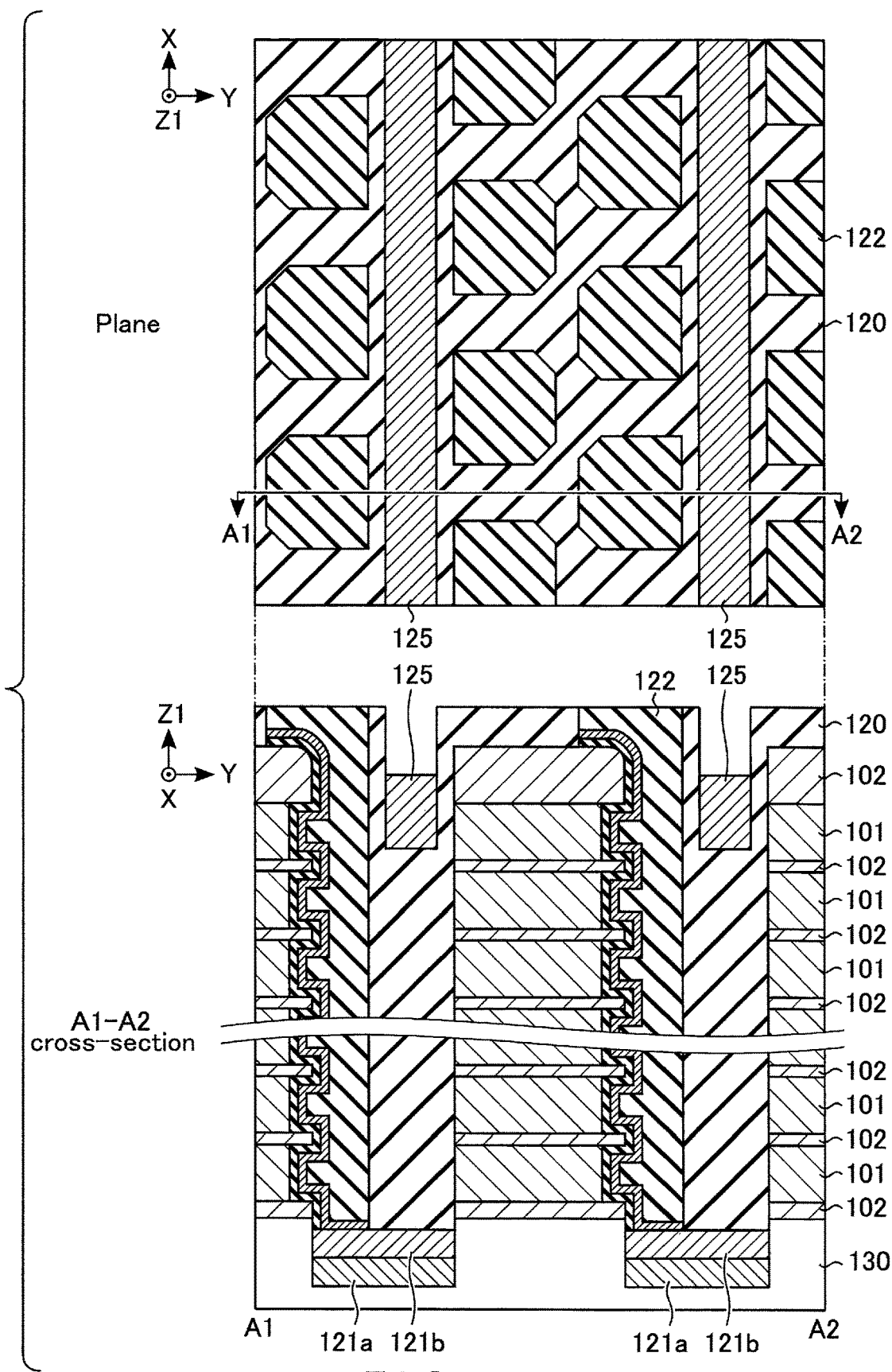

As shown in FIG. 20, a groove pattern corresponding to a field line FL is formed in the insulating layer 120. Next, the inside of the groove pattern is filled with an interconnect layer 125. Next, the interconnect layer 125 formed on the insulating layers 120 and 122 is removed, for example, by wet etching. At this time, the top surface of the interconnect layer 125 is made lower than the top surface of the insulating layer 120 by over etching.

Figure 21:
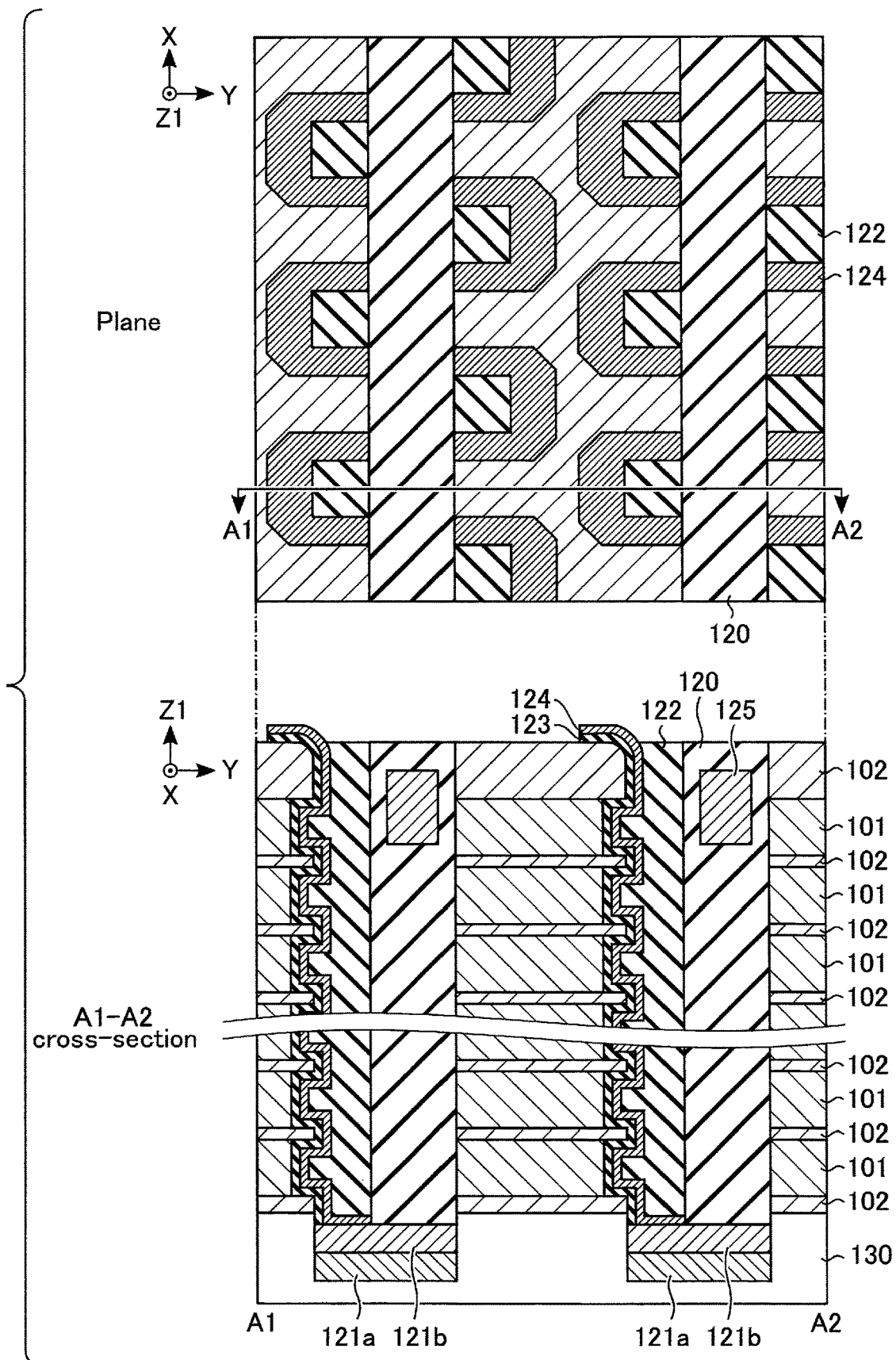

As shown in FIG. 21, an insulating layer 120 is formed to fill the groove on the interconnect layer 125. Next, the insulating layer 120 is planarized, for example, by CMP. Next, the insulating layers 120 and 122 are etched until the top surface of the magnet 124 is exposed. In the example of FIG. 21, the insulating layers 120 and 122 are etched until the surface of the uppermost layer of the semiconductor layers 102 is exposed; however, the surface of the semiconductor layers 102 may not be exposed.

Figure 22:
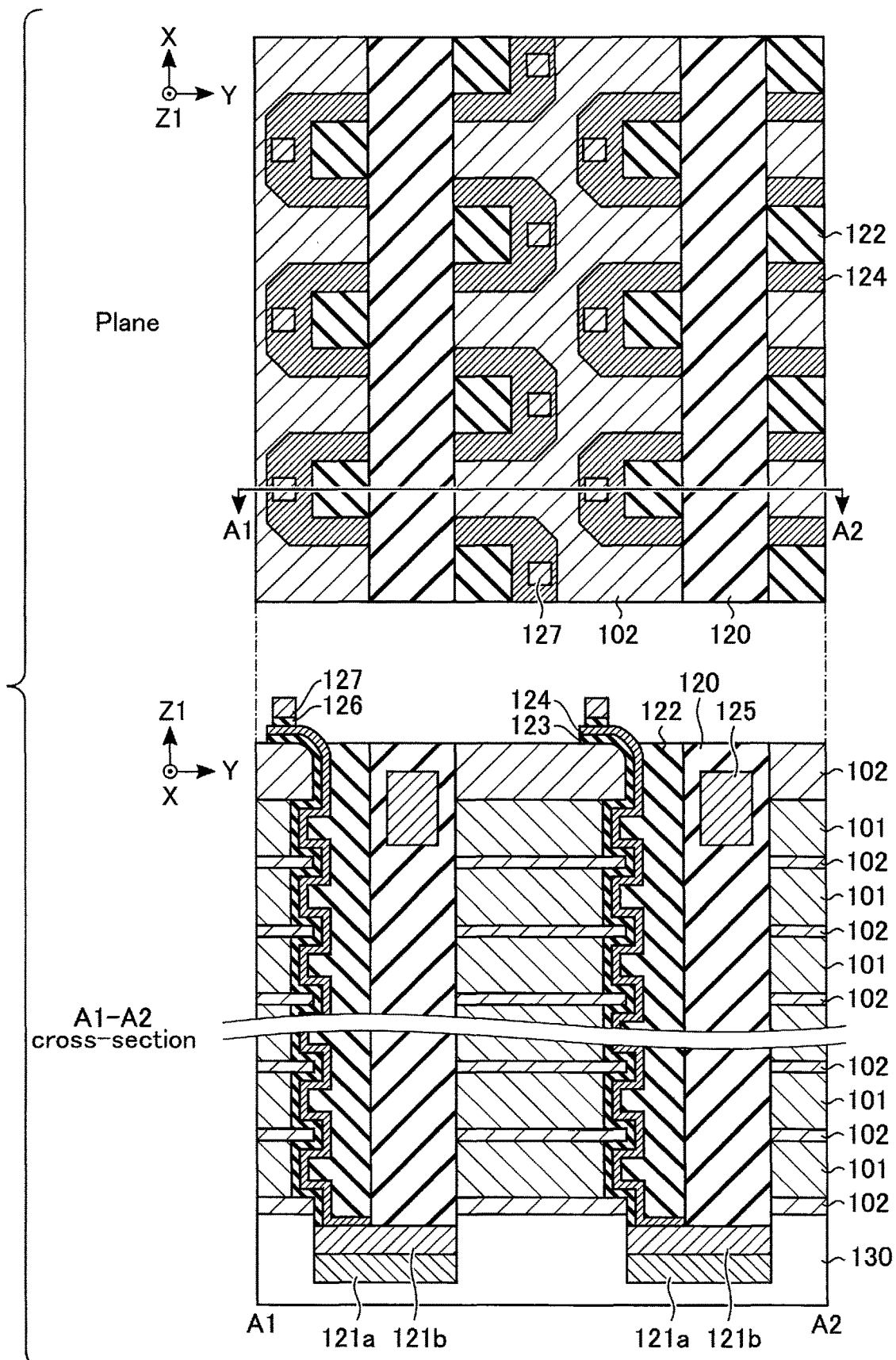

As shown in FIG. 22, a non-magnet 126 and a magnet 127 are formed on the magnet 124 of the terrace HD. As a result, MTJ elements are formed. More specifically, the non-magnet 126 and the magnet 127 are formed, for example, by sputtering. Next, a mask pattern, for example, using a resist is formed by sputtering on the magnet 127. Next, after removing the exposed magnet 127 and non-magnet 126, the resist is removed.

After forming the MTJ elements, an insulating layer 106 is formed as shown in FIG. 5. Next, a switching element SW and an interconnect layer 111 are formed.

1.2.2 Bonding of Array Chip 100 and Circuitry Chip 200

Next, an example of bonding of an array chip 100 and a circuit chip 200 will be described with reference to FIGS. 23 to 25.

Figure 23:
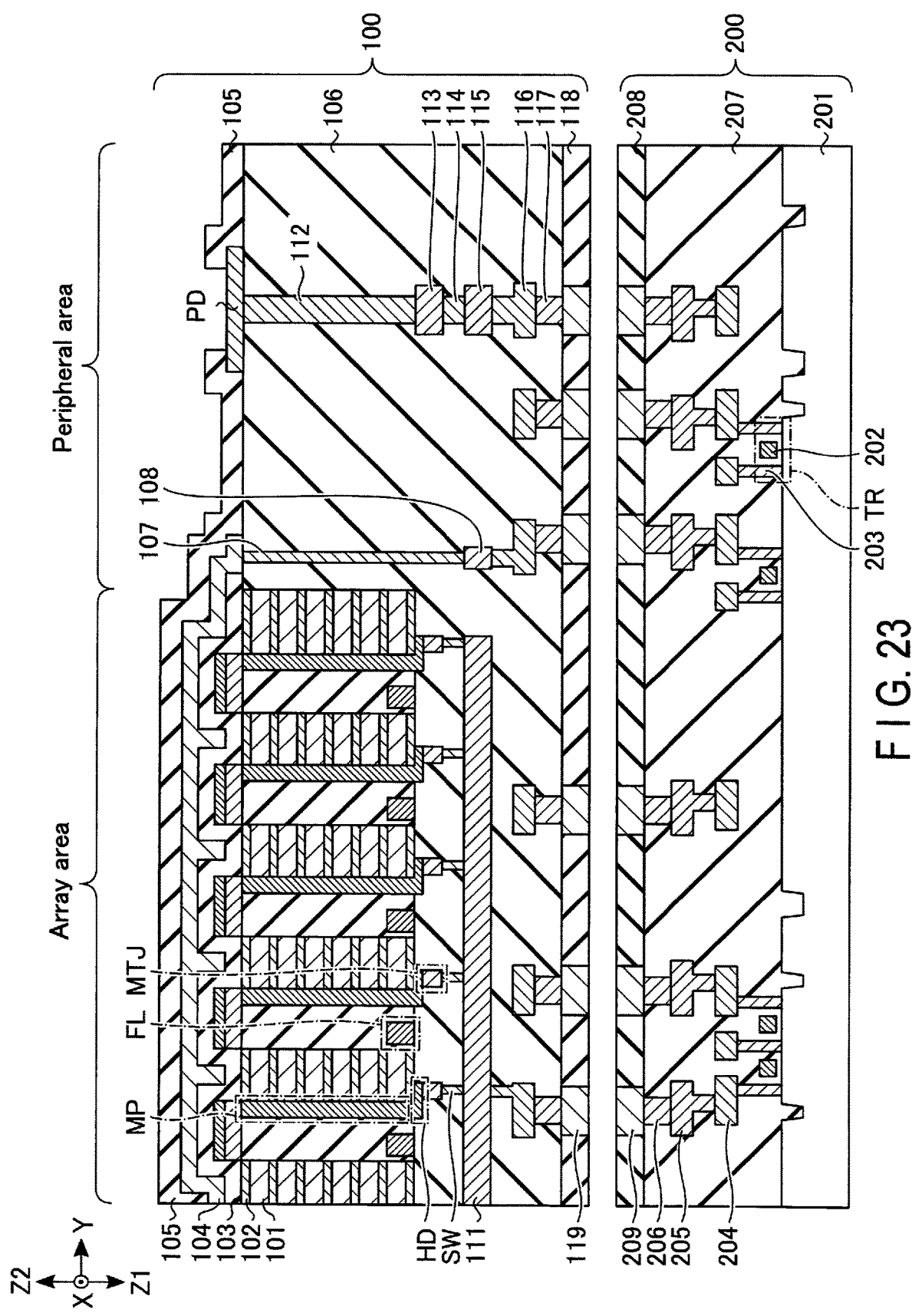
FIG. 23 is a cross-sectional view of a magnetic memory device showing a manufacturing process of the magnetic memory device according to the first embodiment.

As shown in FIG. 23, a wafer in which the array chip 100 has been loaded and a wafer in which the circuit chip 200 has been loaded are bonded together by mechanical pressure. As a result, the insulating layer 118 and the insulating layer 208 are bonded together. It should be noted that the insulating layer 118 and the insulating layer 208 may be bonded together by a hydrogen bonding of the OH groups that if formed by activating the surfaces of the insulating layers 118 and 208 by plasma treatment (the insulating layers 118 and 208 are terminated with OH groups). Next, the bonded array chip 100 and circuit chip 200 is annealed, for example, at 400° C. As a result, the electrode pad 119 (e.g., Cu) and the electrode pad 209 (e.g., Cu) are joined.

Figure 24:
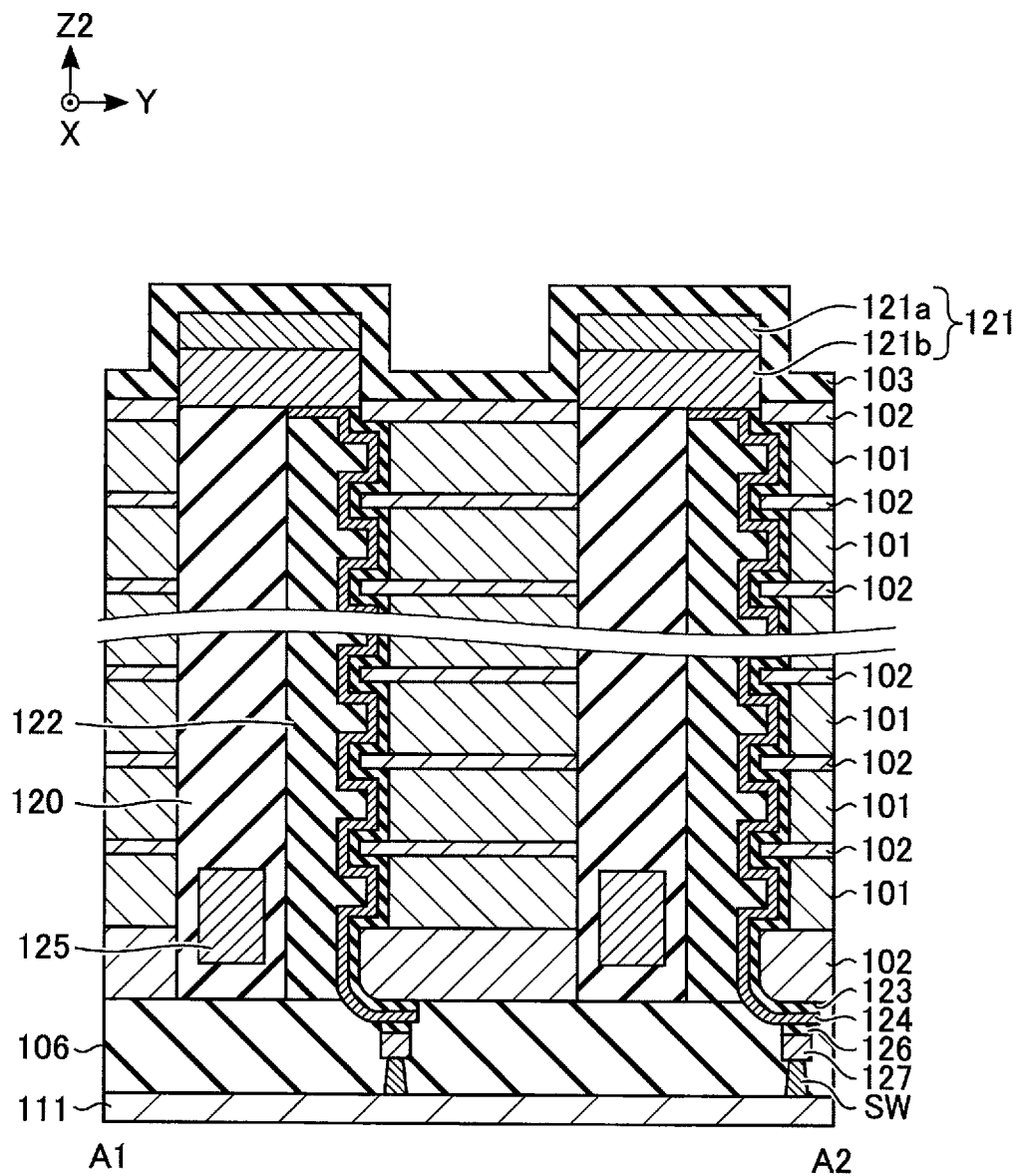

As shown in FIG. 24, after bonding the array chip 100 and the circuit chip 200 together, the semiconductor substrate 130 on the array chip 100 side is removed, for example, by wet etching. Next, an insulating layer 103 is formed so as to cover the semiconductor layers 102 and the interconnect layer 121. The interconnect layer 121 protrudes further in the Z2 direction than the uppermost layer of the semiconductor layers 102 in the Z2 direction. Therefore, the top surface of the insulating layer 103 in the Z2 direction has an uneven shape in the XY plane due to the interconnect layer 121. It should be noted that the catalyst layer 121a may be removed after removing the semiconductor substrate 130. For example, when the catalyst layer 121a is Au, the catalyst layer 121a is removed by wet etching using a wet etching solution containing aqua regia, an iodine-based solution, a cyan-based solution, or the like.

As shown in FIG. 25, an interconnect layer 104 and a passivation layer 105 are formed on the insulating layer 103. Similarly to the insulating layer 103, the top surface of the interconnect layer 104 and passivation layer 105 in the Z2 direction has an uneven shape in the XY plane due to the interconnect layer 121. That is, an interconnect layer 104 having a substantially uniform film thickness is formed.

1.3 Effects of Present Embodiment

According to the configuration of the present embodiment, it is possible to form a magnet 124 extending in the Z direction. As a result, a domain wall memory can be formed in which memory cells MC (magnetic domains) are stacked in a direction perpendicular to a substrate. Therefore, it is possible to increase the memory density and achieve high-density integration of the magnetic memory device.

For example, in a domain wall memory of a cylindrical shape including a narrow portion, a shift current for shifting a magnetic domain wall sometimes increases in relation to the cross-sectional area of a magnet. In contrast, the configuration of the present application allows for a thin wire shape of the magnet 124, thereby allowing suppression of the increase in shift current and reduction in consumption power.

Furthermore, according to the configuration of the present embodiment, it is possible to form a protrusion (a narrow portion) in the magnet, thereby reducing shift errors of the domain wall and improving the reliability.

Furthermore, according to the configuration of the present embodiment, it is possible to etch a stacked body, in which a plurality of semiconductor layers 101 and a plurality of semiconductor layers 102 are alternately stacked, at a time by wet etching using a catalyst metal (MaCE). Therefore, it is possible to use a wet etching apparatus which is inexpensive as compared to a vacuum apparatus used in dry etching, which is expensive. This allows reduction in costs per step in the etching process. As a result, it is possible to suppress an increase in manufacturing costs.

Furthermore, according to the configuration of the present application, it is possible to use a catalyst metal having a hole shape (protrusion SLb) and a line shape (electrode portion SLa) when slits are etched by MaCE. This can prevent holes from bending in the Z direction when the holes are opened.

Furthermore, according to the configuration of the present embodiment, holes (area AR2) and lines (area AR1) can be etched at a time by MaCE. Therefore, the angle of a contact portion between a hole and a line can be made substantially 90°.

Figure 26:
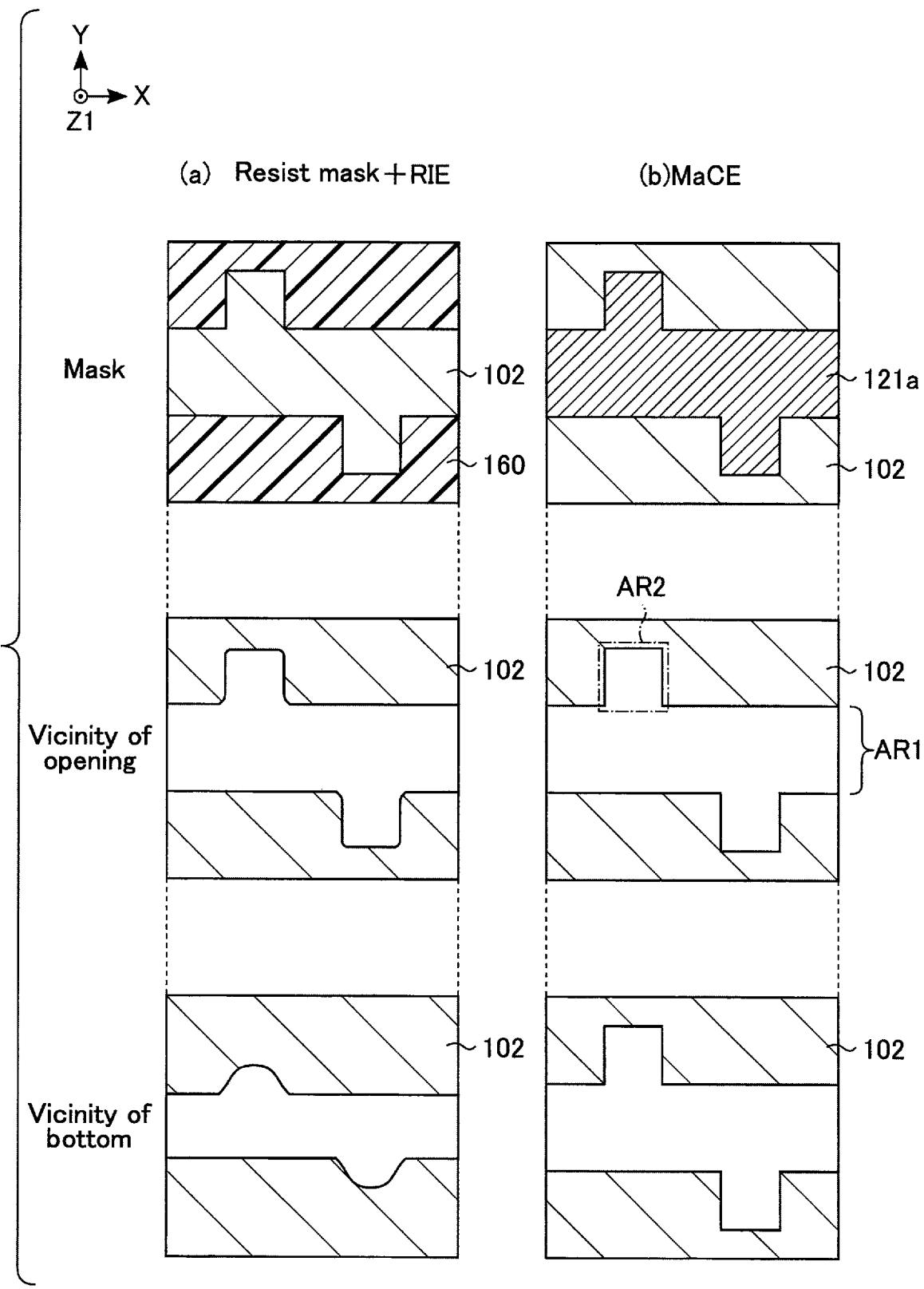
FIG. 26 is an exemplary diagram in which the shapes of holes and lines etched using RIE is compared with the shapes of holes and lines etched using MaCE.

Furthermore, according to the configuration of the present embodiment, it is possible to reduce variance in shapes of the holes and lines in the vicinity of the openings and in the vicinity of the bottom by using MaCE. The effect is described with reference to FIG. 26. FIG. 26 is an exemplary diagram in which a case where holes (area AR2) and lines (area AR1) are etched by using a resist mask pattern and RIE is compared with a case where holes (area AR2) and lines (area AR1) are etched by using MaCE. The examples of FIG. 26 respectively show a mask surface, a plan view of an etched shape in the vicinity of the openings, and a plan view of an etched shape in the vicinity of the bottom.

As shown in FIG. 26, for example, in the case of a resist mask, a mask pattern using a resist 160 is formed in an unetched area, and a stacked body (semiconductor layers 101 and 102) in an etched area is exposed. Corners of the resist 160 recede by etching. In the case of RIE, generally, the etched shape is tapered (the bottom becomes smaller). Therefore, the angle θ of each corner of holes is widened to 90° or more from its opening toward the bottom, and the widths of a hole and a line decrease in the Y direction. Therefore, memory cell transistors MC differ in shape between the upper portion and the lower portion of a memory pillar MP. In contrast, in the case of MaCE, since the shape of the catalyst layer 121a is transcribed also in the vicinity of the bottom, it is possible to reduce variance in etching shapes of the holes and lines in the depth direction (Z direction). That is, it is possible to reduce variance in shapes and characteristics of memory cell transistors MC.

Furthermore, according to the configuration of the present embodiment, after bonding the array chip 100 and the circuit chip 200 together, it is possible to remove the semiconductor substrate and form the interconnect layers 104. As a result, the interconnect layers 104 can be formed in accordance with the shapes of the areas AR1 and AR2 so as to cover these areas. Since the interconnect layers 104 can be formed so as to have a substantially uniform film thickness, it impossible to reduce an increase in the interconnect resistance caused by a locally thinned film thickness.

2. Second Embodiment

Next, a second embodiment will be described. In the second embodiment, three examples of the layout of a memory cell array 10 different than that of the first embodiment will be described. Hereinafter, the three examples will be described focusing on different points from those in the first embodiment.

2.1 First Example

Figure 27:
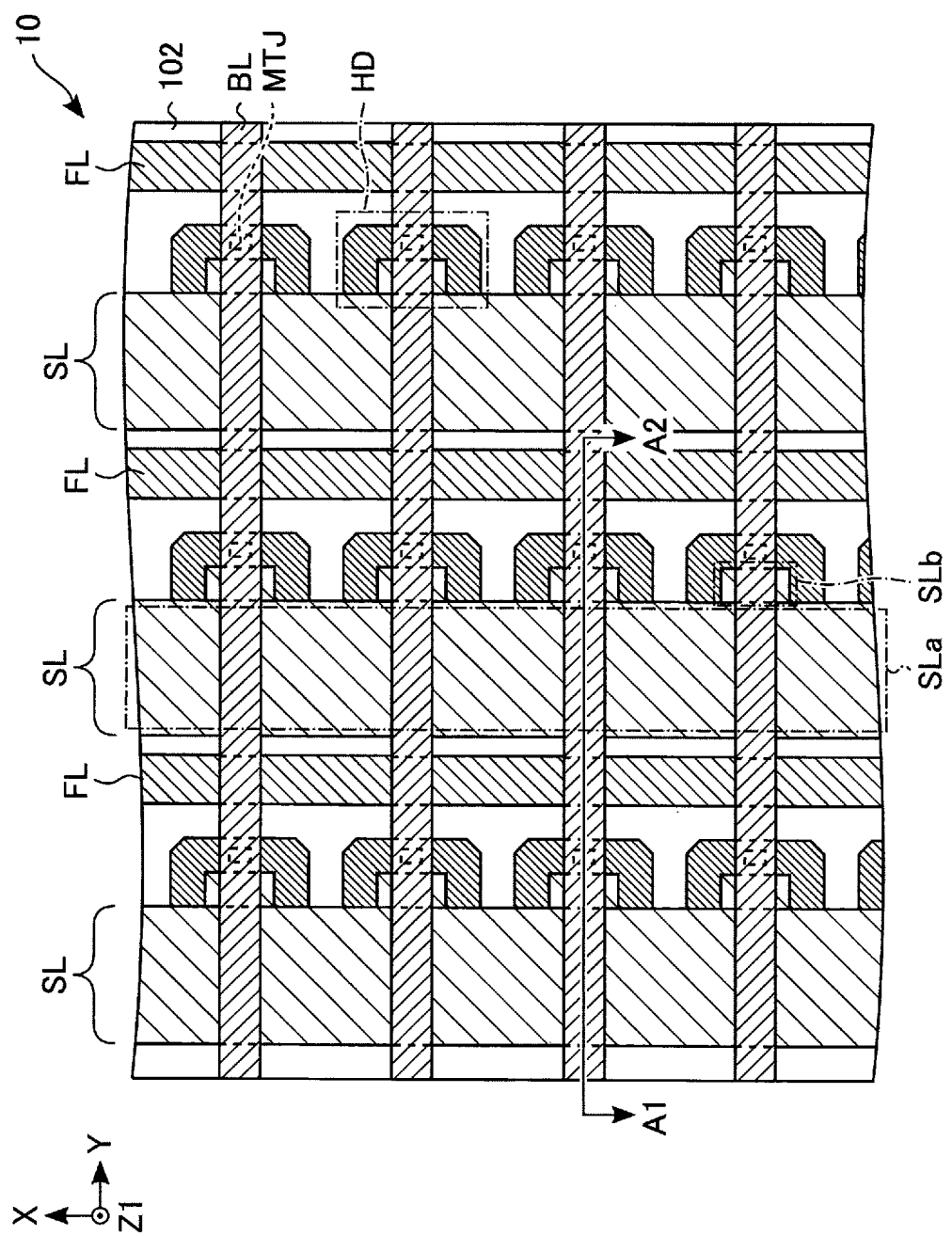
FIG. 27 is a plan view of a memory cell array provided in a magnetic memory device according to a first example of a second embodiment.

First, the layout of a memory cell array 10 of a first example will be described with reference to FIGS. 27 and 28. FIG. 27 is a plan view of the memory cell array 10. FIG. 28 is a cross-sectional view along an A1-A2 line in FIG. 27. In the example of FIG. 27, illustrations of the bottom BB of the magnet 124, the insulating layers 120 and 122, and the semiconductor layers 101 and 102 are omitted.

First, the planar configuration of the memory cell array 10 will be described.

As shown in FIG. 27, in this example, a plurality of rectangular protrusions SLb are provided on one side face of an electrode portion SLa of a source line SL facing the Y direction. That is, a plurality of terraces HD (i.e., memory pillars MP) corresponding to one source line SL are arranged in line along the X direction. In the example of FIG. 27, a combination of a source line, a terrace HD, and a field line FL is repeatedly arranged.

The bit line BL extends in the Y direction. A plurality of MTJ elements that are arranged respectively corresponding to the plurality of source lines SL along the Y direction are coupled in common to one bit line BL via the switching elements SW.

The field line FL extends in the X direction. Then, in the Y direction, the field line FL is provided between the terrace HD and an electrically non-coupled source line SL so as to be adjacent to the terrace HD in the Y direction.

Next, the cross-sectional configuration of the memory pillar will be described.

As shown in FIG. 28, the structures of the source line SL, the memory pillar MP, and the terrace HD are the same as those of the first embodiment. In this example, an interconnect layer 134 functioning as a field line FL is arranged between two memory pillars MP adjacent to each other in the Y direction. The example of FIG. 28 shows a case where the field lines FL are etched by MaCE. The interconnect layer 134 is a stacked body in which a catalyst layer 134a and a conductive layer 134b are stacked. An insulating layer 135 is provided on the bottom and a side face of the interconnect layer 134.

An example of a method of forming the interconnect layer 134 will be briefly described. For example, in FIG. 19 of the first embodiment, after planarization of the insulating layer 120, the insulating layers 120 and 122 are etched until the surface of the uppermost layer of the semiconductor layers 102 is exposed. Next, a pattern of a catalyst layer 134a corresponding to the field lines FL is formed on the semiconductor layers 102. Next, a mask pattern of resist is formed such that the insulating layers 120, 122, and 123, and the magnet 124 are masked, and the catalyst layer 134a is exposed. Next, the semiconductor layers 101 and the semiconductor layers 102 are etched by MaCE to form slits corresponding to the field lines FL. Next, after removing the resist, a conductive layer 134b is formed on the catalyst layer 134a. As a result, the interconnect layer 134 can be formed.

For the catalyst layer 134a, a catalyst material corresponding to MaCE is used, similarly to the catalyst layer 121a. For the conductive layer 134b, for example, Ru, Pt, etc., formed using CVD, electroless plating, etc., is used, similarly to the conductive layer 121b.

For the insulating layer 135, for example, SiO$_2$ formed by CVD may be used, and an oxidized layer may be used which is prepared by oxidizing the semiconductor layers 101 and 102 which are in contact with the interconnect layer 134 while the interconnect layer 134 serves as a catalyst.

2.2. Second Example

Figure 29:
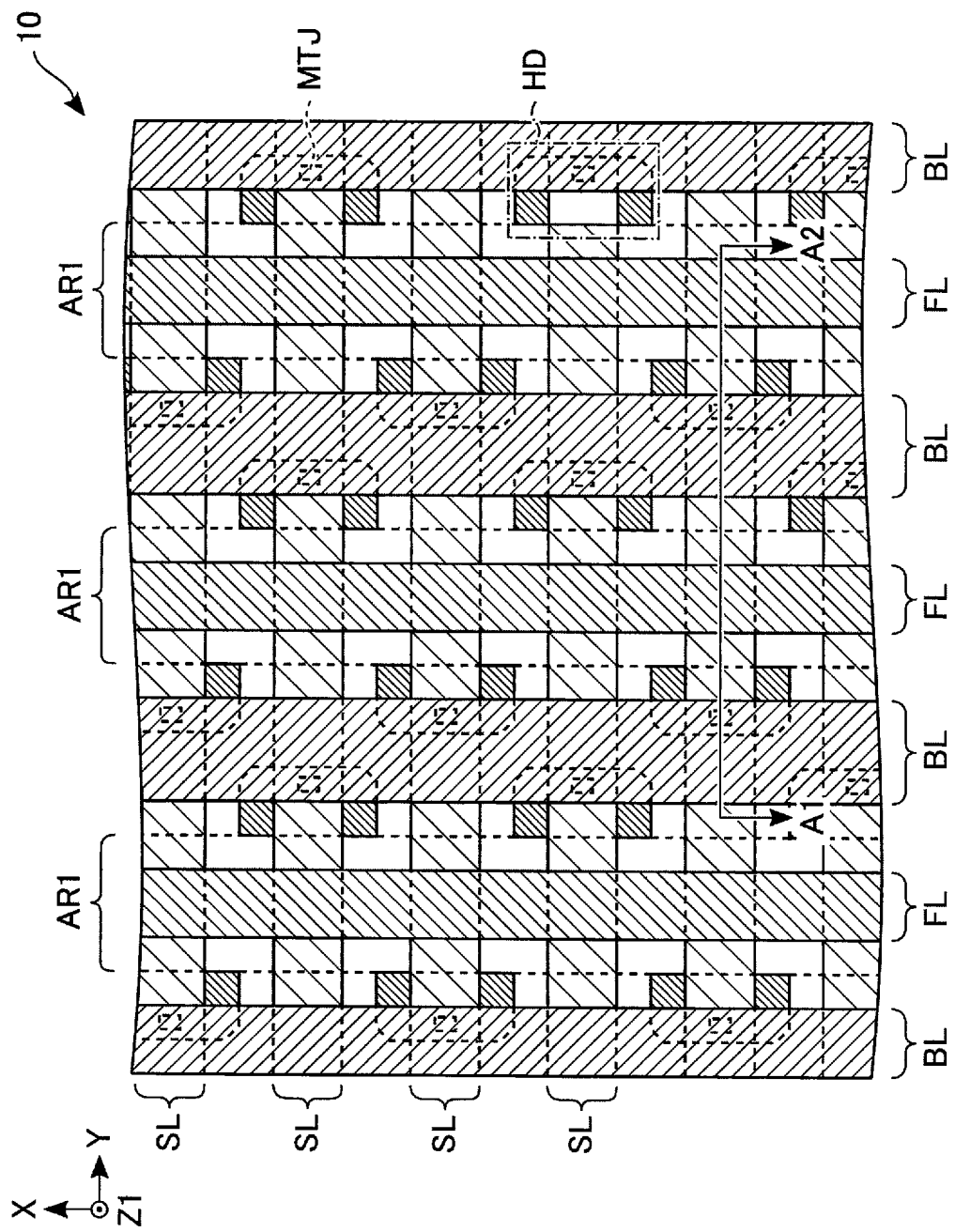
FIG. 29 is a plan view of a memory cell array provided in a magnetic memory device according to a second example of the second embodiment.

Next, the layout of a memory cell array of a second example will be described with reference to FIGS. 29 and 30. FIG. 29 is a plan view of the memory cell array 10. FIG. 30 is a cross-sectional view along an A1-A2 line of FIG. 29. In the example of FIG. 29, illustrations of the bottom BB of the magnet 124, the insulating layers 120 and 122, and the semiconductor layers 101 and 102 are omitted.

First, the planer configuration of the memory cell array 10 will be described.

As shown in FIG. 29, in this example, the arrangement of terraces HD (i.e., memory pillars MP) and field lines FL are the same as that of the first embodiment. Source lines SL extend in the Y direction, and bit lines BL extend in the X direction. The bit lines BL and the field lines FL are alternately arranged along the Y direction. A plurality of memory pillars MP arranged in the Y direction are coupled in common to one source line SL extending in the Y direction. A plurality of MTJ elements provided between two areas AR1 are respectively coupled in common to one bit line BL extending in the X direction via the switching elements SW.

Next, the cross-sectional configuration of the memory pillar will be described.

As shown in FIG. 30, the structures of the memory pillars MP, terraces HD, and field lines FL are the same as those of the first embodiment. In this example, an interconnect layer 137 extending in the Y direction and functioning as a source line SL is formed on an insulating layer 103. Then, an insulating layer 136 is provided between the interconnect layer 137 and the lowermost layer of the semiconductor layers 102. For the insulating layer 136, for example, SiO$_2$ is used. It should be noted that the insulating layer 136 may be formed by oxidizing the lowermost layer of the semiconductor layers 102. The interconnect layer 137 is composed of a conductive material, and the conductive material may be, for example, a metal material, a p-type semiconductor, or an n-type semiconductor.

A switching element SW is provided on a magnet 127. An interconnect layer 111 extending in the X direction and functioning as a bit line BL is provided on the switching element SW.

In this example, the catalyst layer 121a described in the first embodiment has been removed after being subjected to MaCE.

The insulating layer 136 and the interconnect layer 137 are formed, for example, after removing the semiconductor substrate 130.

2.3 Third Example

Figure 31:
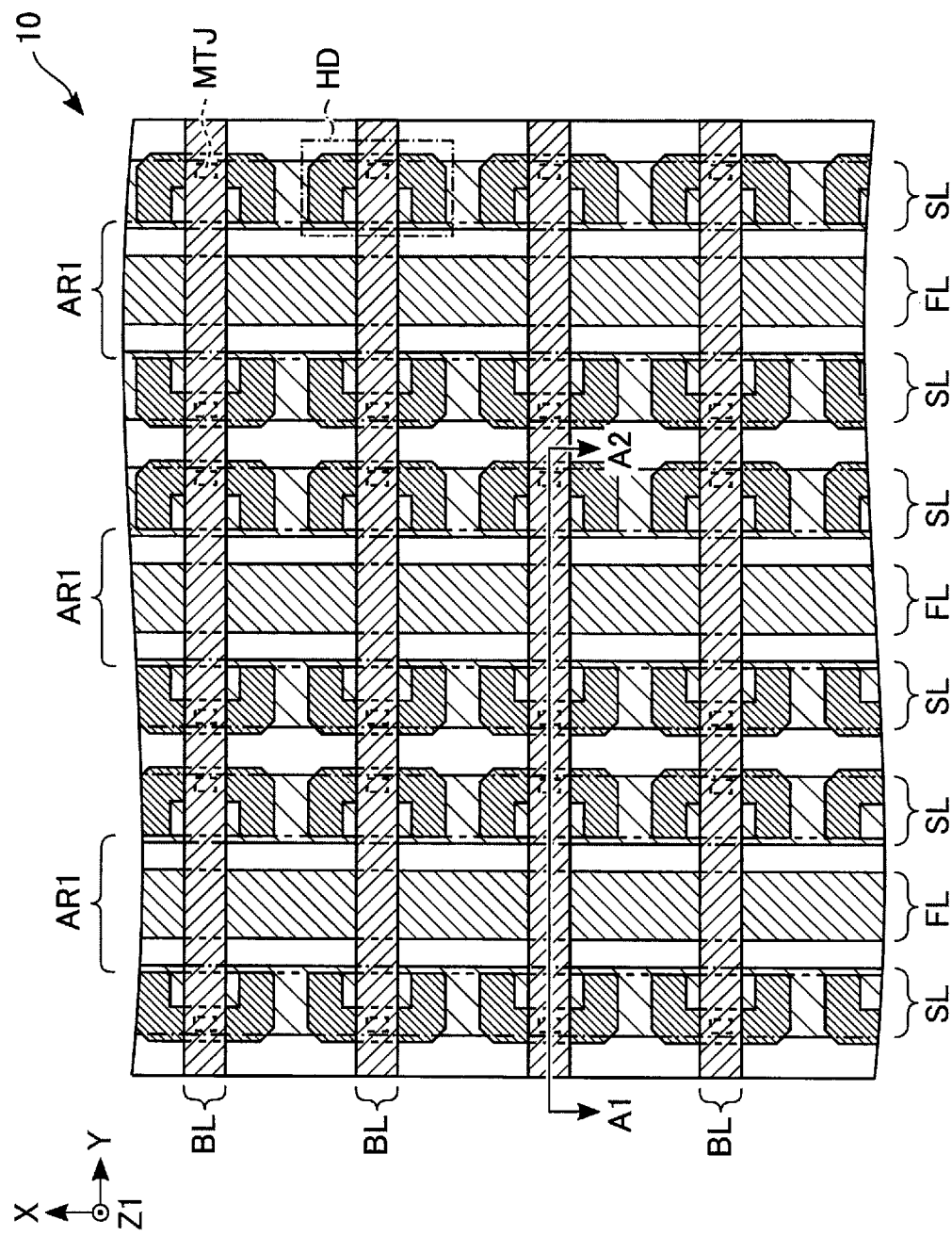
FIG. 31 is a plan view of a memory cell array provided in a magnetic memory device according to a third example of the second embodiment.
Figure 32:
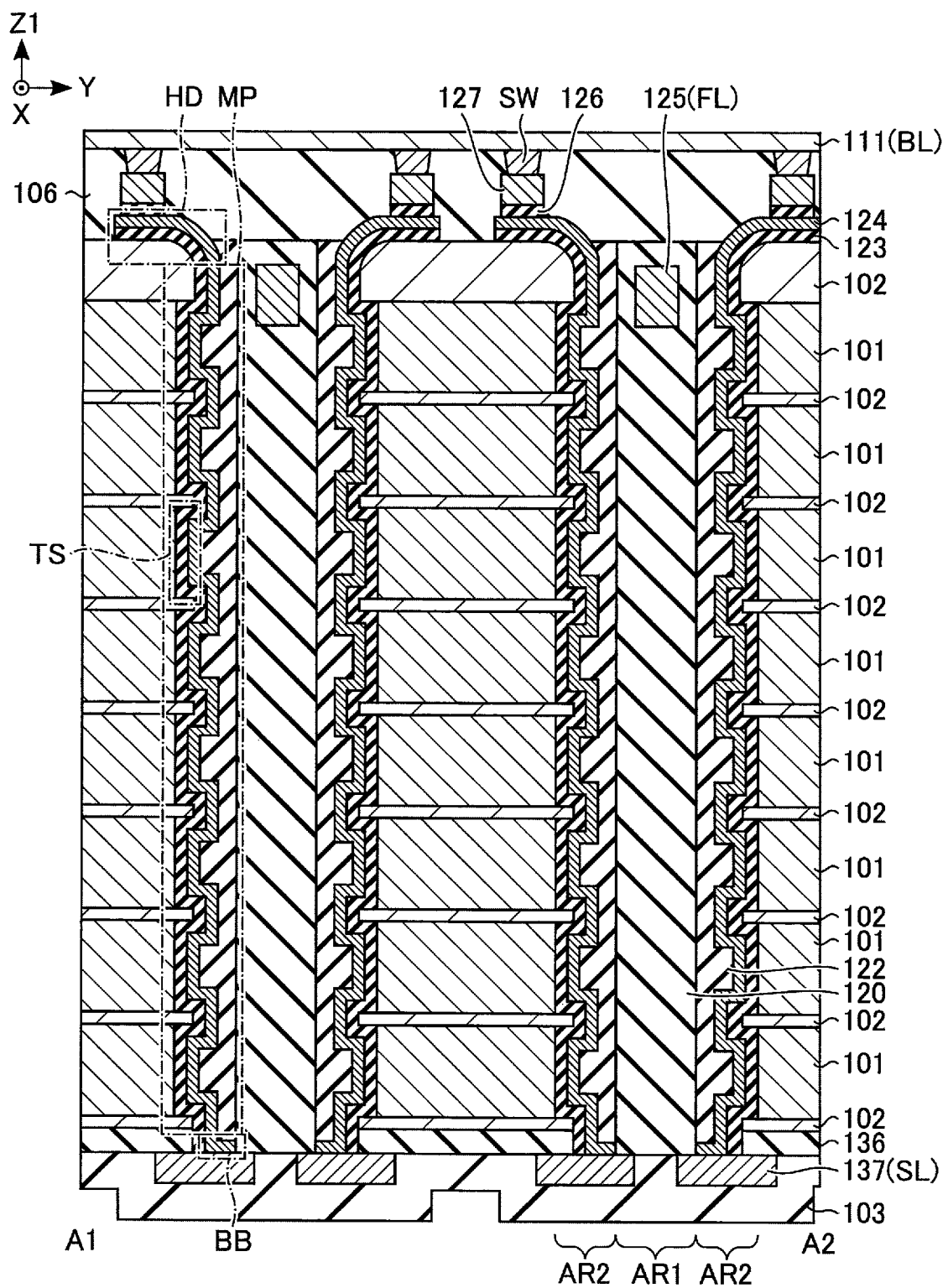
FIG. 32 is a cross-sectional view of the memory cell array provided in the magnetic memory device according to the third example of the second embodiment.

Next, the layout of a memory cell array 10 of a third example will be described with reference to FIGS. 31 and 32. FIG. 31 is a plan view of the memory cell array 10. FIG. 32 is a cross-sectional view along an A1-A2 line in FIG. 31. In the example of FIG. 31, illustrations of the bottom BB of the magnet 124, the insulating layers 120 and 122, and the semiconductor layers 101 and 102 are omitted.

First, the planar configuration of the memory cell array 10 will be described.

As shown in FIG. 31, in this example, the arrangement of field lines FL is the same as that of the first embodiment. A plurality of terraces HD (i.e., memory pillars MP) are arranged along two side faces of an area AR1 facing the Y direction. Then, two terraces HD are arranged so as to face each other with the area AR1 interposed therebetween. In other words, a plurality of memory pillars MP are arranged in a matrix form along the X direction and the Y direction. A plurality of memory pillars MP arranged in line along the X direction are coupled in common to one source line SL extending in the X direction. In addition, a plurality of MTJ elements arranged in the X direction are respectively coupled in common to one bit line BL extending in the Y direction via the switching elements SW.

Next, the cross-sectional configuration of the memory pillar MP will be described.

As shown in FIG. 32, the structures of the memory pillars MP, terraces HD, and field lines FL are the same as those of the first embodiment. In this example, two memory pillars MP are arranged so as to face each other with an area AR1 (insulating layer 120) interposed therebetween. An interconnect layer 137 extending in the X direction and functioning as a source line is formed on an insulating layer 103. Then, an insulating layer 136 is provided between the interconnect layer 137 and the lowermost layer of semiconductor layers 102.

In this example, the catalyst layer 121a described in the first embodiment has been removed after being subjected to MaCE, similarly to the second example. The insulating layer 136 and the interconnect layer 137 are formed, for example, after removing the semiconductor substrate 130.

2.4 Effects of Present Embodiment

According to the configuration of the present embodiment, the same effects as those of the first embodiment can be obtained.

3. Third Embodiment

Next, the third embodiment will be described. In the third embodiment, the structures of memory pillars MP and terraces HD different than those of the first embodiment will be described. Hereinafter, the third embodiment will be described focusing on different points from those in the first and second embodiments.

3.1 Planar Configuration of Memory Cell Array

Figure 33:
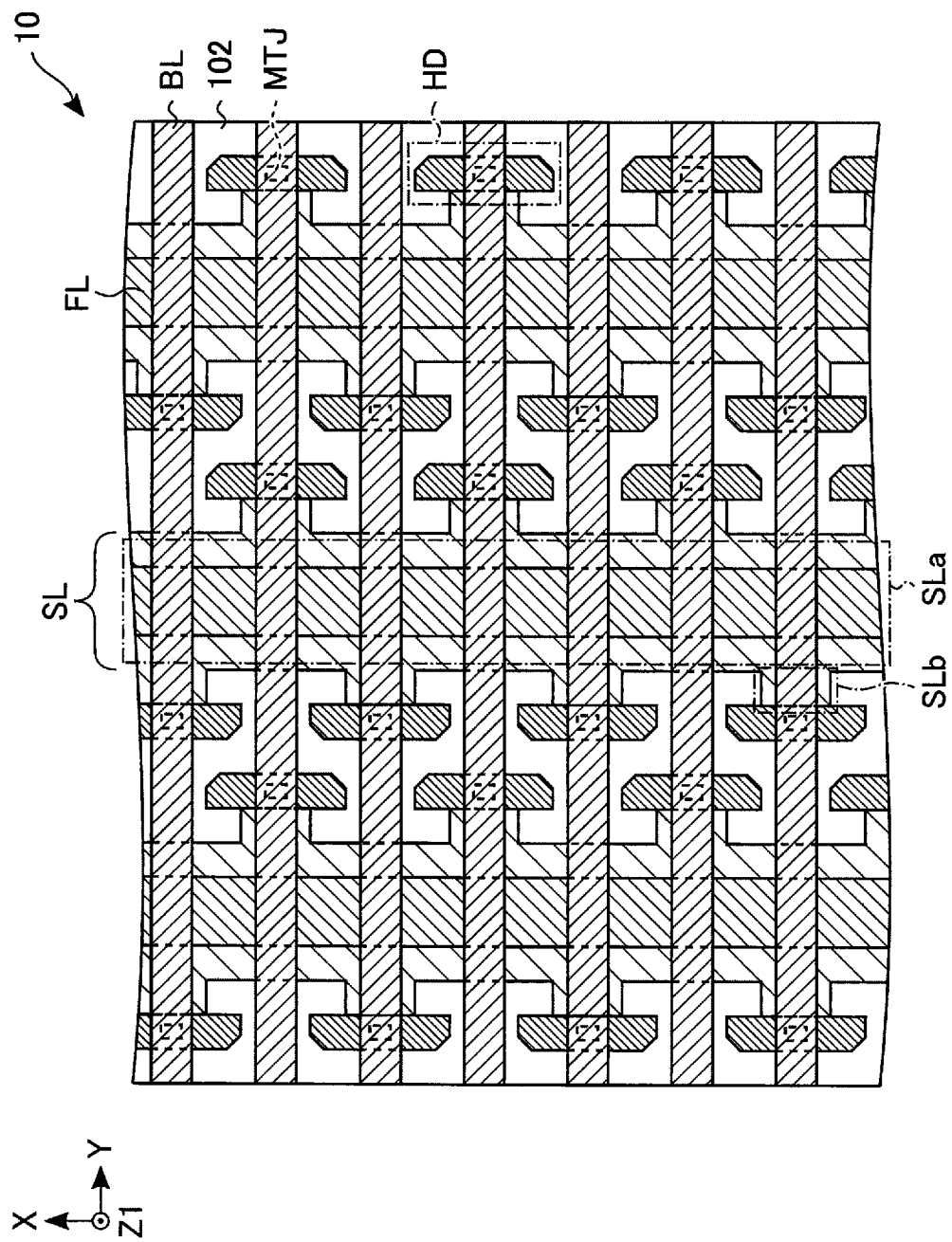
FIG. 33 is a plan view of a memory cell array provided in a magnetic memory device according to a third embodiment.
Figure 34:
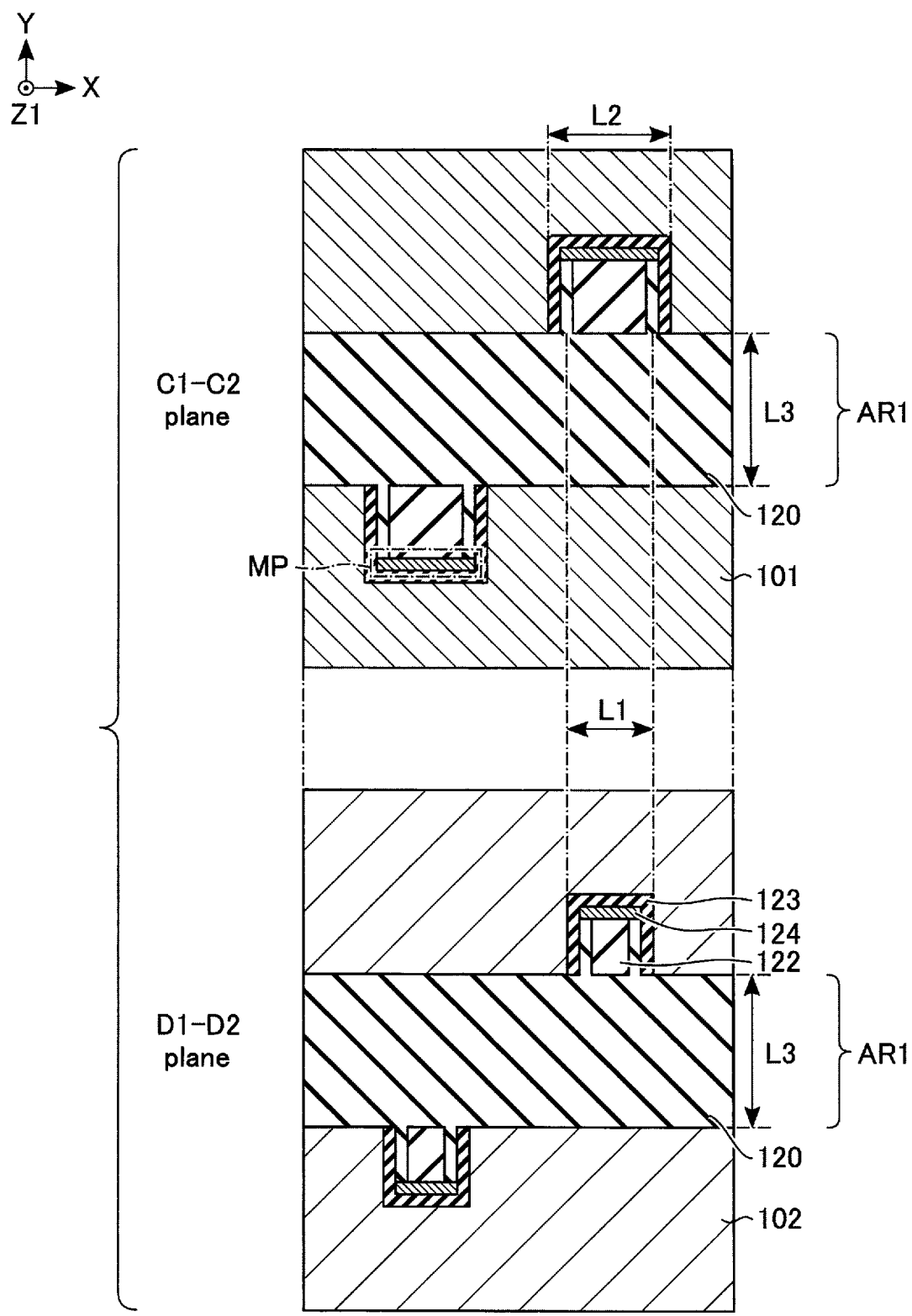
FIG. 34 is a diagram showing a C1-C2 plane and a D1-D2 plane of the memory cell array provided in the magnetic memory device according to the third embodiment.

First, an example of the planar configuration of a memory cell array 10 will be described with reference to FIGS. 33 and 34. In the example of FIG. 33, illustrations of the bottom BB of the magnet 124, the insulating layers 120 and 122, and the semiconductor layers 101 and 102 are omitted. FIG. 34 shows a C1-C2 plane and a D1-D2 plane.

As shown in FIG. 33, the arrangement of source lines SL, bit lines BL, and field lines FL is the same as that of the first embodiment.

Each memory pillar MP is provided on the side of a protrusion SLb facing the Y direction. Each terrace HD is provided to extend in the Y direction outside the protrusion SLb. Each terrace HD has a flat portion having a substantially square shape whose side facing in the X direction is longer than the side facing in the Y direction.

A plurality of MTJ elements corresponding to one source line SL are respectively coupled to different bit lines BL via the switching elements SW (not shown). A plurality of MTJ elements that are arranged respectively corresponding to a plurality of source lines SL along the Y direction are coupled in common to one bit line BL. The bit lines BL are provided extending in the Y direction above field lines FL.

Next, the planar configuration of a memory pillar MP will be described.

As shown in FIG. 34, in the present embodiment, a memory pillar MP is provided on one side face of an area AR2 facing the Y direction and opposing an area AR1. In other words, the memory pillar MP is in contact with the side face of an insulating layer 122 facing the Y direction. An insulating layer 123 is provided between the insulating layer 122 and each of the semiconductor layers 101 and 102. An insulating layer 120 is provided between the surface of the insulating layer 122 facing the X direction and the insulating layer 123.

For example, as described in FIG. 18 of the first embodiment, the insulating layer 122, the magnet 124, and the insulating layer 123 in the area AR1 are removed. Thereafter, the magnet 124 provided between the side face of the insulating layer 122 facing the X direction and the insulating layer 123 is etched from the side face of AR1. Thereafter, an insulating layer 120 is formed. Through this process step, the insulating layer 120 is provided between the insulating layer 122 and the insulating layer 123.

Memory pillars MP have a square shape whose side facing in the X direction is longer than the side facing in the Y direction, in the C1-C2 plane and the D1-D2 plane. The memory pillars MP are magnetic thin wire. The length of the memory pillar MP of the present embodiment, i.e., the magnetic thin wire, in the X direction in the D1-D2 plane is shorter than the length of the magnetic thin wire in the X direction in the C1-C2 plane. In addition, the distance between the memory pillar MP and the insulating layer 120 (AR1) in the D1-D2 plane is shorter than the distance between the memory pillar MP and the insulating layer 120 (AR1) in the C1-C2 plane. Therefore, the magnetic thin wire has a surge in the interconnect width direction and in the film thickness direction.

3.2 Effects of Present Embodiment

According to the configuration of the present embodiment, the same effects as those of the first embodiment can be obtained.

It should be noted that the second embodiment and the third embodiment may be combined. That is, the structures of the memory pillars MP and terraces HD of the present embodiment may be applied to the first to third examples of the second embodiment.

4. Fourth Embodiment

Next, the fourth embodiment will be described. In the fourth embodiment, the structures of memory pillars MP and terraces HD different than those of the first to third embodiments will be described. Hereinafter, the fourth embodiment will be described focusing on different points from those in the first to third embodiments.

4.1 Planar Configuration of Memory Cell Array

Figure 35:
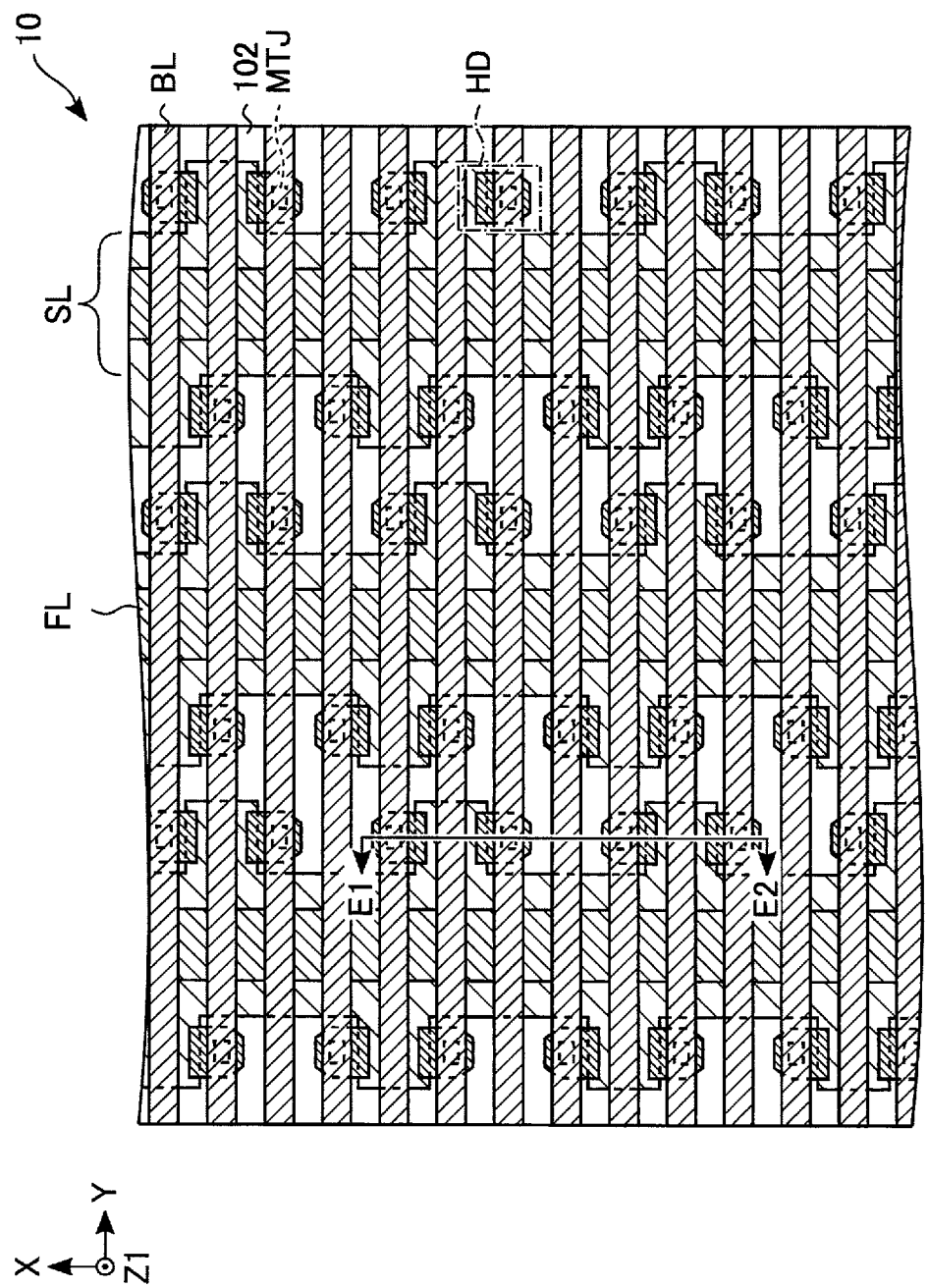
FIG. 35 is a plan view of a memory cell array provided in a magnetic memory device according to a fourth embodiment.

First, an example of the planar configuration of a memory cell array 10 will be described with reference to FIG. 35. In the example of FIG. 35, illustrations of the bottom BB of the magnet 124, the insulating layers 120 and 122, and the semiconductor layers 101 and 102 are omitted.

As shown in FIG. 35, the arrangement of source lines SL and field lines FL is the same as that of the first embodiment. In the present embodiment, two memory pillars MP and two terraces HD are provided for one protrusion SLb of a source line SL. More specifically, the memory pillars MP are provided respectively on two sides of the protrusion SLb facing the X direction. No memory pillar MP is provided on the side of the protrusion SLb facing the Y direction. A terrace HD having a flat portion extending in the X direction is provided corresponding to each memory pillar MP.

A plurality of MTJ elements corresponding to one source line SL are respectively coupled to different bit lines BL via the switching elements (not shown). A plurality of MTJ elements that are arranged respectively corresponding to a plurality of source lines SL along the Y direction are coupled in common to one bitline BL. The bitlines BL are extending in the Y direction and are provided above field lines FL.

4.2 Configuration of Memory Pillar

Figure 37:
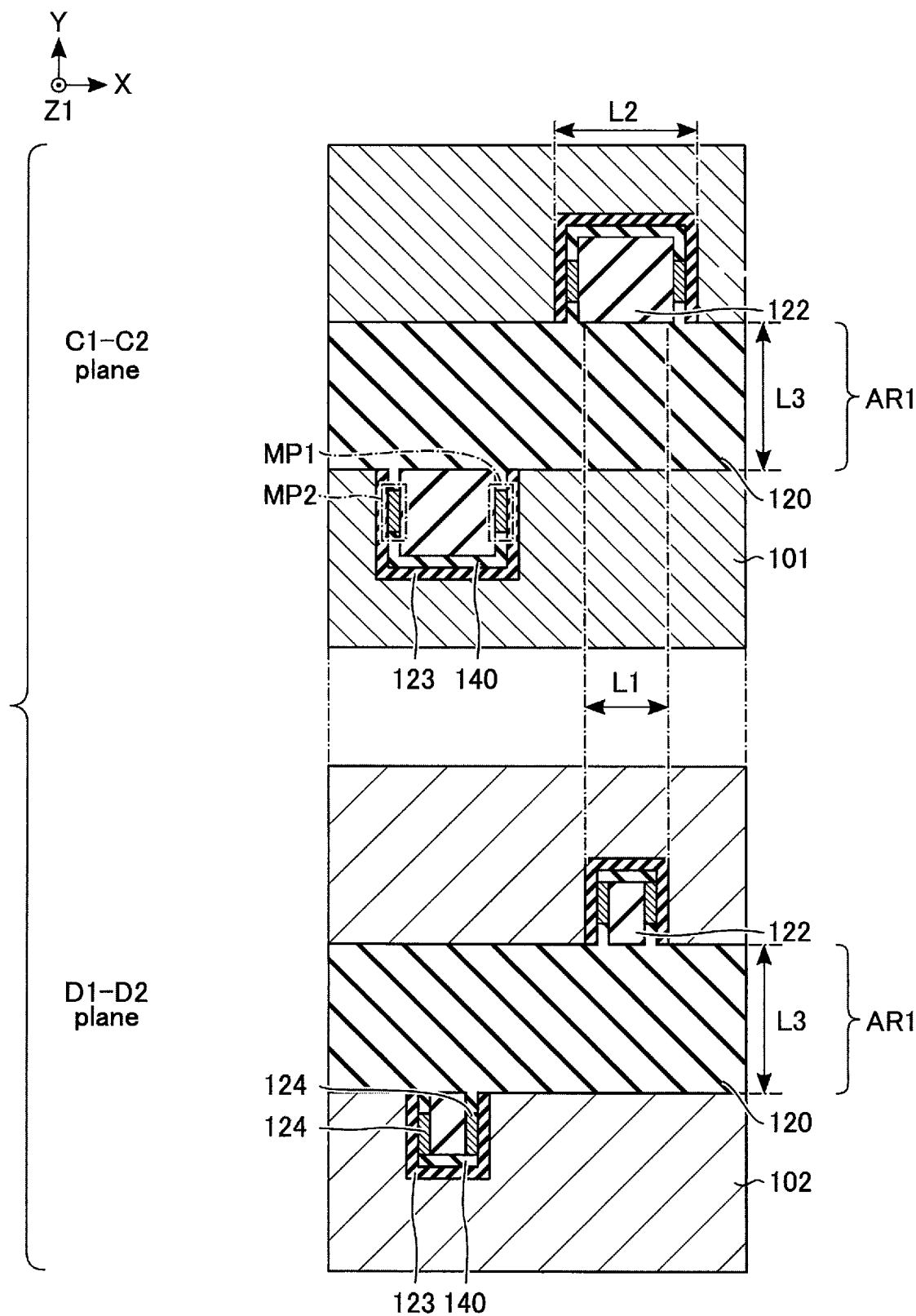
FIG. 37 is plan views along a C1-C2 line and a D1-D2 line in FIG. 36.

Next, the configuration of a memory pillar MP will be described with reference to FIGS. 36 and 37. FIG. 36 is a cross-sectional view along an E1-E2 line in FIG. 35. FIG. 37 is a plan view along a C1-C2 line and a D1-D2 line in FIG. 36.

As shown in FIG. 36, two memory pillars MP are provided respectively on two side faces of an area AR2 facing the X direction. The lower ends of the two memory pillars MP are coupled to one bottom BB. A terrace HD is provided corresponding to each memory pillar MP. In the example of FIG. 36, one memory pillar MP is provided so as to come into contact with the side face of an insulating layer 122 facing the left side of the space. Then, a terrace HD having a flat portion extending in the left side of the space is provided on the memory pillar MP. Similarly, the other memory pillar MP is provided so as to come into contact with the side face of the insulating layer 122 facing the right side of the space. A terrace HD having a flat portion extending in the right side of the space is provided on the memory pillar MP.

A non-magnet 126 and a magnet 127 are stacked on each terrace HD.

A switching element SW is provided on the magnet 127. An interconnect layer 111 extending in the Y direction and functioning as a bit line BL is provided on the switching element SW.

Next, the planar configuration of the memory pillar MP will be described.

As shown in FIG. 37, in the present embodiment, two memory pillars MP are provided respectively on two side faces of an area AR2 facing the X direction. Hereinafter, in the example of FIG. 37, a memory pillar provided on the right side of the space with the insulating layer 122 interposed therebetween is denoted by "MP1", and a memory pillar provided on the left side of the space is denoted by "MP2". Each of the memory pillars MP1 and MP2 functions as one memory string MS. The memory pillars MP1 and MP2 have a square shape in which the side facing in the X direction is longer than the side facing in the Y direction in the C1-C2 plane and the D1-D2 plane. The length of the memory pillars MP1 and MP2 in the Y direction is shorter than the length of the insulating layer 122 in the Y direction. The memory pillars MP1 and MP2 are magnetic thin wires. In the present embodiment, in both the memory pillars MP1 and MP2, the length of the magnetic thin wire in the Y direction in the D1-D2 plane is the same as the length in the Y direction in the C1-C2 plane. Therefore, the magnetic thin wire does not have a surge in the interconnect width direction. In addition, the distance between the memory pillar MP1 and the memory pillar MP2 in the D1-D2 plane is shorter than the distance between the memory pillar MP1 and the memory pillar MP2 in the C1-C2 plane. Therefore, the magnetic thin wire has a surge in the film surface direction.

An insulating layer 123 is provided between three side faces of the insulating layer 122 and each of the semiconductor layers 101 and 102. The memory pillars MP1 and MP2 are provided between a portion of the surface of the insulating layer 122 facing the X direction and the insulating layer 123. In the area AR2, in an area closer to the area AR1 than the memory pillars MP1 and MP2, an insulating layer 120 is provided between a side face of the insulating layer 122 and the insulating layer 123. In the area AR2, in an area farther away from the area AR1 than the memory pillars MP1 and MP2, an insulating layer 140 is provided between a side face of the insulating layer 122 and the insulating layer 123. For the insulating layer 140, for example, SiN is used.

4.3 Manufacturing Method of Memory Pillar

Next, an example of a manufacturing method of a memory pillar MP will be described with reference to FIGS. 38 to 44. FIGS. 38 to 44 respectively show a plan view and a cross-section along an E1-E2 line (referred to as an "E1-E2 cross-section") of the memory cell array 10.

As shown in FIG. 38, areas AR1, AR2, and AR3 are formed in the same manner as shown in FIGS. 8 to 16 of the first embodiment.

Figure 39:
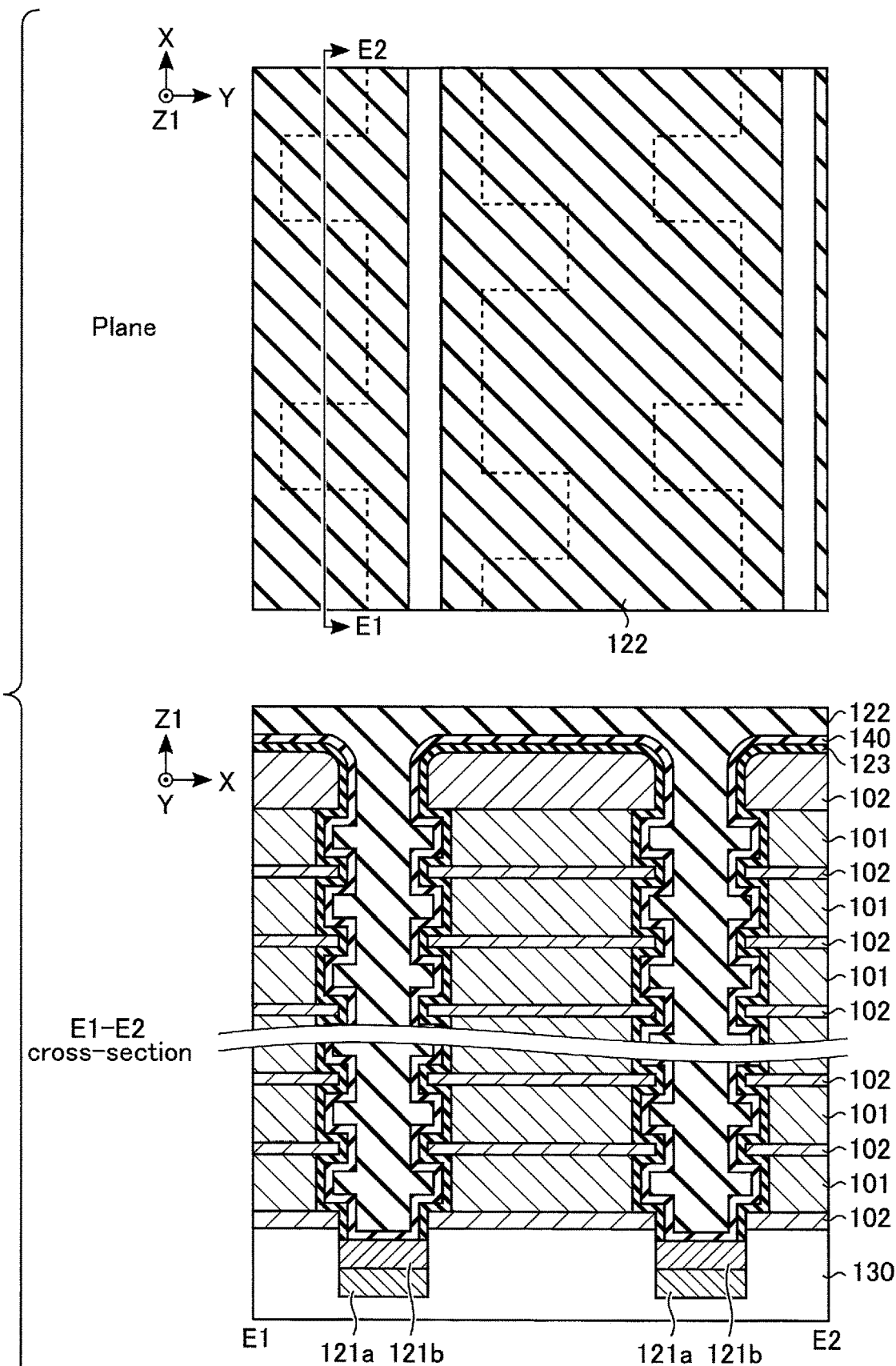

As shown in FIG. 39, for example, an insulating layer 123 is formed by surface oxidization of the semiconductor substrate 130, the semiconductor layers 101 and 102. Next, an insulating layer 140 having a film thickness that does not fill the area AR3 is formed. Next, an insulating layer 122 having a film thickness that fills the area AR2 and does not fill the area AR1 is formed.

Figure 40:
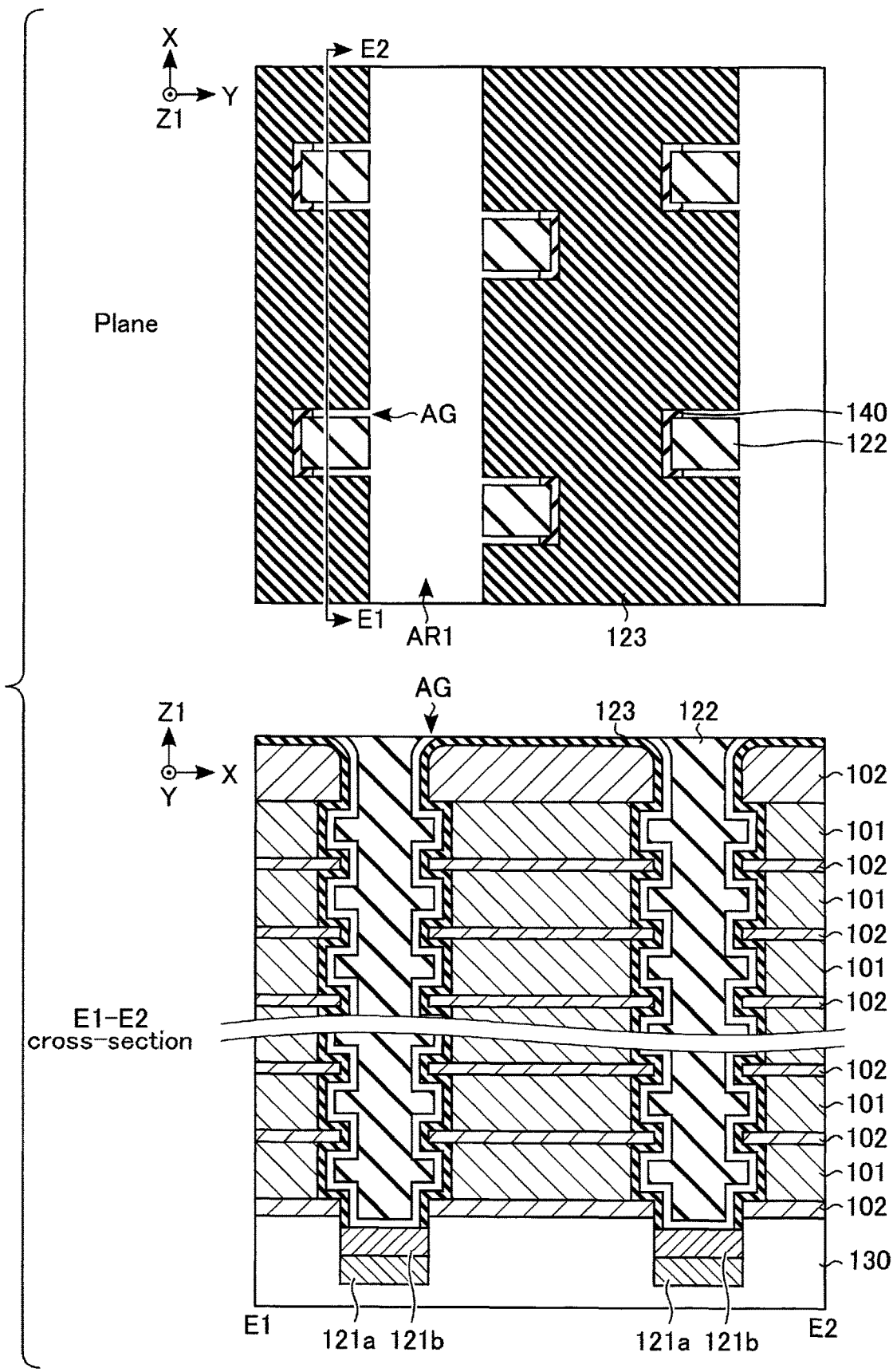

As shown in FIG. 40, the insulating layer 122 and the insulating layer 140 in the area AR1 are removed by isotropic etching, for example, using chemical dry etching (CDE). Next, a sacrifice layer is formed on the surface by plasma CVD. For the sacrifice layer, a material capable of obtaining a sufficient etching selectivity for the insulating layers 122, 123, and 140 is used. For the sacrifice layer, for example, poly-silicon is used. For example, poly-silicon formed by plasma CVD is formed very little on a side face of the area AR1 because of its insufficient step coverage. The insulating layer 140 is etched from the side face of the area AR1 in this state, for example, by chemical dry etching (CDE) to form an air gap (AG) for providing a magnet 124 between the insulating layer 122 and the insulating layer 123. Next, the sacrifice layer is removed, for example, by wet etching.

Figure 41:
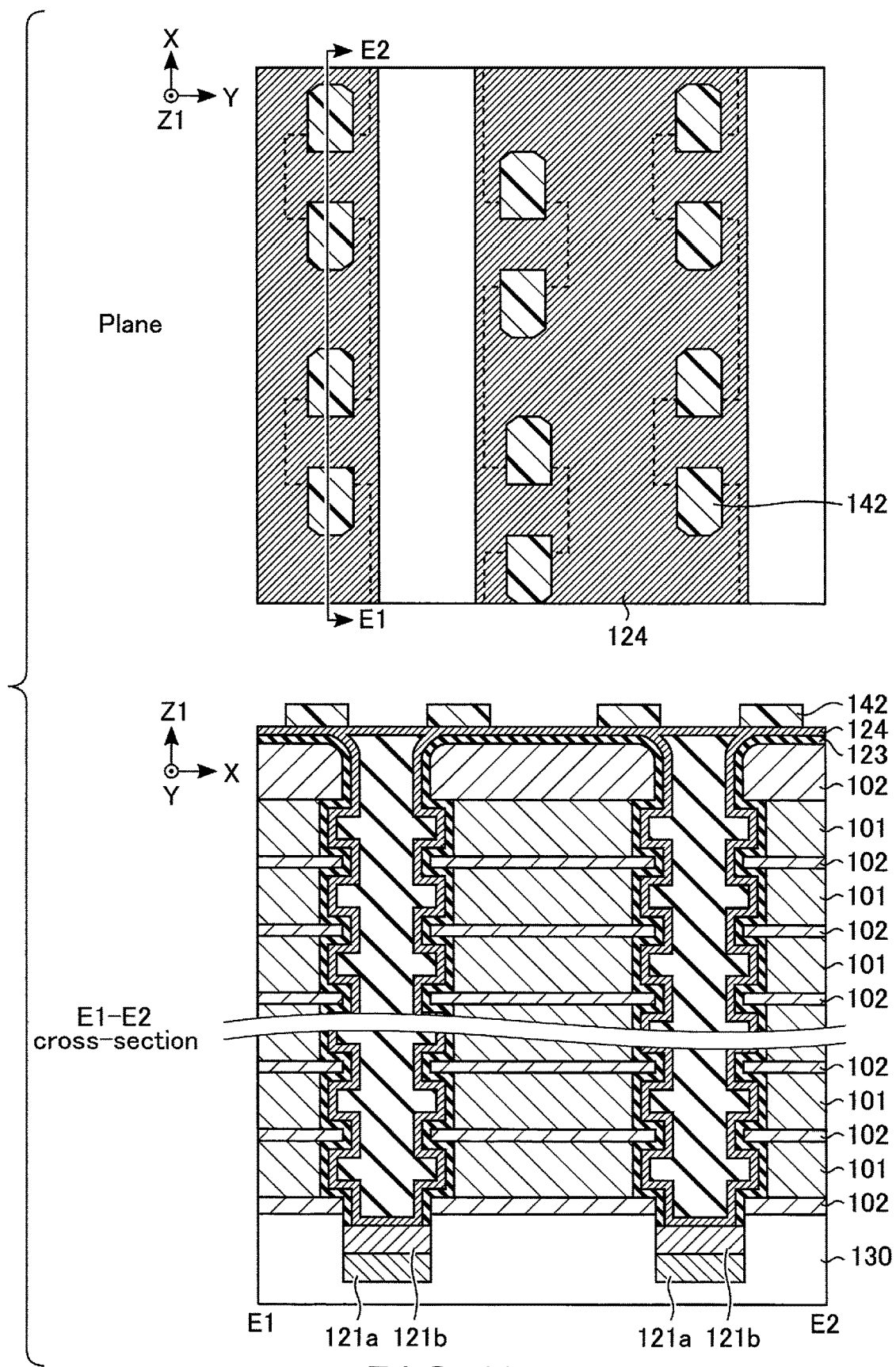

As shown in FIG. 41, the magnet 124 is formed so as to fill the air gap AG, for example, by CVD. Next, a mask pattern of a terrace HD using a resist 142 is formed.

As shown in FIG. 42, an exposed magnet 124 is removed, for example, by chemical dry etching (CDE). As a result, the bottom BB, memory pillars MP, and terraces HD are formed. Next, the resist 142 is removed.

Figure 43:
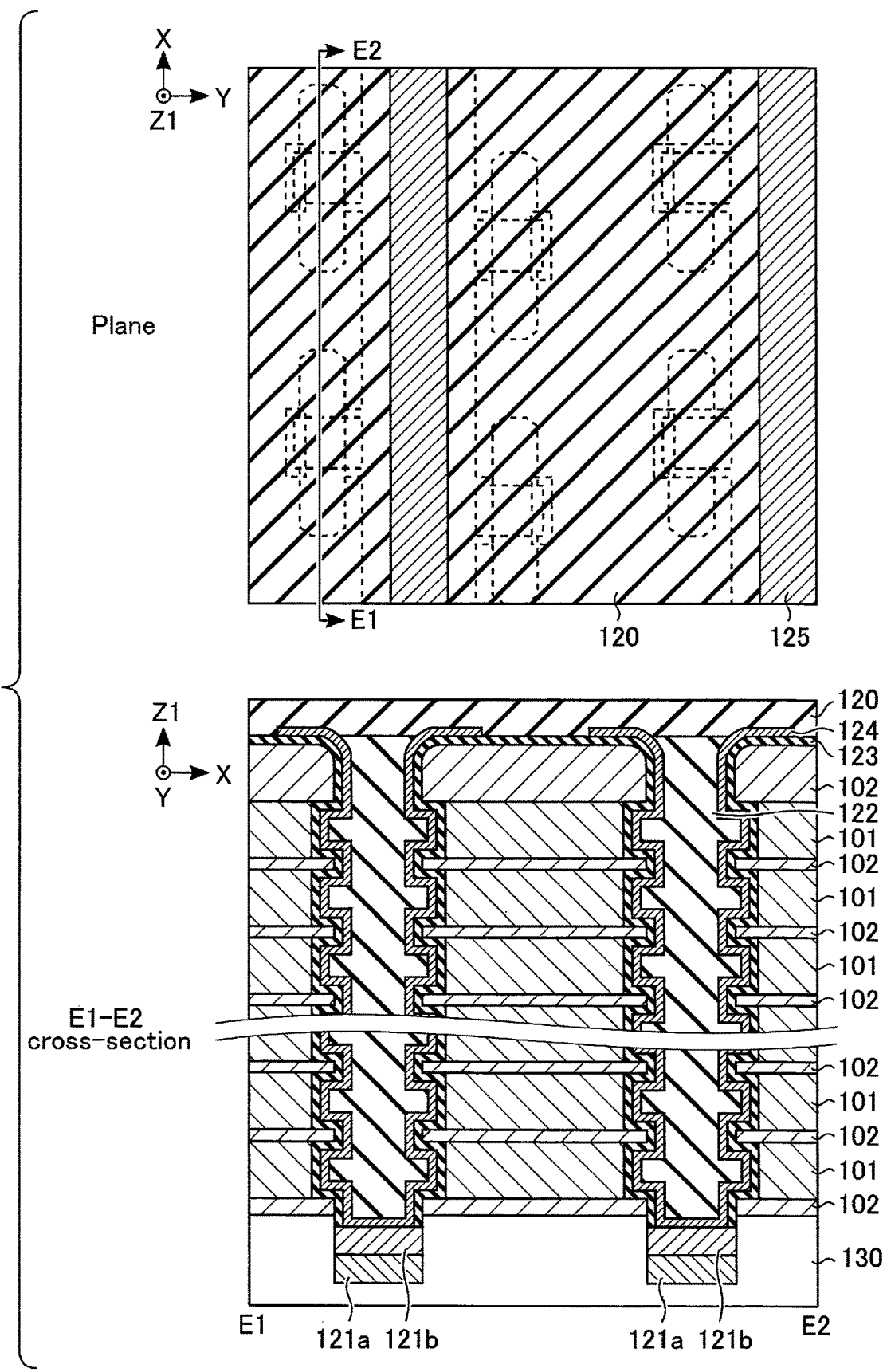

As shown in FIG. 43, an insulating layer 120 is formed to fill the area AR1. Next, the surface of the insulating layer 120 is planarized, for example, by CMP. Next, an interconnect layer 125 is formed as described in FIG. 20 of the first embodiment.

Figure 44:
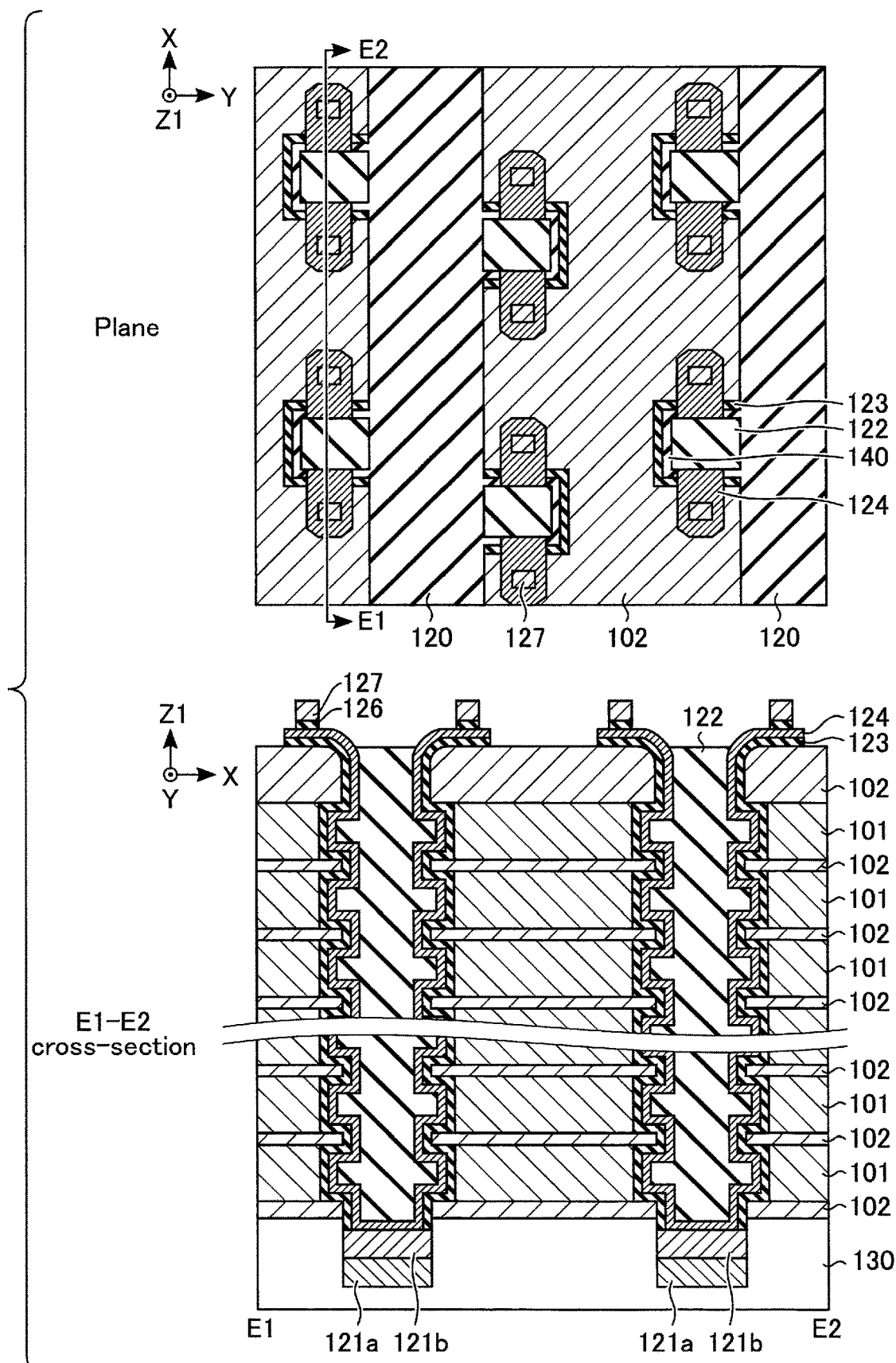

As shown in FIG. 44, an insulating layer 120 is formed to fill a groove on the interconnect layer 125 as described in FIGS. 21 and 22 of the first embodiment. Next, the insulating layer 120 is planarized, for example, by CMP. Next, the insulating layers 120 and 122 are etched until the top surface of the magnet 124 is exposed. Next, a non-magnet 126 and a magnet 127 are formed on the terrace HD.

4.4 Effects of Present Embodiment

According to the configuration of the present embodiment, the same effects as those of the first embodiment can be obtained.

Furthermore, according to the configuration of the present embodiment, two memory pillars MP can be formed for one protrusion SLb (area AR2). Therefore, it is possible to increase the memory density and achieve high-density integration of the magnetic memory device.

It should be noted that the second embodiment and the fourth embodiment may be combined. That is, the structures of memory pillars MP and terraces HD of the present embodiment may be applied to the first to third examples of the second embodiment.

5. Fifth Embodiment

Next, a fifth embodiment will be described. In the fifth embodiment, the structures of the memory pillars MP and terraces HD different than those of the first to fourth embodiments will be described. Hereinafter, the fifth embodiment will be described focusing on different points from those in the first to fourth embodiments.

5.1 Planar Configuration of Memory Cell Array

Figure 45:
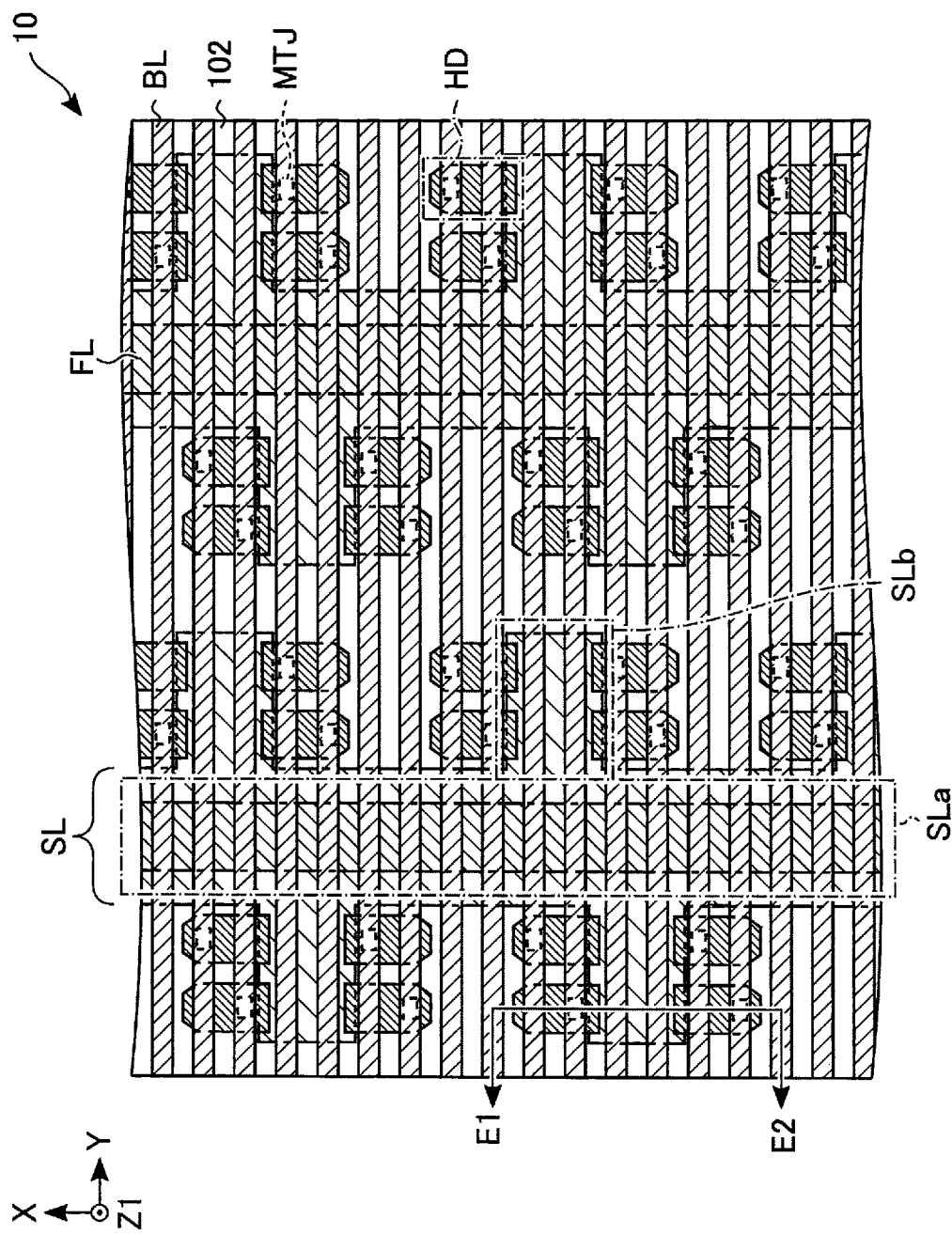
FIG. 45 is a plan view of a memory cell array provided in a magnetic memory device according to a fifth embodiment.

First, an example of the planar configuration of a memory cell array 10 will be described with reference to FIG. 45. In the example of FIG. 45, illustrations of the bottom BB of the magnet 124, the insulating layers 120 and 122, and the semiconductor layers 101 and 102 are omitted.

As shown in FIG. 45, the arrangement of source lines SL and field lines FL is the same as that of the first embodiment. In the present embodiment, four memory pillars MP and four terraces HD are provided for one protrusion SLb of a source line SL. More specifically, two memory pillars MP are provided respectively on two sides of a protrusion SLb facing the X direction. The two memory pillars MP provided on one side of the protrusion SLb are adjacent to each other in the Y direction. The two memory pillars MP arranged with the protrusion SLb interposed therebetween face each other in the X direction. A terrace HD having a flat portion extending in the X direction is provided corresponding to each memory pillar MP. That is, two terraces HD adjacent to each other in the Y direction are provided corresponding to one side of the protrusion SLb facing the X direction.

MTJ elements are provided at different positions in the X direction on the two terraces HD which are adjacent to each other in the Y direction.

A plurality of MTJ elements corresponding to one source line SL are respectively coupled to different bit lines BL via the switching elements SW (not shown). A plurality of MTJ elements that are arranged respectively corresponding to a plurality of source lines SL along the Y direction are coupled in common to one bit line BL. The bit lines BL are provided extending in the Y direction above the field lines FL.

5.2 Configuration of Memory Pillar

Next, the structure of the memory pillar MP will be described with reference to FIGS. 46 and 47. FIG. 46 is a cross-sectional view along an E1-E2 line in FIG. 45. FIG. 47 is a plan view along a C1-C2 line and a D1-D2 line in FIG. 46.

As shown in FIG. 46, two memory pillars MP are arranged so as to face each other in the X direction with an insulating layer 122 interposed therebetween. The two memory pillars MP facing each other in the X direction are coupled to one bottom BB. A terrace HD is provided corresponding to each memory pillar MP. In the example of FIG. 46, one memory pillar MP is provided so as to come into contact with the side face of the insulating layer 122 facing the left side of the space. A terrace HD having a flat portion extending in the left side of the space is provided on the memory pillar MP. Similarly, the other memory pillar MP is provided so as to come into contact with the side face of the insulating layer 122 facing the right side of the space. Then, a terrace HD having a flat portion extending in the right side of the space is provided on the memory pillar MP.

A non-magnet 126 and a magnet 127 are stacked on each terrace HD. In the example of FIG. 46, the distance from the end of the terrace HD to the non-magnet 126 and magnet 127 in the X direction differs depending on each terrace HD.

A switching element SW is provided on the magnet 127. Two interconnect layers 111 extending in the Y direction are provided above the terrace HD. The switching element SW is coupled to either of the two interconnect layers 111.

Next, the planar configuration of the memory pillar MP will be described.

As shown in FIG. 47, in the present embodiment, four memory pillars MP are provided respectively on two side faces of an area AR2 facing the X direction. Hereinafter, in the example of FIG. 47, two memory pillars provided on the right side of the space with the insulating layer 122 interposed therebetween are denoted by MP1 and MP3 from the side further away from an insulating layer 120, and two memory pillars provided on the left side of the space are denoted by MP2 and MP4 from the side further away from the insulating layer 120. Each of the memory pillars MP1 to MP4 functions as one memory string MS. The memory pillars MP1 to MP4 have a square shape in which the side along the Y direction is longer than the side along the X direction in the C1-C2 plane and D1-D2 plane. The length of each of the memory pillars MP1 to MP4 in the Y direction is shorter than the length of the insulating layer 122 in the Y direction.

The memory pillars MP1 to MP4 are magnetic thin wires. In the present embodiment, in the case of all the pillars MP1 to MP4, the length of the magnetic thin wire in the Y direction in the D1-D2 plane is the same as the length of the magnetic thin wire in the Y direction in the C1-C2 plane. Therefore, the magnetic thin wire does not have a surge in the interconnect width direction. In addition, the distance between the memory pillar MP1 and the memory pillar MP2 in the D1-D2 plane is shorter than the distance between the memory pillar MP1 and the memory pillar MP2 in the C1-C2 plane. Similarly, the distance between the memory pillar MP3 and the memory pillar MP4 in the D1-D2 plane is shorter than the distance between the memory pillar MP3 and the memory pillar MP4 in the C1-C2 plane. Therefore, the magnetic thin wire has a surge in the film surface direction.

An insulating layer 123 is provided between three side faces of the insulating layer 122 and each of the semiconductor layers 101 and 102. The memory pillars MP1 to MP4 are respectively provided between a portion of the surface of the insulating layer 122 facing the X direction and the insulating layer 123. In the area AR2, an insulating layer 120 is provided between a side face of the insulating layer 122 and the insulating layer 123 in an area closer to the area AR1 than the memory pillars MP2 and MP4. An insulating layer 140 is provided between the memory pillars MP1 and MP3, and between the memory pillars MP2 and MP4. In the area AR2, an insulating layer 140 is provided between a side face of the insulating layer 122 and the insulating layer 123 in an area further away from the area AR1 than the memory pillars MP1 and MP2.

5.3 Manufacturing Method of Memory Pillar

Figure 48:
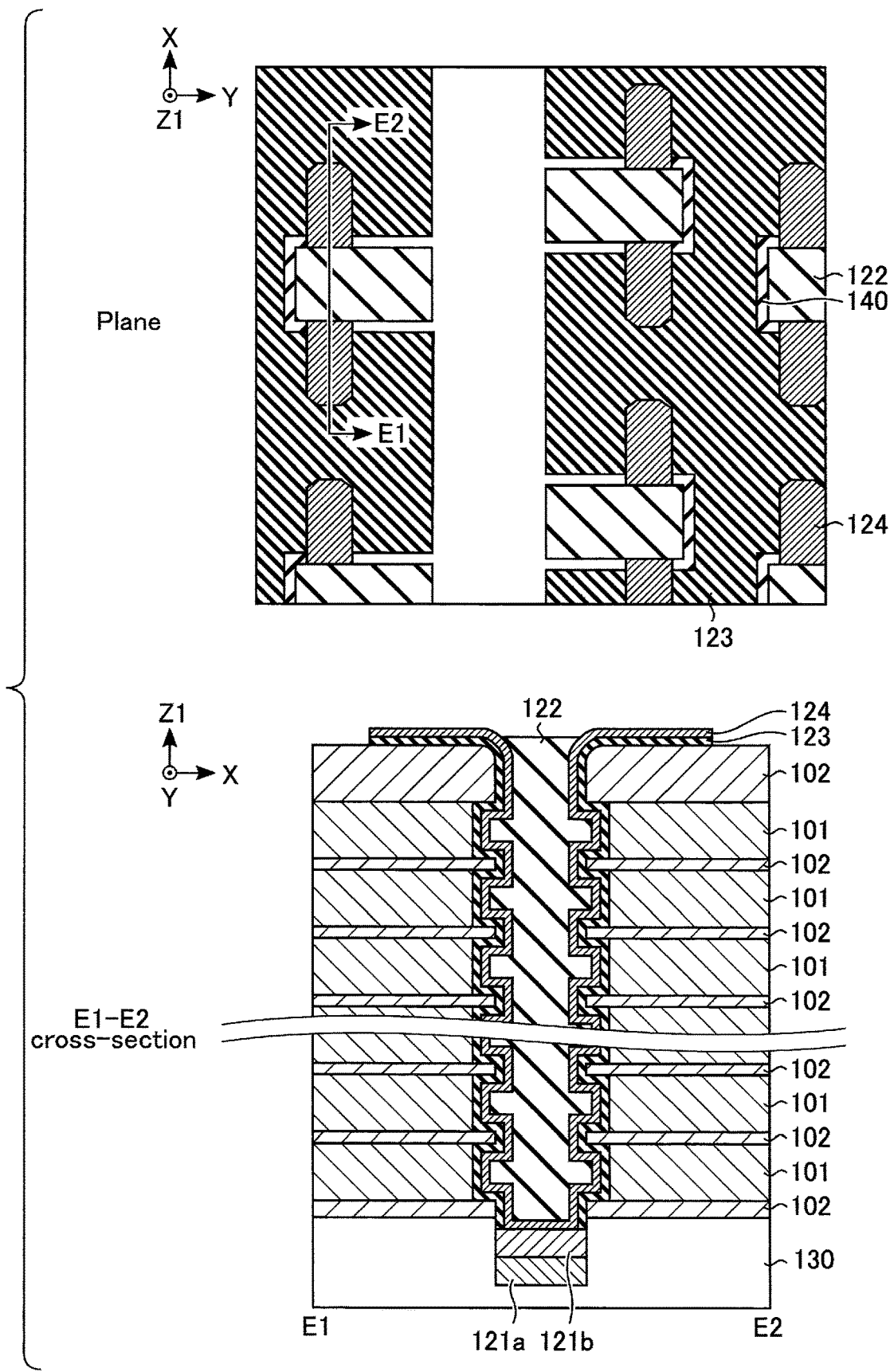
FIGS. 48 to 50 are diagrams showing a manufacturing process of a memory cell array provided in the magnetic memory device according to the fifth embodiment.
Figure 49:
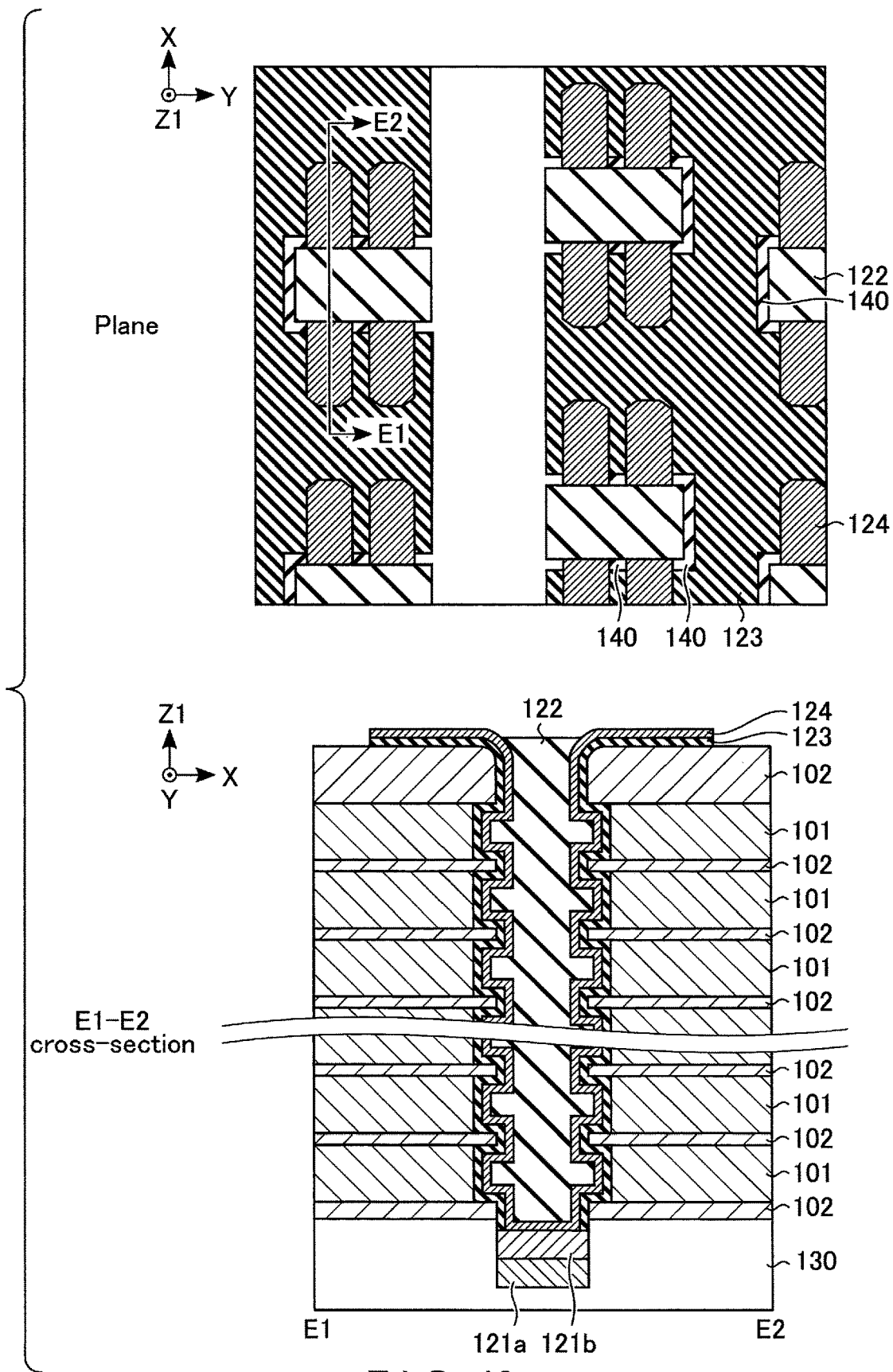
Figure 50:
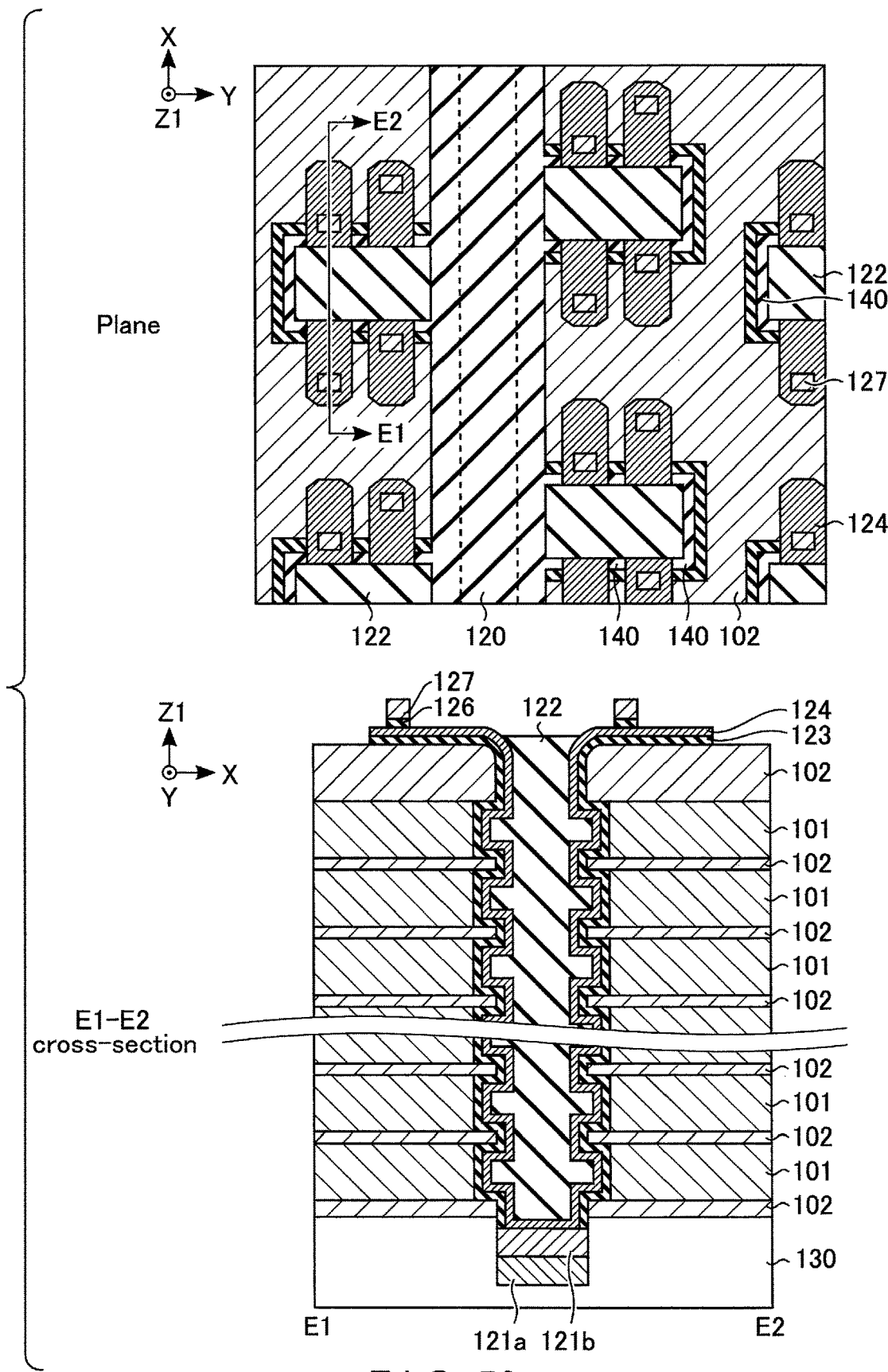

Next, an example of a manufacturing method of a memory pillar MP will be described with reference to FIGS. 48 to 50. FIGS. 48 to 50 respectively show a plan view and an E1-E2 cross-section of a memory array 10.

As shown in FIG. 48, the same procedures as those in the descriptions of the fourth embodiment up to FIG. 42 are performed to form two memory pillars MP (the memory pillars MP1 and MP2 described in FIG. 47) and terraces HD corresponding to each of the memory pillars.

As shown in FIG. 49, two memory pillars MP (the memory pillars MP3 and MP4 described in FIG. 47) are formed so as to be adjacent to each other in the Y direction, and terraces HD corresponding to each of the memory pillars MP are formed. More specifically, first, the insulating layer 140 is formed. Next, the insulating layer 140 on the surface and the insulating layer 140 within the area AR1 are removed. Next, the same procedures as those shown in FIGS. 40 to 42 of the fourth embodiment are repeated.

As shown in FIG. 50, the same procedures as those shown in FIGS. 43 and 44 of the fourth embodiment are performed to form an interconnect layer 125, a non-magnet 126, and a magnet 127.

5.4 Effects of Present Embodiment

According to the configuration of the present embodiment, the same effects as those of the first embodiment can be obtained.

Furthermore, according to the configuration of the present application, four memory pillars MP can be formed for one protrusion SLb (area AR2). Therefore, it is possible to increase the memory density and achieve high-density integration of the magnetic memory device.

It should be noted that the second embodiment and the fifth embodiment may be combined. That is, the structures of the memory pillars MP and terraces HD may be applied to the first to third examples of the second embodiment.

6. Sixth Embodiment

Next, the sixth embodiment will be described. In the sixth embodiment, the structures of memory pillars MP and terraces HD different than those of the first to fifth embodiments will be described. Hereinafter, the sixth embodiment will be described focusing on different points from those in the first to fifth embodiments.

6.1 Planar Configuration of Memory Cell Array

Figure 51:
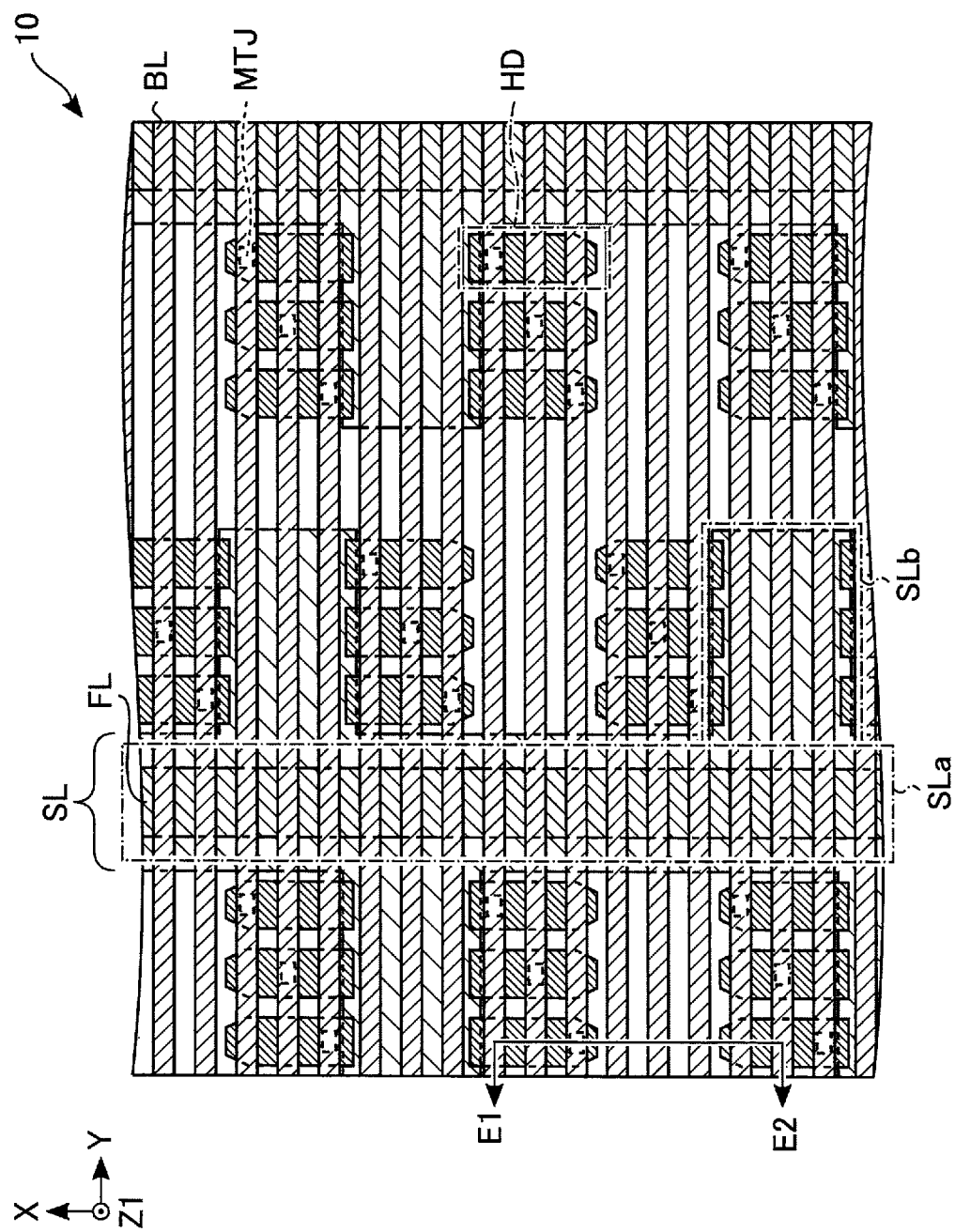
FIG. 51 is a plan view of a memory cell array provided in a magnetic memory device according to a sixth embodiment.

First, an example of the planar configuration of a memory cell array 10 will be described with reference to FIG. 51. In the example of FIG. 51, illustrations of the bottom BB of the magnet 124, the insulating layers 120 and 122, and the semiconductor layers 101 and 102 are omitted.

As shown in FIG. 51, the arrangement of source lines SL and field lines FL is the same as that of the first embodiment. In the present embodiment, six memory pillars MP and six terraces HD are provided for one protrusion SLb of a source line SL. More specifically, three memory pillars MP are provided respectively on two sides of the protrusion SLb facing the X direction. The three memory pillars MP provided on one side of the protrusion SLb are adjacent to each other in the Y direction. Two memory pillars MP arranged with the protrusion SLb interposed therebetween face each other in the X direction. A terrace HD having a flat portion extending in the X direction is provided corresponding to each memory pillar MP. That is, three terraces HD adjacent to each other in the Y direction are provided corresponding to one side of the protrusion SLb facing the X direction.

MTJ elements are provided at different positions in the X direction on the three terraces HD adjacent to each other in the Y direction.

A plurality of MTJ elements corresponding to one source line SL are respectively coupled to different bit lines BL via the switching elements SW (not shown). A plurality of MTJ elements that are arranged respectively corresponding to a plurality of source lines SL along the Y direction are coupled in common to one bit line BL. The bit lines BL are provided extending in the Y direction above field lines FL.

6.2 Configuration of Memory Pillar

Next, the configuration of the memory pillar MP will be described with reference to FIGS. 52 and 53. FIG. 52 is a cross-sectional view along an E1-E2 line in FIG. 51. FIG. 53 is plan views along a C1-C2 line and D1-D2 line in FIG. 52.

As shown in FIG. 52, the configuration of two memory pillars MP and a bottom are the same as that shown in FIG. 46 of the fifth embodiment. Above the terrace HD, three interconnect layers 111 extending in the Y direction are arranged so as to be adjacent to each other in the X direction.

A switching element SW is coupled to any one of the three interconnect layers 111.

Next, the planar configuration of the memory pillar MP will be described.

As shown in FIG. 53, in the present embodiment, six memory pillars MP are provided such that three memory pillars MP are provided respectively on two side faces of an area AR2 facing the X direction. Hereinafter, in the example of FIG. 53, three memory pillars provided on the right side of the space with an insulating layer 122 interposed between the three memory pillars MP are denoted by MP1, MP3, and MP5 from the side further away from the insulating layer 120, and the three memory pillars provided on the left side of the space are denoted by MP2, MP4, and MP6 from the side further away from the insulating layer 120. Each of the memory pillars MP1 to MP6 functions as one memory string MS. The memory pillars MP1 to MP6 have a square shape in which the side along the Y direction is longer than the side along the X direction in the C1-C2 plane and D1-D2 plane. The length of each of the memory pillars MP1 to MP6 in the Y direction is shorter than the length of the insulating layer 122 in the Y direction.

The memory pillars MP1 to MP6 are magnetic thin wires. In the present embodiment, in the case of all of the memory pillars MP1 to MP6, the length of the magnetic thin wire in the Y direction in the D1-D2 plane is the same as the length in the y direction in the C1-C2 plane. Therefore, the magnetic thin wire does not have a surge in the interconnect width direction. In addition, the distance between the memory pillar MP1 and the memory pillar MP2 in the D1-D2 plane is shorter than the distance between the memory pillar MP1 and the memory pillar MP2 in the C1-C2 plane. Similarly, the distance between the memory pillar MP3 and the memory pillar MP4 in the D1-D2 plane is shorter than the distance between the memory pillar MP3 and the memory pillar MP4 in the C1-C2 plane. The distance between the memory pillar MP and the memory pillar MP6 in the D1-D2 plane is shorter than the distance between the memory pillar MP and the memory pillar MP6 in the C1-C2 plane. Therefore, the magnetic thin wire has a surge in the film surface direction.

An insulating layer 123 is provided between three side faces of the insulating layer 122 and each of the semiconductor layers 101 and 102. The memory pillars MP1 to MP6 are respectively provided between a portion of the surface of the insulating layer 122 facing the X direction and the insulating layer 123. In an area AR2, an insulating layer 120 is provided between a side face of the insulating layer 122 and the insulating layer 123 in an area closer to the area AR1 than the memory pillars MP5 and MP6. An insulating layer 140 is provided between the memory pillars MP1 and MP3, between the memory pillars MP3 and MP5, between the memory pillars MP2 and MP4, and between the memory pillars MP4 and MP6. In the area AR2, an insulating layer 140 is provided between a side face of the insulating layer 122 and the insulating layer 123 in an area further away from the area AR1 than the memory pillars MP1 and MP2.

6.3 Effects of Present Embodiment

According to the configuration of the present embodiment, the same effects as those of the first embodiment can be obtained.

Furthermore, according to the configuration of the present embodiment, six memory pillars MP can be formed for one protrusion SLb (area AR2). Therefore, it is possible to increase the memory density and achieve high-density integration of the magnetic memory device.

The second embodiment and the sixth embodiment may be combined. That is, the structures of the memory pillars MP and the terraces HD of the present embodiment may be applied to the first to third examples of the second embodiment.

7. Modification

The magnetic memory device according to the above embodiment includes: a plurality of first films (101) and a plurality of second films (102) stacked alternately in a first direction (Z direction); a first insulating layer (120) passing through the plurality of first and second films and extending in a second direction (X direction) intersecting with the first direction; a second insulating layer (122) passing through the plurality of first and second films and in contact with a surface of the first insulating layer facing a third direction (Y direction) intersecting with the first and second directions; a first magnet (124) including a first pillar portion (MP) provided between the second insulating layer and the plurality of first and second films, and a first terrace portion (HD) coupled to one end of the first pillar portion and extending in at least one of the second and third directions; a first interconnect layer (SL) coupled to the other end of the first pillar portion of the first magnet; and a first magnetoresistance effect element (MTJ) coupled to the first terrace portion of the first magnet.

A semiconductor memory device capable of reducing an increase in manufacturing costs will be provided by application of the above-mentioned embodiments.

The embodiments are not limited to those described above, and various modifications can be made.

In addition, the "coupling" as used in the above embodiments is intended to include a state where a transistor, a resistor or the like is interposed between the coupled elements.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A magnetic memory device comprising:
   a plurality of first films and a plurality of second films stacked alternately in a first direction;
   a first insulating layer passing through the plurality of first and second films and extending in a second direction intersecting with the first direction;
   a second insulating layer passing through the plurality of first and second films and in contact with the first insulating layer in a third direction intersecting with the first and second directions;
   a first magnet including a first pillar portion provided between the second insulating layer and the plurality of first and second films, and a first terrace portion coupled to one end of the first pillar portion and extending in at least one of the second and third directions;
   a first interconnect layer coupled to the other end of the first pillar portion of the first magnet; and
   a first magnetoresistance effect element coupled to the first terrace portion of the first magnet.

2. The device according to claim 1, wherein the first pillar portion of the first magnet includes a plurality of protrusions provided on a same layer as the plurality of first films.

3. The device according to claim 1, wherein the first terrace portion of the first magnet includes a curved portion that curves from the first direction to the second direction.

4. The device according to claim 1, wherein
   the first pillar portion of the first magnet includes:
   a first portion provided between a first surface of the second insulating layer facing the second direction and the plurality of first and second films;
   a second portion provided between a second surface of the second insulating layer facing the second direction and the plurality of first and second films; and
   a third portion provided between a third surface of the second insulating layer facing the third direction and the plurality of first and second films, and
   the first portion is coupled to one end of the third portion, and the second portion is coupled to the other end of the third portion.

5. The device according to claim 4, wherein a length of the third portion in the second direction at a position of a same layer as the plurality of first films is longer than a length of the third portion in the second direction at a position of a same layer as the plurality of second films.

6. The device according to claim 4, further including:
   a third insulating layer provided between the first pillar portion of the first magnet and the plurality of first and second films, and
   wherein a length of the third insulating layer in the second direction at a position of a same layer as the plurality of first films is longer than a length of the third insulating layer in the second direction at a position of a same layer as the plurality of second films.

7. The device according to claim 4, further comprising:
   a third insulating layer provided between the first pillar portion of the first magnet and the plurality of first and second films, and
   wherein a length of the first insulating layer in the third direction is longer than a length of the third insulating layer in the second direction at a position of a same layer as the plurality of second films.

8. The device according to claim 1, wherein the first and second films are respectively one of a Group IV element semiconductor, a Group III-V element semiconductor and a Group II-VI element semiconductor.

9. The device according to claim 1, wherein
   the first interconnect layer includes:
   an electrode portion extending in the second direction, and
   a protrusion that protrudes from the electrode portion to the third direction, and
   the first magnet is provided on the protrusion.

10. The device according to claim 1, further comprising:
    a second interconnect layer extending in the third direction and provided on the first magnetoresistance effect element.

11. The device according to claim 1, further comprising:
    a third interconnect layer extending in the second direction and provided within the first insulating layer, to which a current is supplied at the time of a write operation on the first magnet, the third interconnect layer not being electrically coupled to the first magnet and the first magnetoresistance effect element.

12. The device according to claim 1, wherein the first pillar portion of the first magnet is provided between a third surface of the second insulating layer facing the third direction and the plurality of first and second films.

13. The device according to claim 1, further comprising:
    a second magnet including a second pillar portion provided between the second insulating layer and the plurality of first and second films, and a second terrace portion coupled to the second pillar portion and extending in at least one of the second and third directions; and
    a second magnetoresistance effect element coupled to the second terrace portion of the second magnet.

14. The device according to claim 13, wherein the first pillar portion of the first magnet is provided between a first surface of the second insulating layer facing the second direction and the plurality of first and second films, and
    the second pillar portion of the second magnet is provided between a second surface of the second insulating layer facing the second direction and the plurality of first and second films, and
    the first pillar portion and the second pillar portion are coupled at each of their ends.

15. The device according to claim 13, further comprising:
    a third magnet including a third pillar portion provided between the second insulating layer and the plurality of first and second films, and a third terrace portion coupled to the third pillar portion and extending in at least one of the second and third directions;

a fourth magnet including a fourth pillar portion provided between the second insulating layer and the plurality of first and second films, and a fourth terrace portion coupled to the fourth pillar portion and extending in at least one of the second and third directions;

a third magnetoresistance effect element coupled to the third terrace portion of the third magnet, and a fourth magnetoresistance effect element coupled to the fourth terrace portion of the fourth magnet.

16. The device according to claim 15, wherein the first pillar portion of the first magnet is provided between a first surface of the second insulating layer facing the second direction and the plurality of first and second films, the second pillar portion of the second magnet is provided between a second surface of the second insulating layer opposite to the first pillar portion and facing the second direction and the plurality of first and second films, the third pillar portion of the third magnet is provided adjacent to the first pillar portion between the first surface and the plurality of first and second films, the fourth pillar portion of the fourth magnet is provided between the second surface of the second insulating layer opposite to the third pillar portion and facing the second direction and the plurality of first and second films, and the first to fourth pillar portions are coupled at each of their ends.

17. The device according to claim 15, further comprising:

a fifth magnet including a fifth pillar portion provided between the second insulating layer and the plurality of first and second films, and a fifth terrace portion coupled to the fifth pillar portion and extending in at least one of the second and third directions;

a sixth magnet including a sixth pillar portion provided between the second insulating layer and the plurality of first films and the plurality of second films and a sixth terrace portion coupled to the sixth pillar portion and extending in at least one of the second and third directions;

a fifth magnetoresistance effect element coupled to the fifth terrace portion of the fifth magnet; and a sixth magnetoresistance effect element coupled to the sixth terrace portion of the sixth magnet.

18. The device according to claim 17, wherein the first pillar portion of the first magnet is provided between a first surface of the second insulating layer facing the second direction and the plurality of first and second films, the second pillar portion of the second magnet is provided between a second surface of the second insulating layer opposite to the first pillar portion and facing the second direction and the plurality of first and second films, the third pillar portion of the third magnet is provided adjacent to the first pillar portion between the first surface and the plurality of first and second films, the fourth pillar portion of the fourth magnet is provided between the second surface of the second insulating layer opposite to the third pillar portion and facing the second direction and the plurality of first and second films, the fifth pillar portion of the fifth magnet is provided adjacent to the third pillar portion between the first surface and the plurality of first and second films, the sixth pillar portion of the sixth magnet is provided between the second surface of the second insulating layer opposite to the fifth pillar portion and facing the second direction, and the plurality of first and second films, the first to sixth pillar portions are coupled at each of their ends.

* * * * *